United States Patent
Liu et al.

(10) Patent No.: US 12,313,969 B2
(45) Date of Patent: May 27, 2025

(54) LITHOGRAPHICALLY PATTERNED ELECTRICALLY CONDUCTIVE HYDROGELS, PHOTO-CURABLE COMPOSITIONS, AND ELASTOMERS FORMED FROM SUCH COMPOSITIONS

(71) Applicant: The Board of Trustees of the Leland Stanford Junior University, Stanford, CA (US)

(72) Inventors: Jia Liu, Stanford, CA (US); Yuxin Liu, Stanford, CA (US); Zhenan Bao, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 160 days.

(21) Appl. No.: 17/992,837

(22) Filed: Nov. 22, 2022

(65) Prior Publication Data

US 2025/0110401 A1 Apr. 3, 2025

Related U.S. Application Data

(63) Continuation of application No. 16/758,347, filed as application No. PCT/US2018/057855 on Oct. 26, 2018, now abandoned.

(60) Provisional application No. 62/578,264, filed on Oct. 27, 2017.

(51) Int. Cl.
*G03F 7/004* (2006.01)
*G03F 7/20* (2006.01)
*G03F 7/32* (2006.01)

(52) U.S. Cl.
CPC .............. *G03F 7/0046* (2013.01); *G03F 7/20* (2013.01); *G03F 7/325* (2013.01)

(58) Field of Classification Search
CPC .......... G03F 7/0046; G03F 7/20; G03F 7/325; G03F 7/027; G03F 7/093; G03F 7/0002; B82Y 40/00; B82Y 10/00; A61K 9/0097; A61K 9/5153; A61K 47/34; A61K 9/14; A61K 9/5192; A61K 9/5138; B81C 99/0085; Y10T 428/24273; Y10T 428/3154; Y10T 428/24479; H10K 71/60; H10K 71/13; Y02P 70/50; Y02E 10/549
See application file for complete search history.

(56) References Cited

U.S. PATENT DOCUMENTS

| | | |
|---|---|---|
| 4,567,073 A | 1/1986 | Larson et al. |
| 6,403,539 B1 | 6/2002 | Marchionni et al. |
| 2005/0244587 A1* | 11/2005 | Shirlin .................. G03F 7/0047 427/487 |
| 2009/0028910 A1* | 1/2009 | DeSimone ............ G03F 7/0002 425/6 |
| 2013/0011618 A1 | 1/2013 | Desimone et al. |
| 2015/0056555 A1 | 2/2015 | Lin et al. |

OTHER PUBLICATIONS

International Search Report and Written Opinion on PCT Application No. PCT/US2018/057855 dated Jul. 8, 2019, 14 pages.

* cited by examiner

*Primary Examiner* — Sean M DeGuire
*Assistant Examiner* — Richard David Champion
(74) *Attorney, Agent, or Firm* — Foley & Lardner LLP

(57) ABSTRACT

A photo-curable composition includes a fluorinated monomer including cross-linkable functional groups, and a photoinitiator. Manufacturing methods using the photo-curable composition are provided.

21 Claims, 33 Drawing Sheets

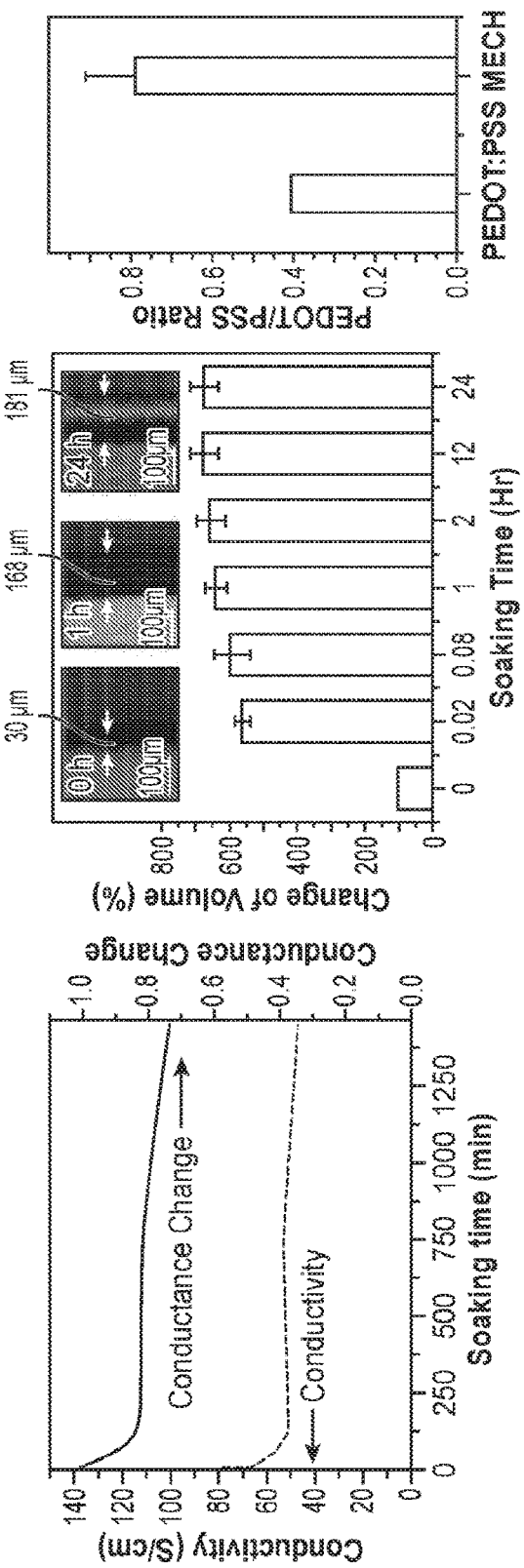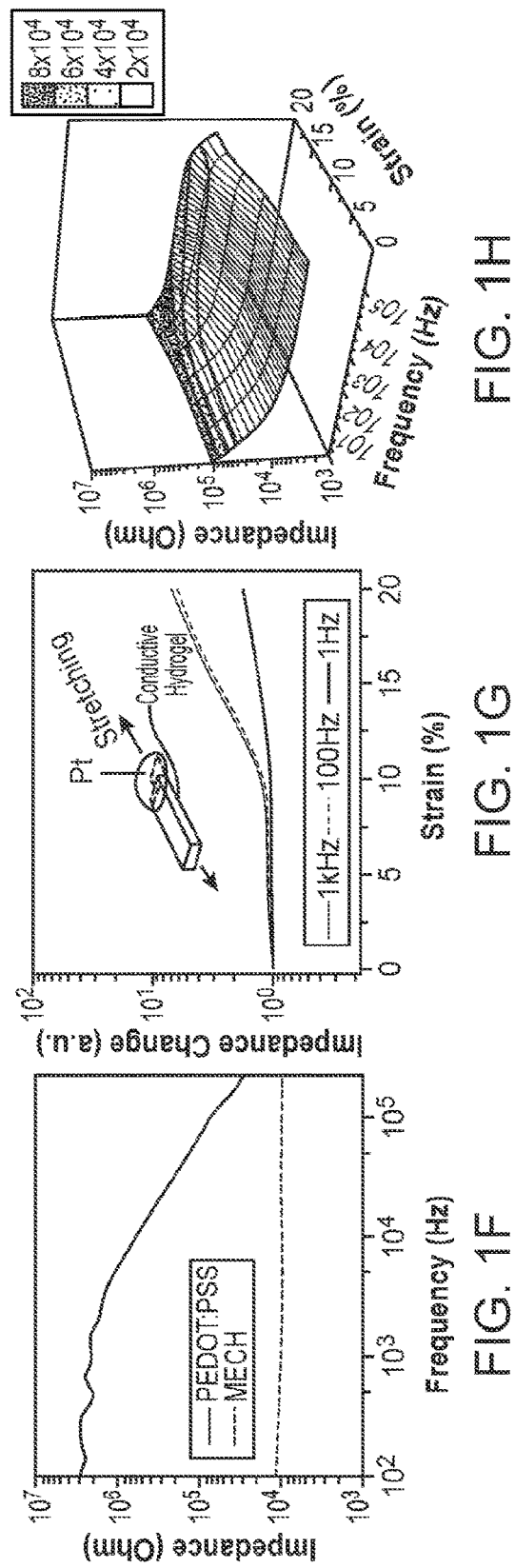

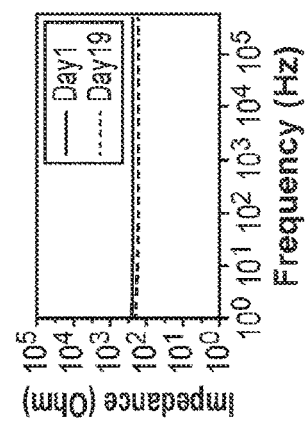
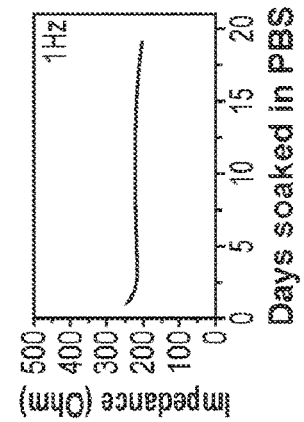
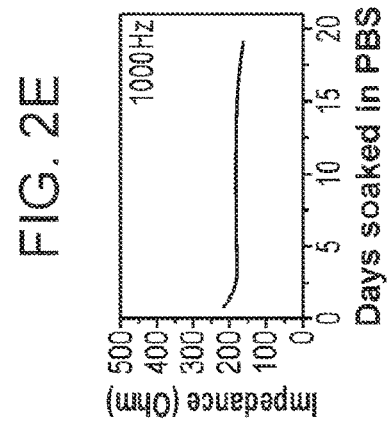
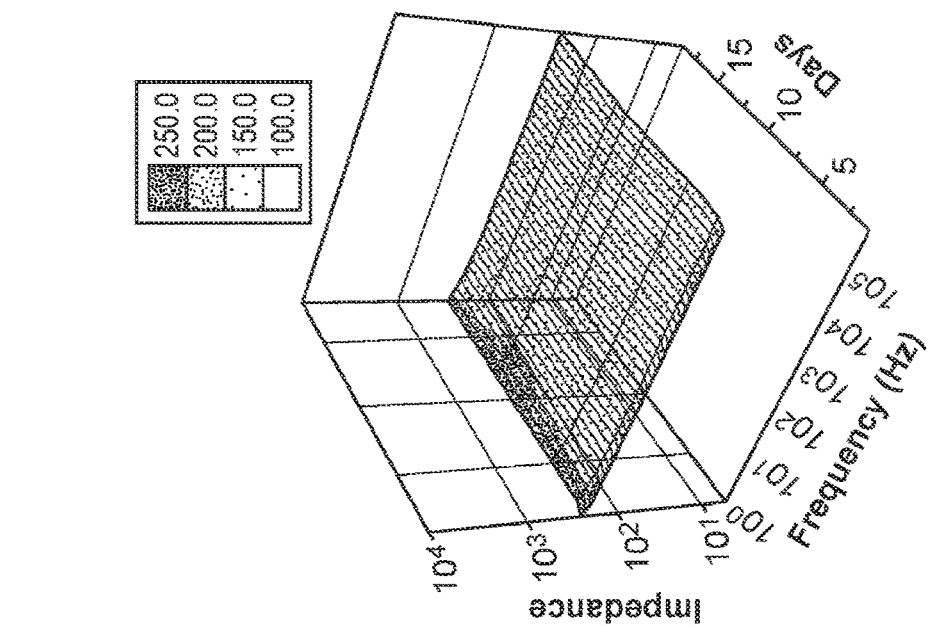
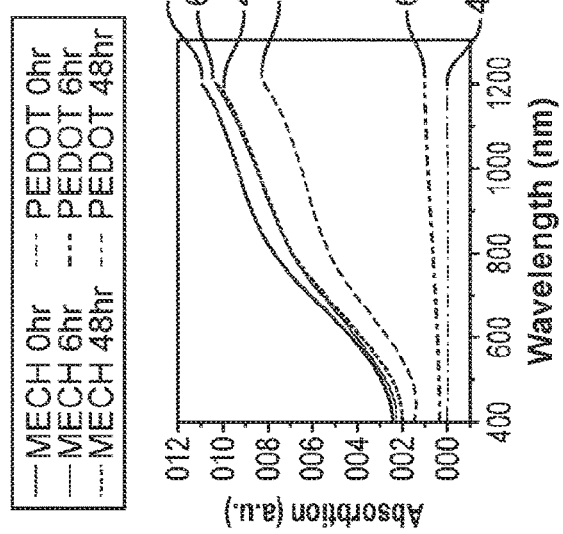
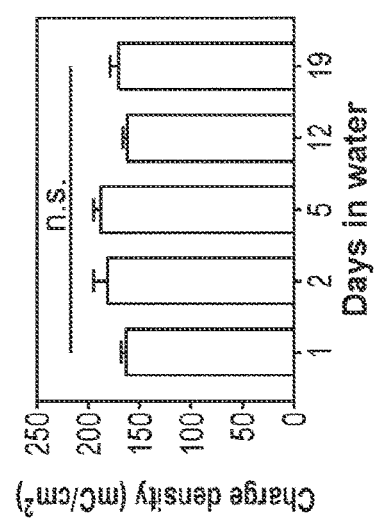

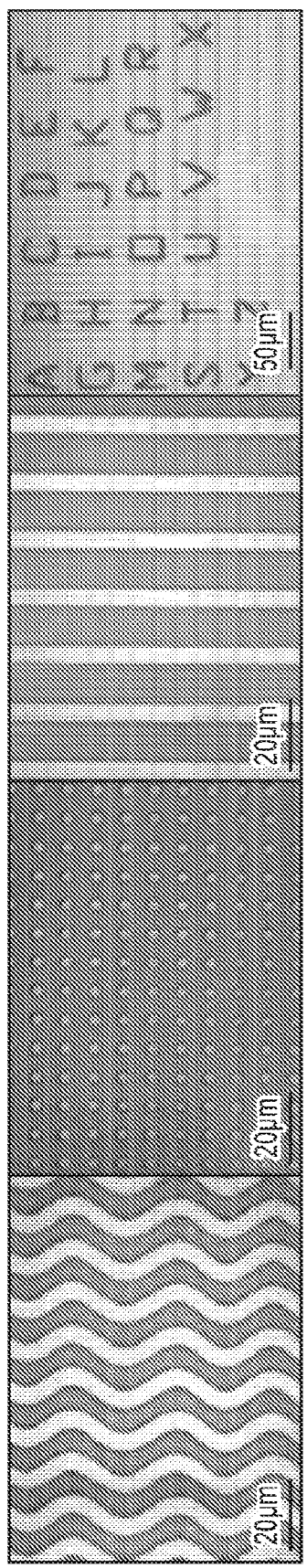
FIG 2G
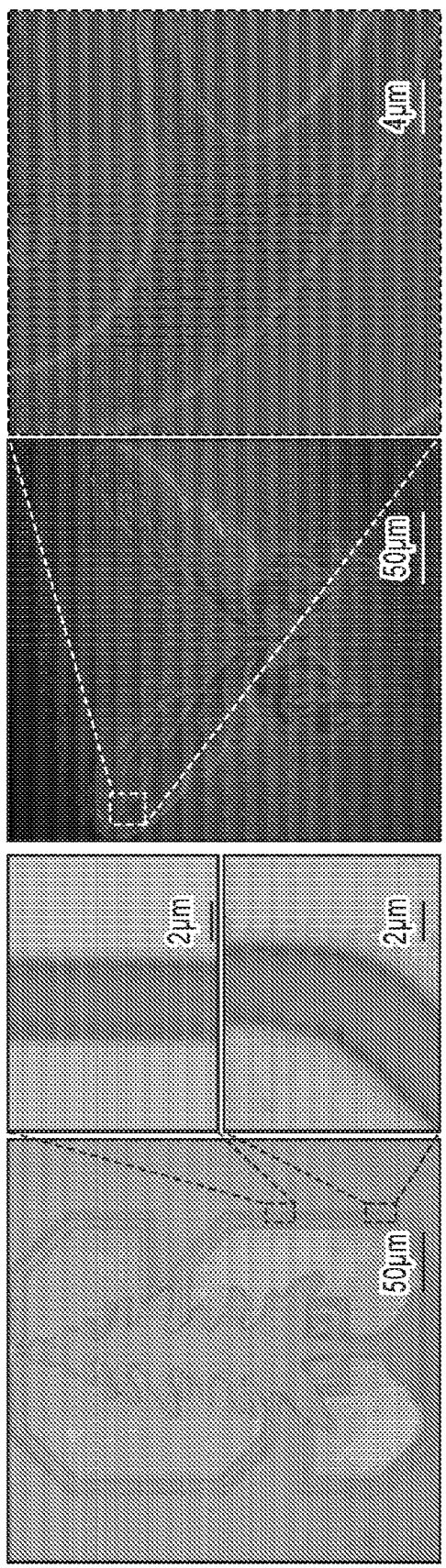
FIG. 2I
FIG. 2H

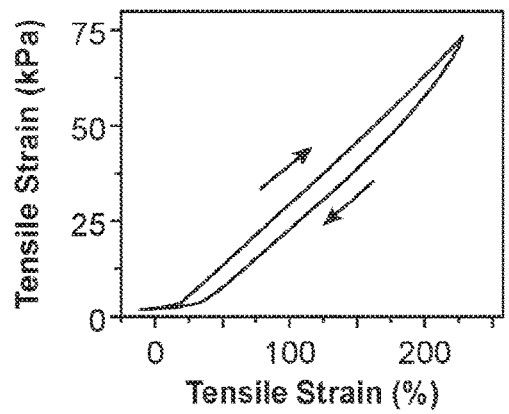
FIG. 3B
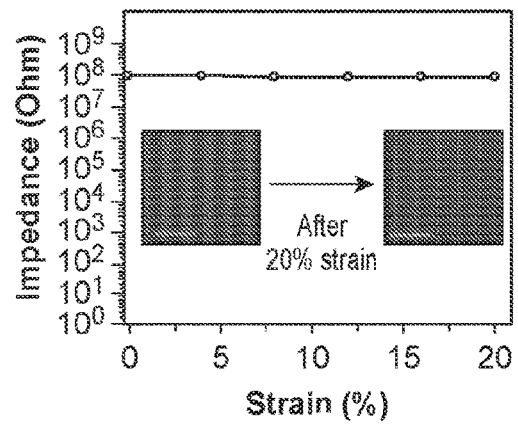
FIG. 3C
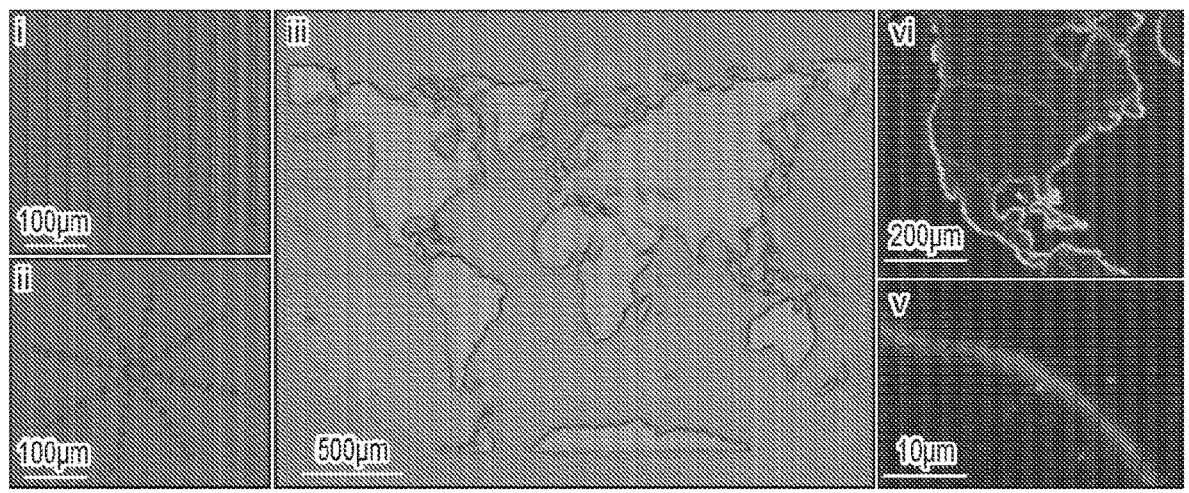
FIG. 3D
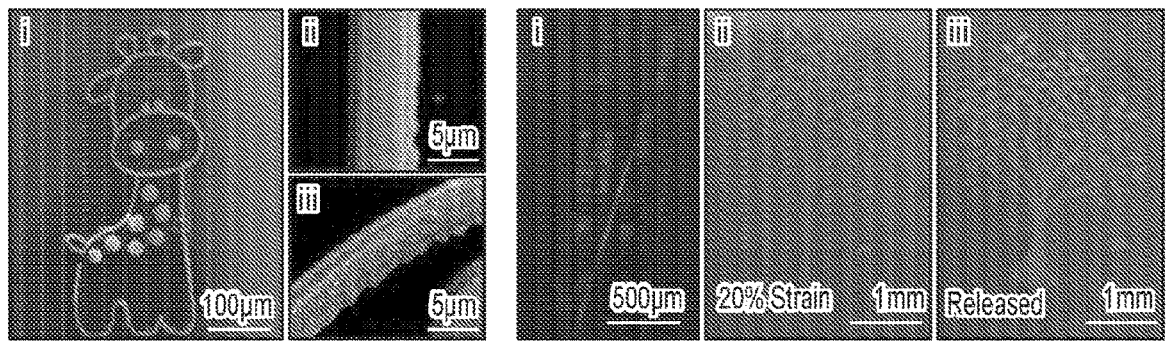
FIG. 3E
FIG. 3F

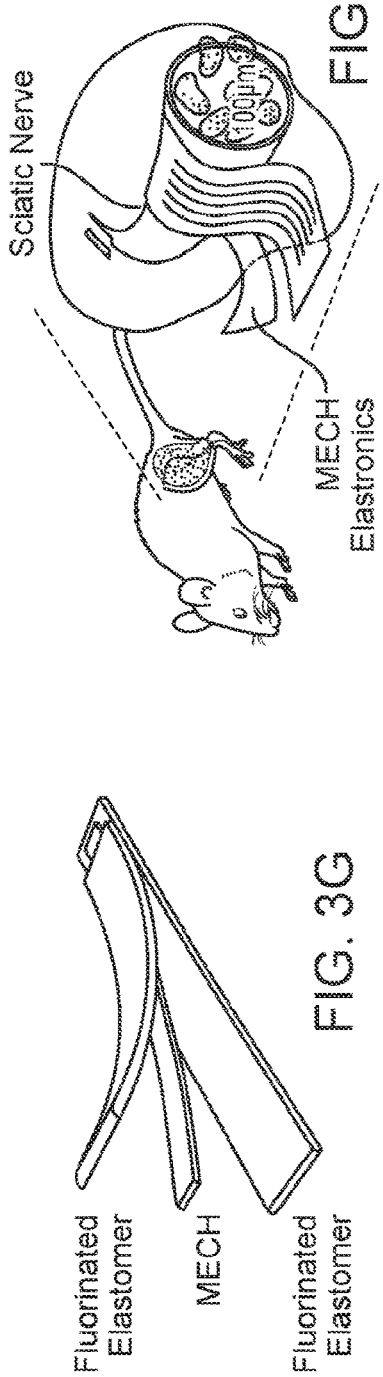
FIG. 3G
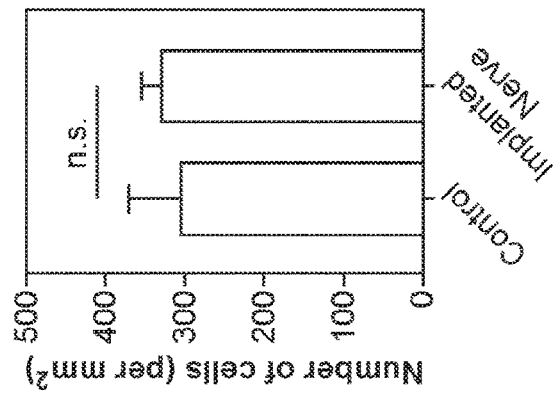
FIG. 3H
FIG. 3K
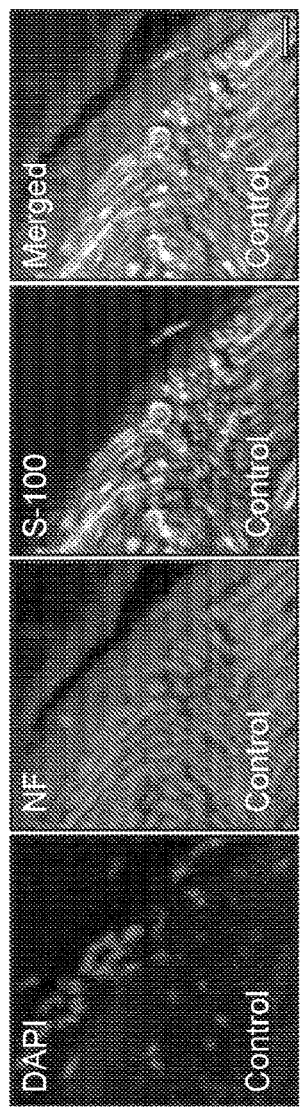
FIG. 3I
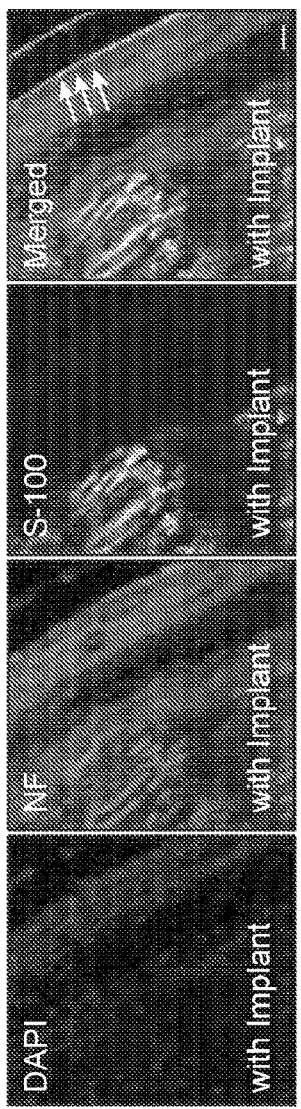
FIG. 3J

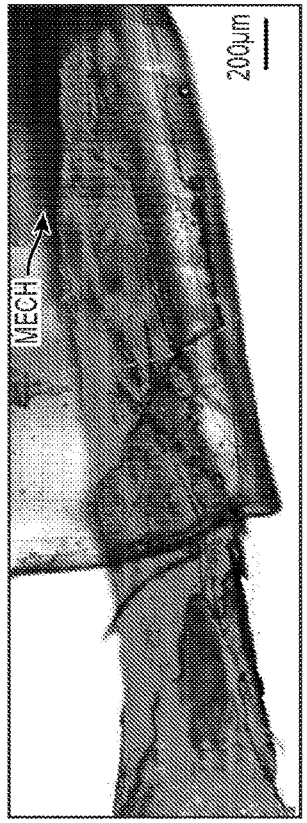
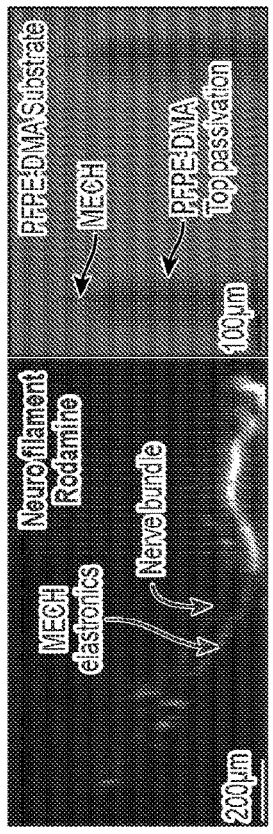
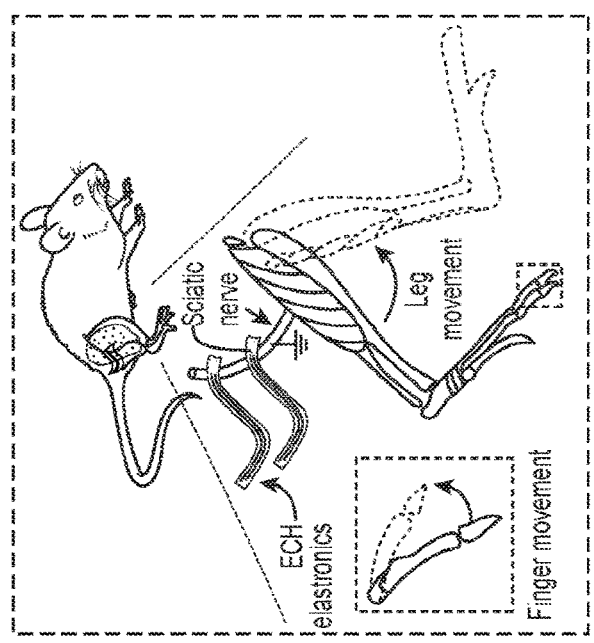
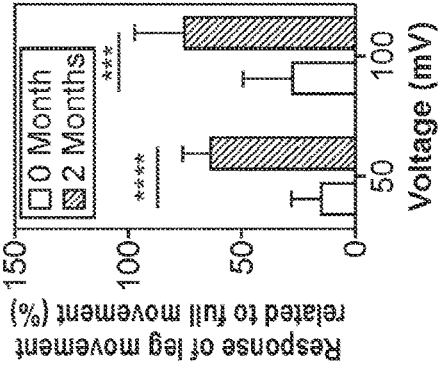
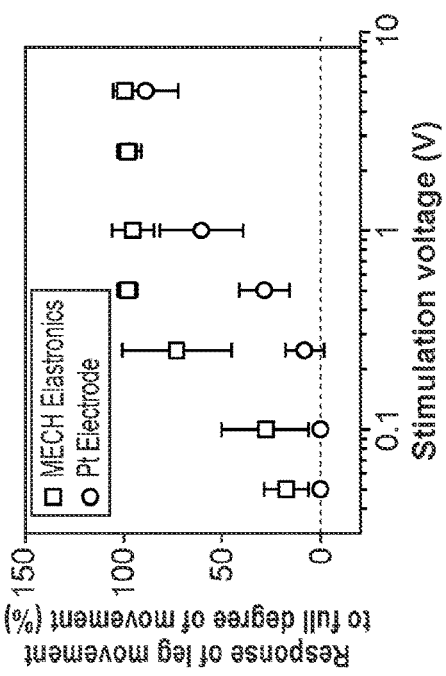
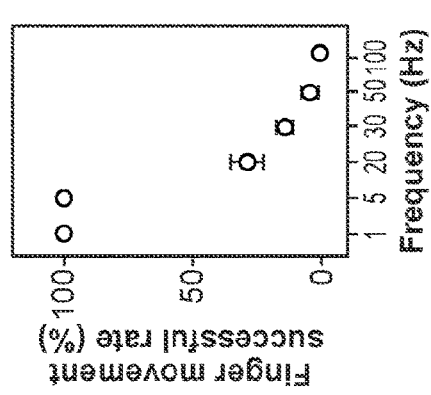

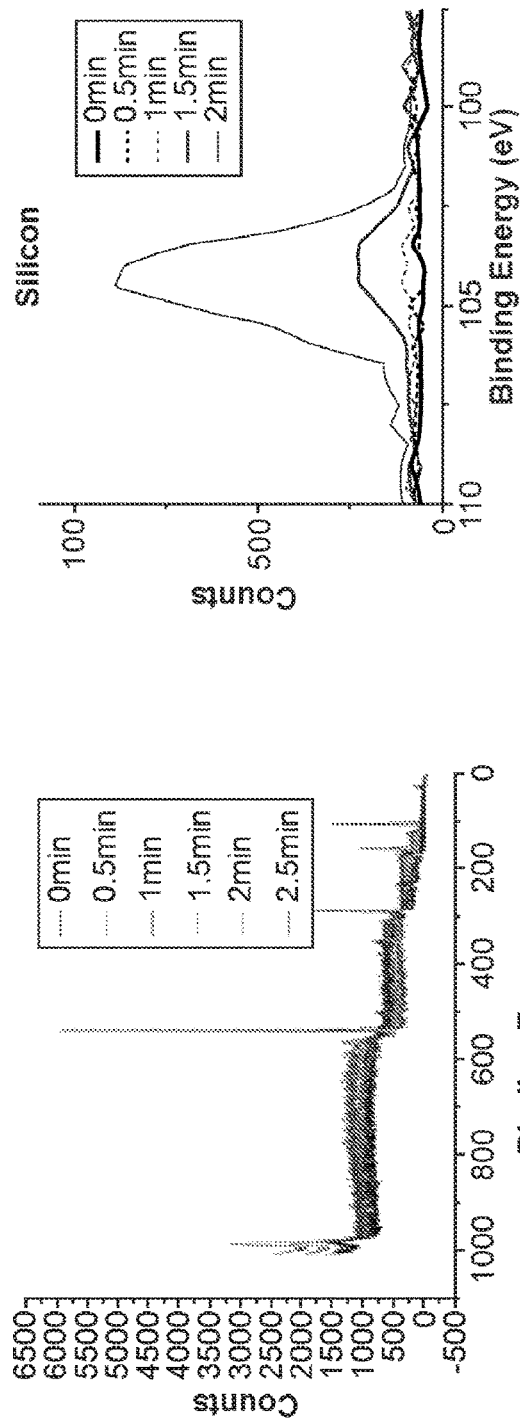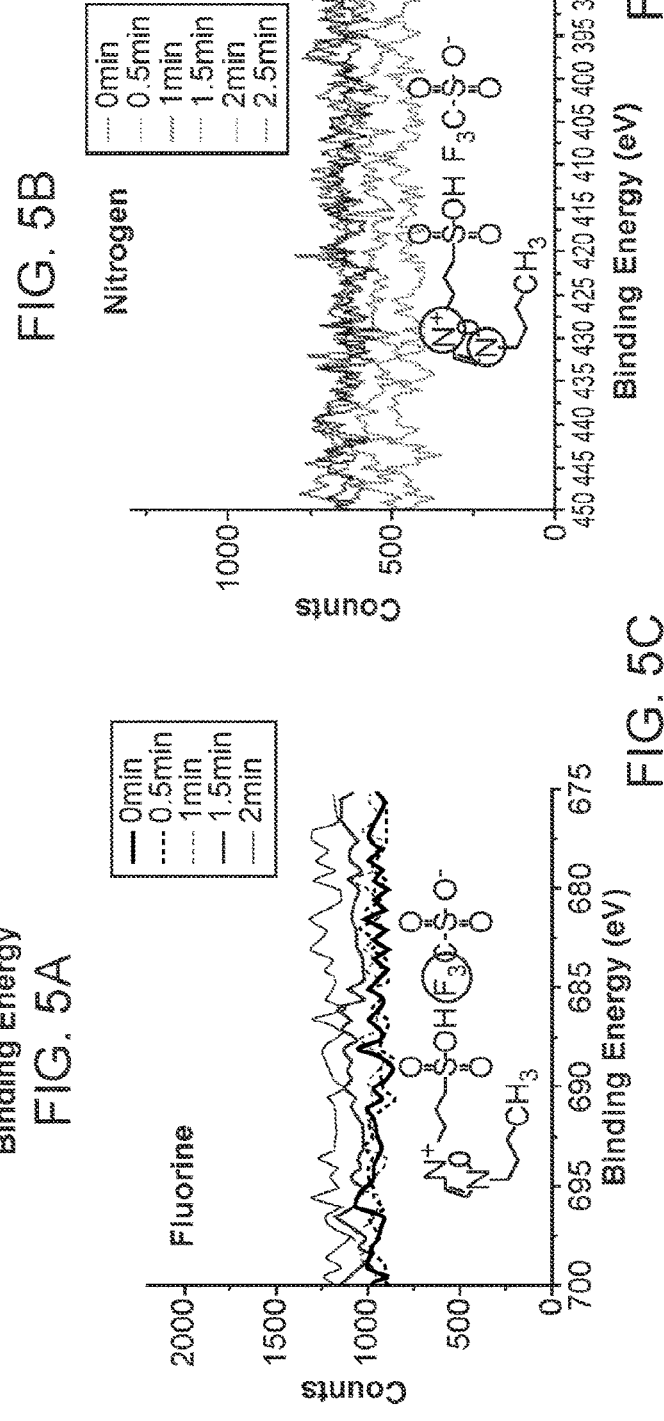
FIG. 5A  FIG. 5B  FIG. 5C  FIG. 5D

Expand for global mapping    Relax for high resolution mapping

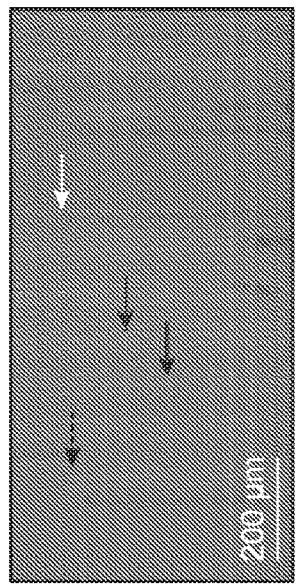
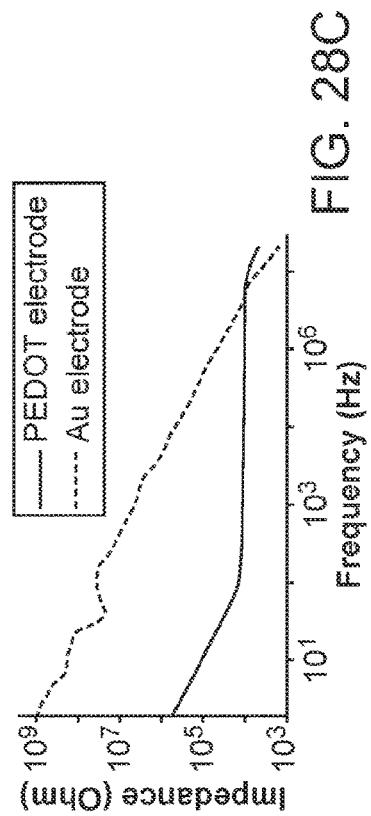
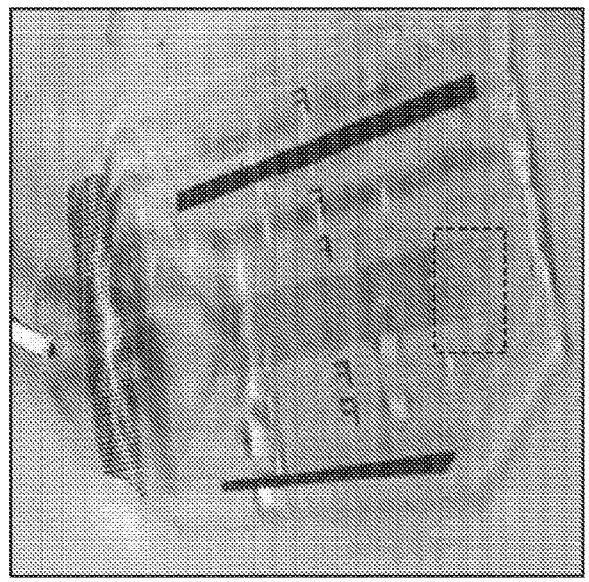
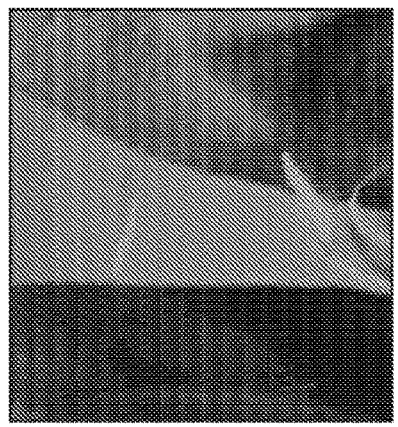
FIG. 28A
FIG. 28B
FIG. 28C
FIG. 28D

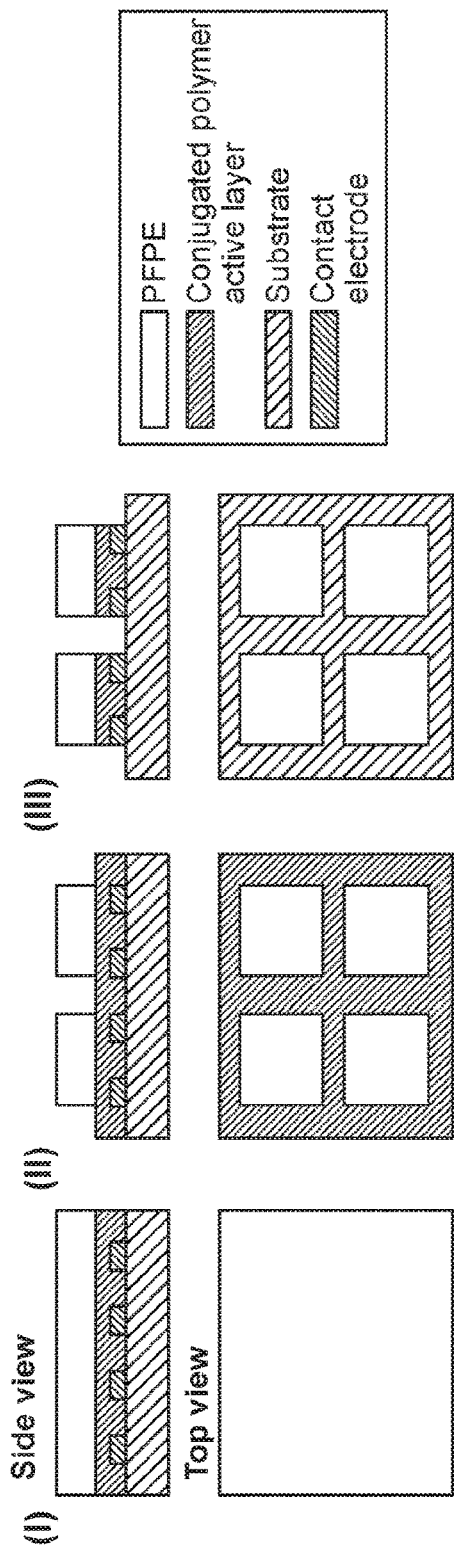
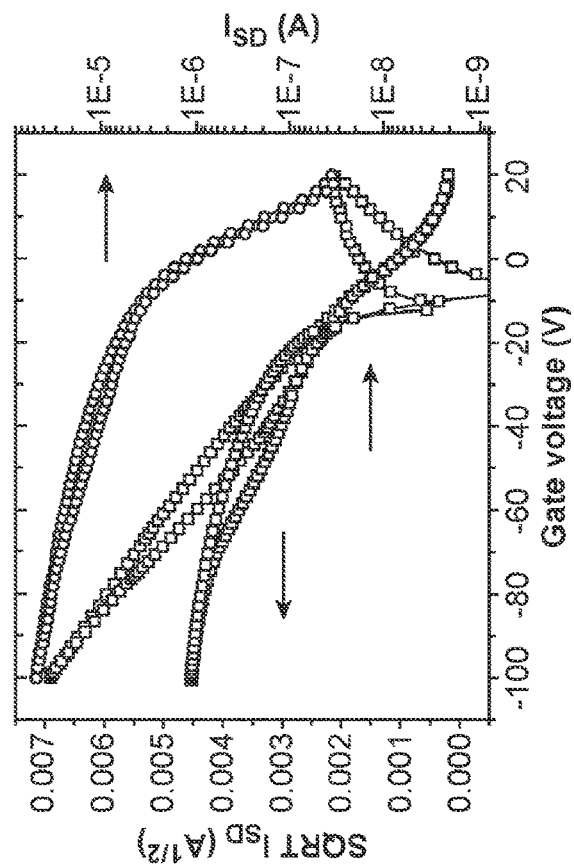
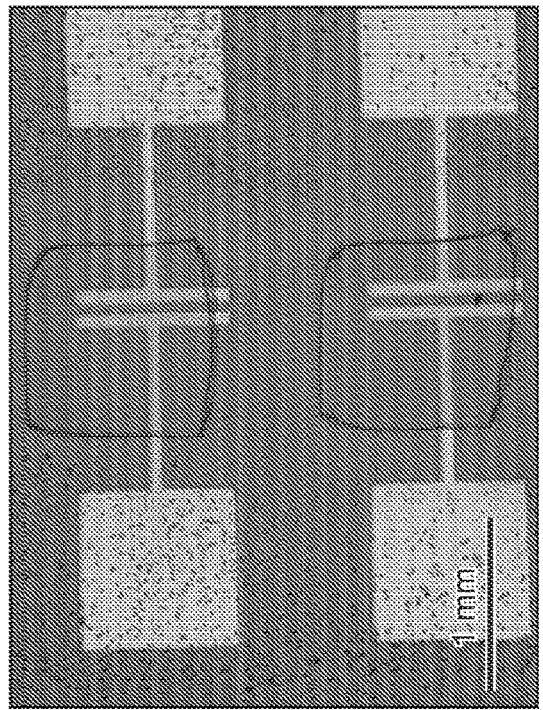
FIG. 36A
FIG. 36B
FIG. 36C

LITHOGRAPHICALLY PATTERNED ELECTRICALLY CONDUCTIVE HYDROGELS, PHOTO-CURABLE COMPOSITIONS, AND ELASTOMERS FORMED FROM SUCH COMPOSITIONS

CROSS-REFERENCE TO RELATED APPLICATION

This application is a continuation of U.S. patent application Ser. No. 16/758,347, filed on Apr. 22, 2020, which is a U.S. National Stage Entry of PCT/US2018/057855, filed Oct. 26, 2018, and which claims the benefit of and priority to U.S. Provisional Application No. 62/578,264, filed Oct. 27, 2017, the contents of all of which are incorporated herein by reference in their entirety.

BACKGROUND

An electrically conductive hydrogel (ECH) that combines both high-performance electrochemical properties and biomimetic properties constitutes a desired material to interface with biological tissue. However, challenges in miniaturizing ECH into encapsulated electronics with small-scale feature size and stretchability have constrained its applications for implanted electronics.

Also, development of stretchable electronics can provide applications ranging from wearable electronics to biomedical mapping electronics, amongst others. To form a stretchable device, patterning of a stretchable electrically active layer adjacent to a stretchable dielectric layer can be an important stage, given that the interfacing quality between an electrically active material and a dielectric material can determine device performance. This is especially a challenge when using elastomers as dielectric materials, which can be constrained by several factors that hinder their applications for stretchable electronics. For example, poor chemical resistance of various elastomers can preclude patterning of a semiconducting polymer on top of such elastomers. In addition, various elastomers generally lack the ability to be photo-patterned so as to be compatible with manufacturing stages for patterning semiconducting polymers and stretchable conductors.

It is against this background that a need arose to develop embodiments of this disclosure.

SUMMARY

In some embodiments, a photo-curable composition includes: a fluorinated monomer including cross-linkable functional groups; and a photoinitiator.

In some embodiments, a manufacturing method includes: providing an electrically active layer over a substrate; applying the photo-curable composition of the foregoing embodiments over the electrically active layer; and, using the photo-curable composition as a photoresist, patterning the electrically active layer.

In some embodiments, a manufacturing method includes: applying the photo-curable composition of the foregoing embodiments over a substrate; and curing the photo-curable composition to form an elastomer. In some embodiments, the manufacturing method further includes: forming an electrically active layer over the elastomer; and patterning the electrically active layer. In some embodiments, the manufacturing method further includes: providing an electrically active layer over the substrate prior to applying the photo-curable composition over the substrate, and where applying the photo-curable composition over the substrate includes applying the photo-curable composition over the electrically active layer, and curing the photo-curable composition includes forming the elastomer encapsulating the electrically active layer.

In some embodiments, a manufacturing method includes: combining an electrically conductive polymer with an ionic liquid to form an ion gel; and at least partially removing the ionic liquid in the ion gel to form an electrically conductive hydrogel.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIGS. 1A-1H are directed to formation of ultra-conductive electrically conductive hydrogel (ECH). FIG. 1A is a schematic illustration of a stepwise poly(3,4-ethylenedioxythiophene)-poly(styrenesulfonate) (PEDOT:PSS) ECH synthesis process. FIG. 1B includes scanning electron microscopy (SEM) images showing morphological changes in the each step during the synthesis of ECH and the images corresponds to the schematics shown in FIG. 1A: Ionic liquid (IL) is blended with the PEDOT:PSS solution to form an ion gel (i); IL in the PEDOT:PSS/IL ion gel is exchanged with water and dried at room temperature. The dried sample with aligned and interconnected microstructure can swell in water to form the ECH (ii) The interconnected PEDOT enriched polymer network led to a continuous electronic conductive pathway (iii). Scale bar: 1 µm. FIG. 1C illustrates a conductance and conductivity change during the transition from ion gel to ECH. FIG. 1D illustrates a volumetric change during the transition from ion gel to ECH. Scale bar: 100 µm. FIG. 1E illustrates the atomic ratio of sulfur(S) in PEDOT and PSS characterized by High Resolution X-ray photoelectron spectroscopy (XPS). FIG. 1F is a comparison of electrochemical impedance between pristine PEDOT:PSS and ECH. FIG. 1G illustrates a change in electrochemical impedance under different uniaxial strains at about 1 Hz, about 100 Hz and about 1 kHz frequency. ECH film thickness is about 200 nm. Inset: the schematic of the measurement set-up. ECH is sandwiched between two elastomer passivation layers. Physiological media DMEM and platinum electrode have been employed as electrolyte and counter electrode, respectively, for the characterization. FIG. 1H is a surface plot of impedance at different strains and frequencies.

FIGS. 2A-2I are directed to stable and lithographical micro-patternable ECH (MECH). FIG. 2A illustrates UV-Vis spectra of the MECH and pristine PEDOT:PSS film in aqueous solution over time, showing stability of MECH in water. FIG. 2B shows characterization of charge storage capacity in PBS incubation over about 19 days. FIG. 2C illustrates the electrochemical impedance characterization of MECH electrode over time when incubated in PBS solution. FIG. 2D illustrates impedance versus frequency before and after soaking. FIGS. 2E-2F illustrate that impedance at low frequency (about 1 Hz, FIG. 2E) and high frequency (about 1 kHz, FIG. 2F) is observed to be stable over about 19 days. FIG. 2G illustrates lithographically patterned MECH structure "wavy line", "dot array", "straight line", and "alphabets". FIG. 2H illustrates lithographically patterned complex microstructure of MECH, in which both "straight" line and "curved" line are involved. FIG. 2I shows SEM images of the MECH micro-pattern, demonstrating micrometer resolution precision.

FIGS. 3A-3J are directed to a biocompatible micropatterned hydrogel elastronic. FIG. 3A illustrates the molecular structure of elastic perfluoropolyether (PFPE) undergoing cross-linking process upon exposure to ultraviolet (UV) light. FIG. 3B is a stress-strain curve of the fluorinated elastic PFPE-dimethacrylate (PFPE-DMA). FIG. 3C illustrates that the impedance at about 1 Hz and about 1000 Hz is higher than about 100 Mohm and is unaffected upon applied strain. Inset: optical microscope image of MECH spin-coated on PFPE. No noticeable formation of wrinkles after stretch-release cycles is observed, due to compatible Young's modulus between MECH and PFPE. FIG. 3D shows photolithographically patterned PFPE-DMA microlines (i), an array of microdot (ii), and complex pattern of a "world map" (iii). In the dark field image, the "border" with less than about 1.5 μm width is resolved (vi & v). FIG. 3E is an SEM image of photolithographically micro-patterned PFPE-DMA giraffe (i) with both straight line (ii) and curved line (iii). FIG. 3F shows a free standing thin film with elastic MECH micro-patterns on PFPE-DMA under stretching (i). The micro-patterned hydrogel "tree" can be stretched to about 20% (ii & iii). FIG. 3G shows schematics of elastronic electrode, where MECH electrode and interconnect are sandwiched by photolithographically micro-patterned fluorinated polymer PFPE-DMA as top and bottom passivation layers. FIG. 3H illustrates schematics of biocompatibility study. MECH electrode array on PFPE-DMA elastomer was wrapped around and implanted on sciatic nerve for about 3 weeks. FIGS. 3I-3J show projection of 3D reconstructed confocal micrograph of immunochemically labelled cross-section slice of sciatic nerve. The pseudo color coding shows the astrocytic marker S-100 (green), and Neurofilament (red) in controlled leg (FIG. 3I) and the device implanted leg (FIG. 3J). FIG. 3K is a histogram showing the density of astrocytic cells in control leg and implant leg (unpaired, two-tailed T-test).

FIGS. 4A-4L are directed to high current density and low voltage in vivo neural stimulation. FIG. 4A shows the impedance spectra of MECH electrode and saline cross-linked PEDOT:PSS on gold (Au) electrode. Both electrodes have the same electrode area. MECH was patterned for both solution contact and interconnect, while saline cross-linked PEDOT:PSS was used as the solution contact and Au was used as interconnect for control. FIG. 4B shows impedance spectra of pure electronic conductor—platinum, pure ionic conductor—Dulbecco's Modified Eagle's medium (DMEM) and mixed conductor—MECH. The cross-section area of the interconnect was exposed to solution. FIG. 4C illustrates current density of platinum, DMEM, and MECH measured at frequency of about 50 Hz with ±1.25 V bipolar pulse. FIG. 4D is a transmission line model of conductive hydrogel as both electrode and interconnect. Interconnect Randel circuits that include interconnect volumetric double layer capacitance, $C_{p,i,n}$, interconnect reaction resistance, $R_{ct,i,n}$, and interconnect Warburg element, $Z_{w,i,n}$, are in parallel with electrode Randel circuit that includes electrode double layer capacitance, $C_{p,e}$, electrode reaction resistance, $R_{ct,e}$ and electrode Warburg element $Z_{w,e}$. Diffusion of electrolyte into hydrogel interconnect increases number of interconnect Randel circuit, n, which is in parallel with electrode Randel circuit, leading to the decrease of the overall impedance. FIG. 4E shows geometry dependent current density and impedance for the MECH. Current density increases when interconnect length is increased. Inset: simulated impedance versus interconnect length based on the transmission line model in FIG. 4D. FIG. 4F illustrates schematics of the neural stimulation in vivo with MECH microelectrode. Leg swing is stimulated by bulk electrode and individual finger movement is achieved by localized stimulation with microelectrode. FIG. 4G is a projection of 3D reconstructed confocal micrograph of MECH microelectrode conformally wrapped around sciatic nerve. Neurofilament was used to label neurons. The curved transparent sheet is the PFPE-DMA while the dark lines are the MECH. FIG. 4H is a reconstructed cross section image along the dash line in FIG. 4G. Outer surface of sciatic nerve (labelled) is in close contact with MECH electrode (labelled). FIG. 4I is an optical microscopic image of MECH on PFPE-DMA microelectrode. MECH electrode and interconnect is sandwiched in between photo-patternable PFPE-DMA as top passivation layer and substrate. FIG. J is a response of the finger movement under different stimulation frequency with charge balanced voltage pulse (pulse width: about 200 μs). FIG. 4K shows the percentage of leg movement respect to the full degree of movement under different stimulation voltage for MECH electrode and platinum electrode. FIG. 4L shows after about 2 months soaking in PBS, the MECH electrodes can stimulate an even higher percentage of leg movement with respect to the full degree of movement at about 50 mV and about 100 mV (unpaired, two-tailed T-test).

FIGS. 5A-5D depict elemental analysis of MECH showed substantially complete removal of IL. XPS in different layer depth (FIG. 5A) shows no presence of fluorine (FIG. 5C) or nitrogen (FIG. 5D) in the entire thin film MECH. Silicon peak (FIG. 5B) was used to determine the end point of sputtering. The XPS result indicated that IL containing both fluorine and nitrogen was substantially completely removed because fluorine and nitrogen are present in the IL, but not in PEDOT:PSS.

FIG. 17B illustrates the height profile of the MECH microwire. Scale Bar: 100 µm. FIG. 17C is a three-dimensional (3D) image of the MECH microwire measured with 3D laser scanning microscope. Bar representing the dimension in out-of-plane direction.

(FIG. 20A) snow flake and tree (FIG. 20C) and (FIG. 20E) and their zoomed-in images (FIG. 20B), (FIG. 20D) and (FIG. 20F), respectively.

FIG. 24A is a simplified transmission line model of the interconnect impedance and contact electrode impedance. Interconnect Randel circuits that include interconnect volumetric double layer capacitance, $C_{p,i,n}$, and interconnect reaction resistance, $R_{ct,i,n}$, are in parallel with electrode Randel circuit that includes electrode double layer capacitance, $C_{p,e}$, and electrode reaction resistance, $R_{ct,e}$. Diffusion of electrolyte into hydrogel interconnect increases number of interconnect Randel circuits, n, which is in parallel with electrode Randel circuit, leading to the decrease of the overall impedance (interconnect impedance and electrode impedance). FIG. 24B shows overall impedance at different frequencies for various interconnect lengths. FIG. 24C shows impedance at about 1 kHz measured respect to different interconnect lengths.

FIG. 27A illustrates elastic electronics with a high density sensor array can be stretched to cover the whole epicardial tissue, mapping the global activity to identify an arrhythmia region. FIG. 27B shows elastic electronics will relax back into a highly dense sensor array to map the origin of the arrhythmogenic region. FIG. 27C illustrates that the sensor array can form an intimate mechanical coupling with cardiac tissue through the polymer-tissue interface and deform with the cardiomyocyte beating, while recording the signal at the same region through the elastic property of the materials.

FIG. 28A depicts a freestanding elastic sensor array. Dashed box highlights the sensor region. FIG. 28B illustrates a stretchable sensor (left arrow), interconnects (middle arrows) and passivation (right arrow). FIG. 28C is an impedance measurement. FIG. 28D shows stretchability of freestanding elastic sensor array.

FIG. 29A illustrates capacitance per area of a PFPE-DMA film relative to a thickness of the film. FIG. 29B is a representative capacitance of the PFPE-DMA film relative to the frequency of voltage applied across the film. FIG. 29C shows quasi-DC capacitance measurements based on RC charging experiment of the PFPE-DMA film.

FIG. 31A shows transfer curves of FET using PFPE-DMA as dielectric film. FIG. 31B is a transfer curve of FET using PFPE-DMA and 2-perfluorohexylethyl acrylate (about 1:1 wt:wt) co-polymerized film as dielectric film. FIG. 31C is a transfer curve of FET using PFPE-DMA and pentafluorophenyl acrylate (about 1:1 wt:wt) co-polymerized film as dielectric film. Dots represent $I_{SD}$ and $I_G$.

FIG. 33A is a load-stretch curve of PFPE-DMA. FIG. 32B shows a PFPE-DMA film subjected to a cycle of loading and unloading of varying maximum stretch.

FIG. 34A is an n-type semiconducting polymer. FIG. 34B is a p-type semiconducting polymer.

FIGS. 36A-36C are directed to patterning semiconducting polymer by using PFPE-DMA as dielectric film for top-gate-bottom-contact device. FIG. 36A illustrates stepwise of patterning of semiconductor by PFPE-DMA. (I) Semiconducting polymer is coated on top of a bottom contact. 12 kg/mol PFPE-DMA was spin-coated on the top of semiconducting polymer. (II) Photolithographical patterning of PFPE-DMA with development process. (III) Organic solvent is used to remove regions of semiconducting polymer that are not covered by cross-linked PFPE-DMA. FIG. 36B is a representative optical image for device. FIG. 36C is a representative transfer curve of device fabricated using PFPE-DMA as mask for patterning and as dielectric film.

DESCRIPTION

Lithographically Patterned Electrically Conductive Hydrogels

Figure 1A:
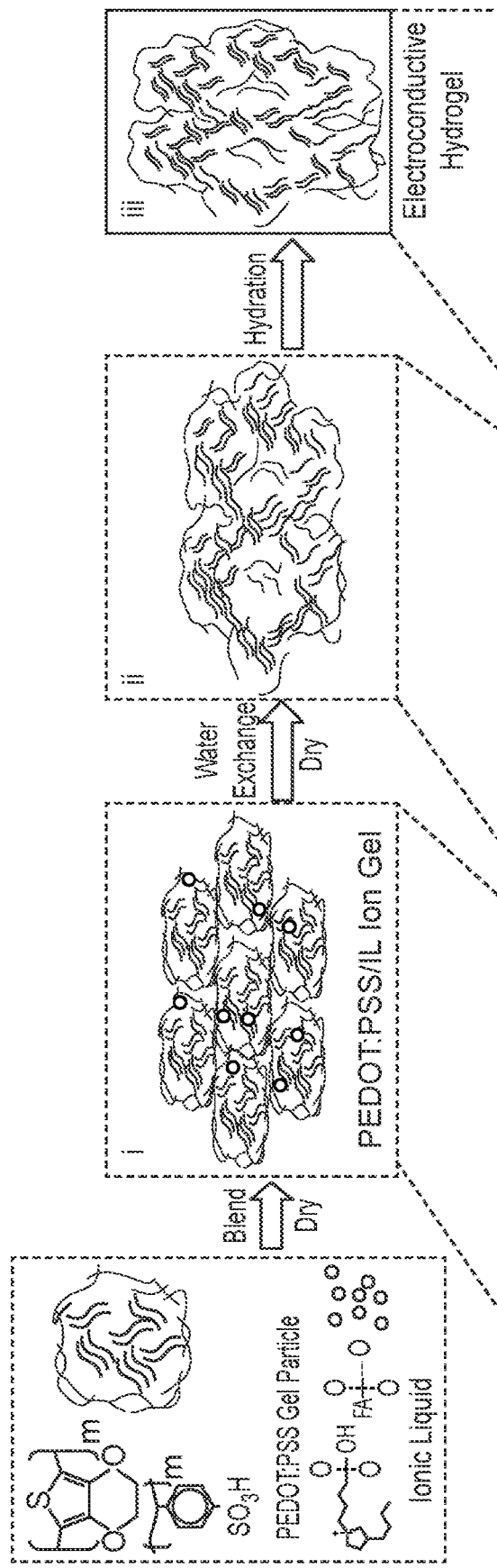

Some embodiments of this disclosure are directed to an electrically (or electronically) conductive hydrogel exhibiting high electrical conductivity, high water stability, and high stretchability. Examples of applications of such electrically conductive hydrogel include elastic or stretchable microelectronics, such as in the context of implantable medical devices, wearable electronic devices, and soft electronic devices; other biomedical devices; cosmetics; prosthetics; and other applications involving an interface with a human body, an animal body, or other biological tissue where matching of mechanical properties with the biological tissue and stability against water are desired. Further and in view of its high electrical conductivity, such electrically conductive hydrogel can serve as a stretchable conductor and can be included as an interconnect or an electrode in elastic electronics, especially to provide an electronic interface to a human body or other biological tissue.

In some embodiments, an electrically conductive hydrogel is formed by a manufacturing method including: combining an electrically conductive polymer with an ionic liquid to form an ion gel; and at least partially removing the ionic liquid in the ion gel via water exchange to form the electrically conductive hydrogel.

In some embodiments, introducing the ionic liquid imparts desired properties to the electrically conductive polymer and to the resulting electrically conductive hydrogel, including high electrical conductivity and high stretchability.

In some embodiments, the ionic liquid is 4-(3-butyl-1-imidazolio)-1-butanesulfonic acid triflate. Other examples of the ionic liquid include bis(trifluoromethane) sulfonimide lithium salt, 1-butyl-3-methylimidazolium octyl sulfate, zinc di(bis(trifluoromethylsulfonyl)imide), 4-(3-butyl-1-imidazolio)-1-butanesulfonate, 1-ethyl-3-methylimidazolium bis(trifluoromethyl sulfonyl)imide, and methyl-trioctylammonium bis(trifluoromethyl sulfonyl)imide.

In some embodiments, a general structure of the ionic liquid is represented by the following in I and II:

I. Compounds that Contain the Following Anions and Cations:

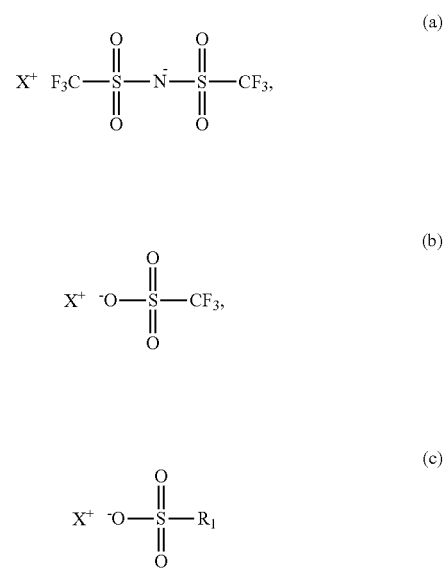

where $R_1$ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms,

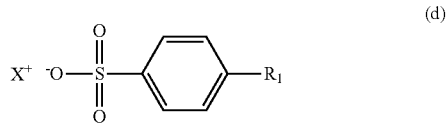

where R₁ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms, (e)

$$X^+ \ {}^-O-\underset{\underset{O}{\|}}{\overset{\overset{O}{\|}}{S}}-\underset{\underset{C}{\|}}{\overset{}{C}}H-\overset{O}{\overset{\|}{C}}-O-R_1$$
$$\phantom{X^+ \ {}^-O-S-C}\underset{\underset{O}{\|}}{C}-O-R_2$$

where R₁ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms;

where R₂ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms; and R₁ and R₂ can be the same or different, (f)

where R₁ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms;

where R₂ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms; and $R_1$ and $R_2$ can be the same or different, and

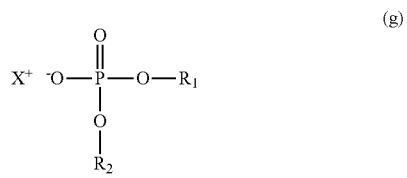

(g)

where $R_1$ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms;

where $R_2$ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (4) an aryl group, such as containing 5 to 20, 5 to 14, or 5 to 10 carbon atoms, optionally containing 1, 2, 3, 4, or more heteroatoms, and optionally substituted with 1, 2, 3, 4, or more halogen atoms, such as fluorine atoms; and $R_1$ and $R_2$ can be the same or different.

For (e) to (g), $R_1$ and $R_2$ can be covalently bonded together, directly or indirectly through a linker group.

For (a) to (g), the cations and the anions can be covalently bonded together, directly or indirectly through a linker group, to yield Zwitterion compounds.

In addition to (a) to (g) above, other compounds that contain anions containing —(SO$_2$)—, $^-$O—(SO$_2$)—, and

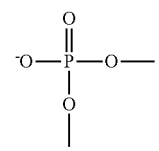

are encompassed by this disclosure.

For (a) to (g), the cation X$^+$ can be any of the following:

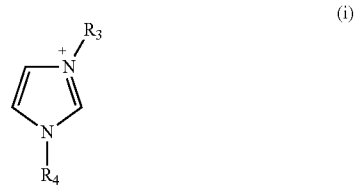

(i)

where $R_3$ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl sulfonate group, such as represented as —SO$_2$—O—R or -L-SO$_2$—O—R, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (4) a linear or branched alkyl sulfonic acid group, such as represented as -L-SO$_2$—OH, with L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (5) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms;

where $R_4$ is, or contains, (1) a linear or branched alkyl group, such as containing 1 to 10, 1 to 8, 1 to 6, 1 to 4, or 1 to 2 carbon atoms, optionally containing 1, 2, 3, 4, or more heteroatoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (3) a linear or branched alkyl sulfonate group, such as represented as —SO₂—O—R or -L-SO₂—O—R, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; (4) a linear or branched alkyl sulfonic acid group, such as represented as -L-SO₂—OH, with L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (5) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; and $R_3$ and $R_4$ can be the same or different, (ii) H⁺, (iii) a monovalent, divalent, or multivalent metal ion, and (iv) ammonium ion with linear or branched alkyl or alkyl ether groups.

II. Zwitterion Compounds with the Following Structures:

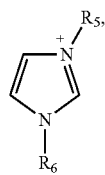

where

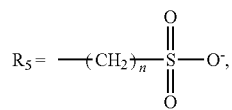

n=1-8, 2-8, 3-8, or 4-8; and where $R_6$ is (1) a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms; (2) a linear or branched alkyl ether group, such as represented as —OR or -L-OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms; or (3) a linear or branched alkyl ester group, such as represented as —(CO)OR or -L-(CO)OR, with R being a linear or branched alkyl group, such as containing 1 to 10, 1 to 8, 1 to 6, 1 to 4, or 1 to 2 carbon atoms, and optionally substituted with 1, 2, 3, 4, or more halogen atoms, such as fluorine atoms, and L being a linker group, such as an alkylene group containing 1 to 10, 1 to 8, 1 to 6, 1 to 4, or 1 to 2 carbon atoms, and optionally substituted with 1, 2, 3, 4, or more halogen atoms.

In some embodiments, the ionic liquid is introduced in an amount of at least about 5% by weight, relative to a total weight of the ion gel, such as at least about 10%, at least about 20%, at least about 30%, at least about 40%, or at least about 50%, and up to about 60% or greater.

In some embodiments, the electrically conductive polymer is poly(3,4-ethylenedioxythiophene):poly(styrenesulfonate) or PEDOT:PSS. Another electrically conductive polymer can be used in place of, or in combination with PEDOT:PSS, such as those containing aromatic cyclic groups (e.g., poly(fluorene), polyphenylene, polypyrene, polyazulene, polynaphthalene, poly(pyrrole), polycarbazole, polyindole, polyazepine, polyaniline, poly(thiophene), and poly(p-phenylene sulfide)), those containing double bonds (e.g., poly(acetylene)), and those containing both aromatic cyclic groups and double bonds (e.g., poly(p-phenylene vinylene)). Although some embodiments are explained in the context of electrically conductive polymers and electrically conductive hydrogels, other embodiments are encompassed, in which a semiconducting polymer or an insulating polymer is used to form an ion gel, followed by conversion into a hydrogel that is semiconducting or insulating.

In some embodiments, the manufacturing method further includes: applying the ion gel over a substrate; and patterning the ion gel to form a patterned ion gel, and wherein removing the ionic liquid is performed on the patterned ion gel to form the electrically conductive hydrogel as a stretchable conductor.

In some embodiments, the ion gel is applied over the substrate by, for example, spin-coating, drop casting, printing, or another coating or liquid deposition technique.

In some embodiments, patterning the ion gel is performed by photolithography, including applying a photoresist over the ion gel, selectively exposing regions of the photoresist to light, developing and removing the exposed regions (or unexposed regions) of the photoresist to form openings, removing (e.g., by etching) regions of the ion gel exposed by the openings, and removing a remaining photoresist.

In some embodiments, the manufacturing method can form the stretchable conductor with a fine feature resolution (e.g., width, spacing, or other feature size) down to micron or submicron scale, such as about 40 µm or less, about 30 µm or less, about 20 µm or less, about 10 µm or less, about 5 µm or less, or about 1 µm or less.

In some embodiments, the manufacturing method is performed over multiple layers of stretchable conductors, with precise alignment between the layers attained by the fine feature resolution.

In some embodiments, a conductivity of the electrically conductive hydrogel (or the stretchable conductor) is at least about 1 S/cm, at least about 5 S/cm, at least about 10 S/cm, at least about 15 S/cm, at least about 20 S/cm, at least about 25 S/cm, at least about 30 S/cm, at least about 35 S/cm, at least about 40 S/cm, or at least about 45 S/cm, and up to about 60 S/cm or greater, up to about 80 S/cm or greater, or up to about 100 S/cm or greater.

In some embodiments, a maximum tensile strain of the electrically conductive hydrogel (or the stretchable conductor) is at least about 1%, at least about 5%, at least about 15%, at least about 20%, at least about 25%, at least about 30%, at least about 35%, at least about 40%, at least about 45%, or at least about 50%, and up to about 80% or greater, or up to about 100% or greater.

In some embodiments, the Young's modulus of the electrically conductive hydrogel (or the stretchable conductor) is about 200 kPa or less, about 150 kPa or less, about 100 kPa or less, about 80 kPa or less, about 60 kPa or less, about 40 kPa or less, about 35 kPa or less, about 30 kPa or less, or about 25 kPa or less, and down to about 20 kPa or less, or about 15 kPa or less.

In some embodiments, water stability of the electrically conductive hydrogel (or the stretchable conductor) is characterized by a weight loss after immersion in water for about 21 days of no greater than about 50% of an initial weight, such as no greater than about 40%, no greater than about 30%, no greater than about 20%, or no greater than about 10%.

In some embodiments in which the electrically conductive polymer is PEDOT:PSS, a molar ratio of PEDOT and PSS in the electrically conductive hydrogel (or the stretchable conductor) (as characterized by an atomic ratio of sulfur(S) in PEDOT and PSS) is at least about 0.5, at least about 0.55, at least about 0.6, at least about 0.65, at least about 0.7, or at least about 0.75, and up to about 0.8 or greater.

In some embodiments, a water content of the electrically conductive hydrogel (or the stretchable conductor) is at least about 10% by weight, relative to a total weight of the electrically conductive hydrogel (or the stretchable conductor), such as at least about 20%, at least about 30%, at least about 40%, at least about 50%, at least about 60%, at least about 70%, at least about 80%, or at least about 85%, and up to about 90% or greater.

Photo-Curable Compositions and Elastomers Formed from Such Compositions

Some embodiments of this disclosure are directed to a photo-curable composition that can be cured to form an elastomer exhibiting high stretchability and that is chemically orthogonal to various development solvents used in photolithography and, hence, compatible with photolithography. Further, the elastomer can be patterned with fine feature resolution, and can be used as a photoresist for patterning various materials, including electrically (or electronically) active materials. Examples of applications of such photo-patternable composition include forming stretchable and transparent substrates, stretchable and transparent dielectric/passivation/encapsulation films or layers for elastic or stretchable microelectronics, and photoresists for patterning of materials, such as in the context of implantable medical devices, wearable electronic devices, and soft electronic devices; other biomedical devices; cosmetics; prosthetics; and other applications involving an interface with a human body, an animal body, or other biological tissue where matching of mechanical properties with the biological tissue is desired.

In some embodiments, the photo-curable composition includes a fluorinated monomer or precursor. In some embodiments, the fluorinated monomer or precursor is a perfluorinated monomer or precursor. In some embodiments, the perfluorinated monomer or precursor includes a perfluoropolyether moiety. In some embodiments, the perfluorinated monomer or precursor includes a moiety $-(CF_2CF_2O)_x-$, where x is an integer that is 1 or greater than 1, such as 2 or greater, 3 or greater, 4 or greater, 5 or greater, 10 or greater, 15 or greater, and so forth. In some embodiments, the perfluorinated monomer or precursor, alternatively or in conjunction, includes a moiety $-(CF_2O)_y-$, where y is an integer that is 1 or greater than 1, such as 2 or greater, 3 or greater, 4 or greater, 5 or greater, 10 or greater, 15 or greater, and so forth. More generally, in some embodiments, the perfluorinated monomer or precursor includes one or more instances of a moiety -(PFA-O)—, where PFA is a perfluorinated alkylene group, such as containing 1 to 10, 1 to 8, 1 to 6, 1 to 4, or 1 to 2 carbon atoms. In some embodiments, the perfluorinated monomer or precursor includes one or more cross-linkable functional groups. In some embodiments, the cross-linkable functional groups are end groups. In some embodiments, the cross-linkable functional groups are methacrylate groups. In some embodiments, the perfluorinated monomer or precursor is perfluoropolyether dimethacrylate. In some embodiments, the perfluoropolyether dimethacrylate has a molecular weight in the range of about 1 kg/mol to about 20 kg/mol, such as about 2 kg/mol to about 20 kg/mol, about 4 kg/mol to about 20 kg/mol, about 6 kg/mol to about 20 kg/mol, about 8 kg/mol to about 20 kg/mol, about 10 kg/mol to about 20 kg/mol, or about 12 kg/mol to about 20 kg/mol.

In some embodiments, the photo-curable composition also includes a photoinitiator. An example of the photoinitiator is bis(2,4,6-trimethylbenzoyl)-phenylphosphineoxide. Another example of the photoinitiator is α-hydroxycyclohexyl phenyl ketone. In some embodiments, the photoinitiator is included in a non-zero amount of up to about 5 wt. % relative to a total weight of the photo-curable composition, such as up to about 4 wt. %, up to about 3 wt. %, up to about 2 wt. %, or up to about 1 wt. %.

In some embodiments, the photo-curable composition also includes a solvent. In some embodiments, the solvent is a fluorinated solvent, such as a fluorinated organic solvent or a fluorinated inorganic solvent. Examples of the fluorinated organic solvent include 1,3-bis(trifluoromethyl)benzene, 1,1,1,3,3-pentafluorobutane, and perfluorotributylamine.

In some embodiments, a manufacturing method includes: applying the photo-curable composition over a substrate; and curing the photo-curable composition to form an elastomer.

In some embodiments, the photo-curable composition is applied over the substrate by, for example, spin-coating, drop casting, printing, or another coating or liquid deposition technique.

In some embodiments, curing the photo-curable composition includes irradiating the photo-curable composition with light. In some embodiments, curing the photo-curable composition includes cross-linking a fluorinated monomer or precursor included in the photo-curable composition to form the elastomer as a fluorinated polymer.

In some embodiments, a maximum tensile strain of the elastomer is at least about 10%, at least about 30%, at least about 50%, at least about 80%, at least about 100%, at least about 130%, at least about 150%, at least about 180%, or at least about 200%, and up to about 210% or greater, or up to about 220% or greater.

In some embodiments, the Young's modulus of the elastomer is about 200 kPa or less, about 150 kPa or less, about 100 kPa or less, about 80 kPa or less, about 60 kPa or less, about 40 kPa or less, about 35 kPa or less, about 30 kPa or less, or about 25 kPa or less, and down to about 20 kPa or less, or about 15 kPa or less.

In some embodiments, a dielectric constant of the elastomer is about 10 or less, about 8 or less, about 6 or less, about 4 or less, about 3 or less, or about 2.5 or less, and down to about 2 or less.

In some embodiments, the manufacturing method further includes: forming an electrically active layer (e.g., electrically conductive layer or charge transport layer) over the elastomer; and patterning the electrically conductive layer.

In some embodiments, patterning the electrically active layer is performed by photolithography, including applying a photoresist over the electrically active layer, selectively exposing regions of the photoresist to light, developing and removing the exposed regions (or unexposed regions) of the photoresist to form openings, removing (e.g., by dissolution, etching, or lift-off) regions of the electrically active layer exposed by the openings, and removing a remaining photoresist. In some embodiments, the electrically active layer includes an ion gel, which is patterned to form a patterned ion gel.

In some embodiments, the manufacturing method further includes: forming or providing an electrically active layer (e.g., electrically conductive layer or charge transport layer) over the substrate prior to applying the photo-curable composition over the substrate, and where applying the photo-curable composition over the substrate includes applying the photo-curable composition over the electrically active layer, and curing the photo-curable composition includes forming the elastomer encapsulating the electrically conductive layer.

In additional embodiments, a manufacturing method includes: applying the photo-curable composition over a substrate; and selectively curing regions of the photo-curable composition to form a patterned elastomer.

In some embodiments, the photo-curable composition is applied over the substrate by, for example, spin-coating, drop casting, printing, or another coating or liquid deposition technique.

In some embodiments, selectively curing the photo-curable composition is performed by photolithography, including selectively exposing the regions of the photo-curable composition to light, and developing and removing unexposed regions of the photo-curable composition. In some embodiments, developing the photo-curable composition is performed using a fluorinated solvent, such as a fluorinated organic solvent or a fluorinated inorganic solvent.

In some embodiments, the manufacturing method can form the patterned elastomer with a fine feature resolution (e.g., width, spacing, or other feature size) down to micron or submicron scale, such as about 40 μm or less, about 30 μm or less, about 20 μm or less, about 10 μm or less, about 5 μm or less, or about 1 μm or less.

In further embodiments, a manufacturing method includes: forming or providing an electrically active layer (e.g., electrically conductive layer or charge transport layer) over a substrate; applying the photo-curable composition over the electrically active layer; and, using the photo-curable composition as a photoresist, patterning the electrically active layer.

In some embodiments, the photo-curable composition is applied over the electrically active layer by, for example, spin-coating, drop casting, printing, or another coating or liquid deposition technique.

In some embodiments, patterning the electrically active layer is performed by photolithography, including selectively exposing regions of the photo-curable composition to light, developing and removing unexposed regions of the photo-curable composition to form a patterned elastomer defining or having openings, and removing (e.g., by dissolution, etching, or lift-off) regions of the electrically active layer exposed by the openings. In some embodiments, developing the photo-curable composition is performed using a fluorinated solvent, such as a fluorinated organic solvent or a fluorinated inorganic solvent.

In some embodiments, the manufacturing method further includes, optionally, removing the patterned elastomer. In some embodiments, the patterned elastomer is retained as a functional layer of a resulting device.

EXAMPLES

The following examples describe specific aspects of some embodiments of this disclosure to illustrate and provide a description for those of ordinary skill in the art. The examples should not be construed as limiting this disclosure, as the examples merely provide specific methodology useful in understanding and practicing some embodiments of this disclosure.

Example 1

Conductive Hydrogel Micro-Elastronics for Neuromodulation

Overview:

Electrically conductive hydrogel (ECH) that combines both high-performance electrochemical properties and biomimetic properties constitutes a desired material to interact and manipulate electrogenic cells in tissue. However, challenges in miniaturizing ECH into encapsulated thin-film electronics with microscale feature size and stretchability have constrained its application for implanted electronics for localized cellular activity manipulation. Here, this example addresses these challenges by developing a lithographically patterned, ultra-conductive and water-stable ECH, as well as a chemically orthogonal, photo-patternable, and fluorinated stretchable encapsulation material. Through lithographical patterning and assembly of such materials into thin-film microelectronics, demonstration is made of hydrogel-based elastic microelectronics, which can be referred as "elastronics," containing electrodes at about 20 μm feature size. ECH hydrogel elastronics combine various desired parameters, including high volumetric capacitance and elastic passivation, significantly reduced impedance, high current injection capability and unchanged performance under strains. Using the developed hydrogel elastronics, demonstration is made of low voltage electrical stimulation and localized stimulation on periphery nerve in vivo.

INTRODUCTION

Implantable neuromodulation devices, such as deep brain stimulation (DBS) and vagus nerve stimulation (VNS) devices, can be used to treat various neurological diseases. However, their performance reliability under an in vivo environment is constrained by both its low spatial resolution and its mechanical mismatch with tissues. Designing soft microelectronic devices that possess similar physicochemical properties of biological systems will hence provide both stable and intimate electrical couplings with electrogenic tissues (e.g., neural tissues) for localized and highly efficient electrical stimulation. Hence, this approach is desired in fields such as neuroengineering, neuroprosthetics and human-machine interface.

Electronic material systems are desired to mimic the properties of biological systems. Specifically, owing to its tissue-like mechanical properties, a hydrogel is a desired material to interface with tissues and can be used in cell culture, soft tissue adhesive and implantation. Also, a conductive polymer (CP) can be synthesized as an electrically conductive hydrogel (ECH). ECH that possesses both electronic conductivity (from CP) and ionic conductivity (from hydrogel) can be an efficient interfacing material to improve the impedance of electrodes, hence providing enhanced electrical coupling with electrogenic tissues. To harness the unusual electrochemical properties, softness and stretchability of ECH and extend its applications to localized neuromodulation in vivo, precise lithographical micro-patterning of ECH into flexible and stretchable thin film elastronics at a feature size comparable to the size of individual cells is important. To achieve this goal, aspects to be addressed include: (i) ECH should have a high electronic conductivity to maintain the desired conductance when patterned into microscale thin-film structure; (ii) ECH should be ultra-stable in aqueous solution, especially considering the thin-film geometry will accelerate the degradation rate in aqueous solution; (iii) ECH should be mechanically robust during the lithographic fabrication process, maintaining its highly porous structure, thereby allowing its high current injection capability at low operation voltage for efficient electrical stimulation. Furthermore, to fabricate ECH elastronics with localized stimulators, ECH electrodes should be passivated using a chemically orthogonal and solvent-resistive elastic material (a challenge given the porous nature of elastomers). Here, this example introduces both material design and fabrication strategies to fabricate stretchable, thin-film and high-performance hydrogel microelectronics to achieve biologically-relevant elastronics.

Figure 6:
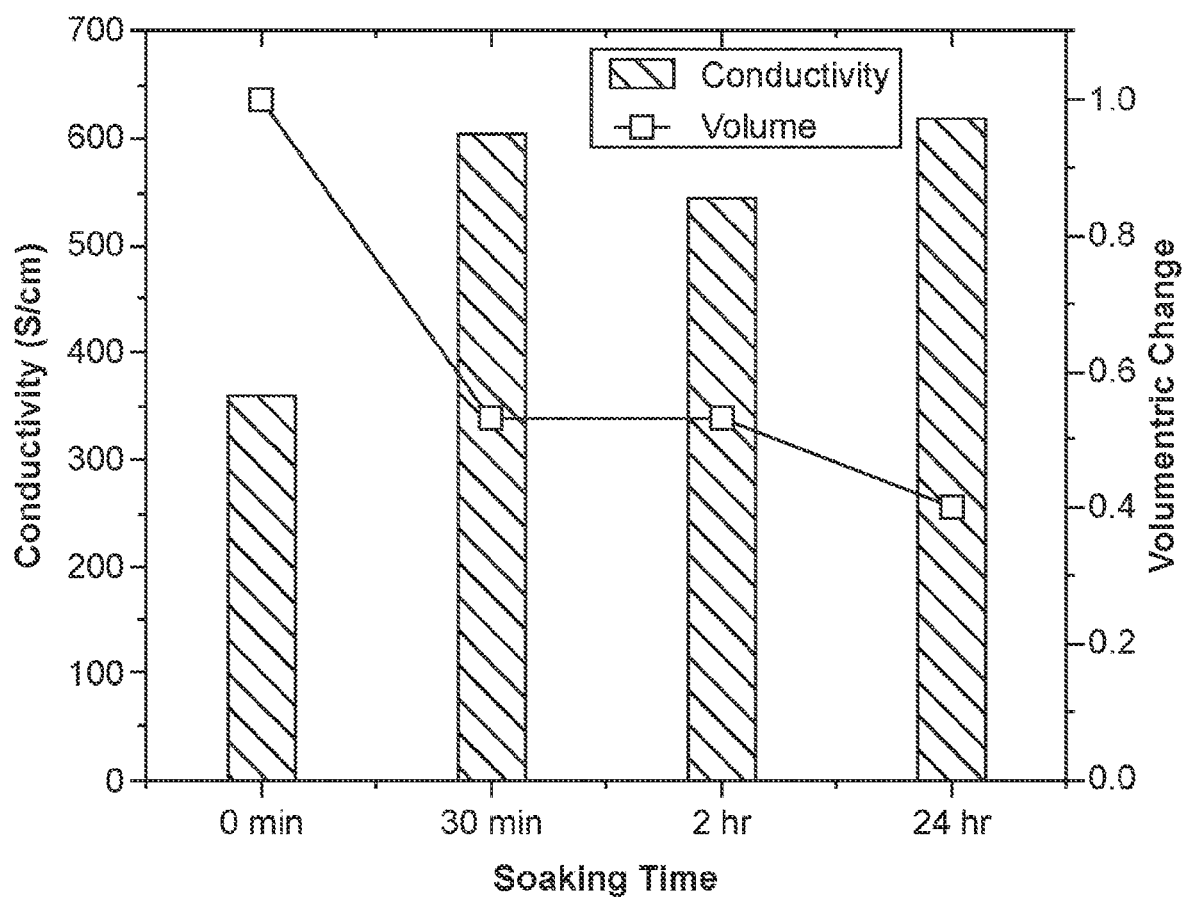
FIG. 6. Volumetric change of polymer in dehydrated MECH during ion gel to hydrogel transition and its conductivity. Both the conductivity and volume were measured in dried samples. The volume of the sample decrease due to removal of IL. The conductivity increased after removal of IL due to anisotropic volume compression.
Figure 7:
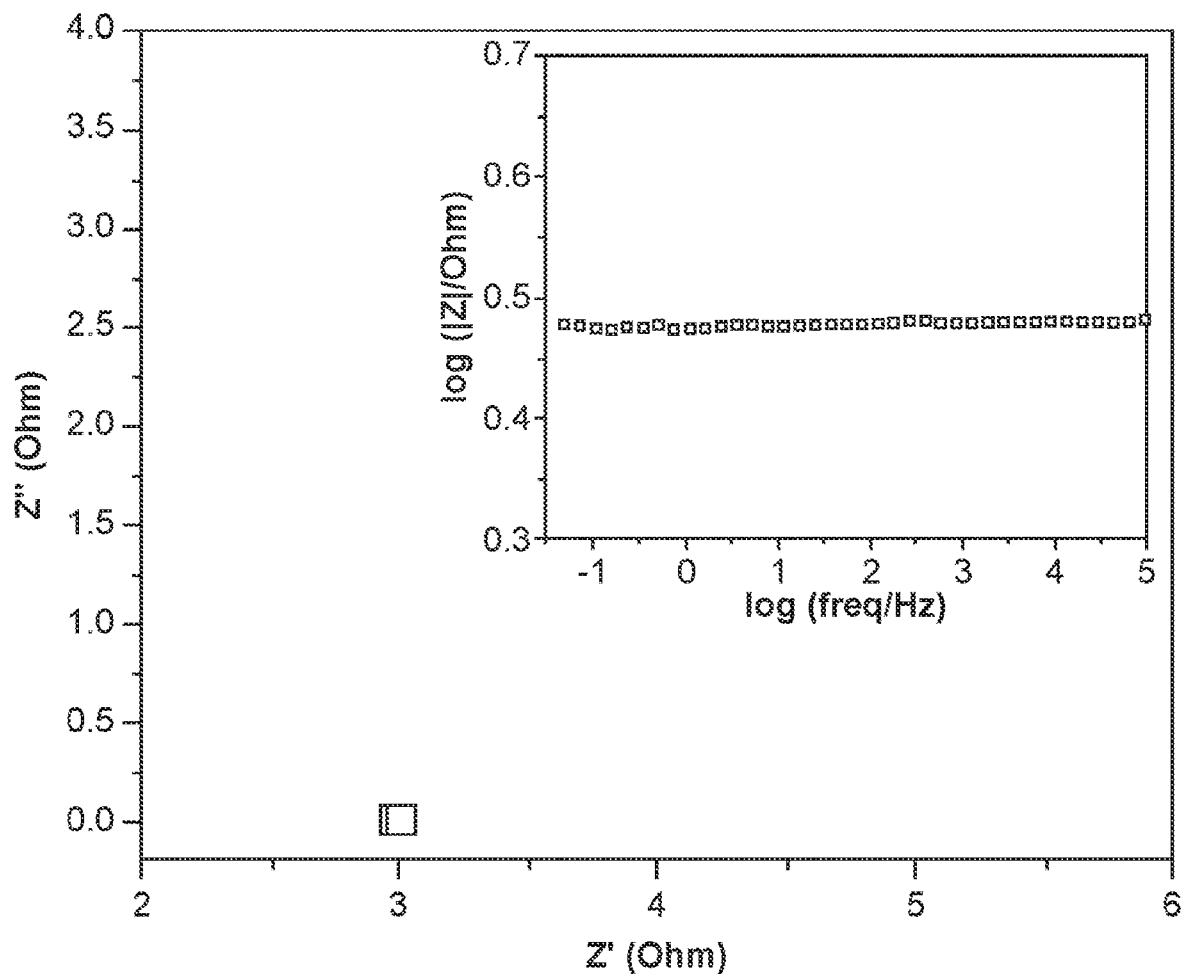
FIG. 7. Nyquist plot of MECH as interconnect. The result shows that electronic conductivity of MECH dominate over ionic conductivity. Inset: the bode plot of impedance over frequency in log scale.

Stretchable and Ultra-Conductive Hydrogel:

Development is made of a micro-patternable ECH (MECH) that possesses high conductivity and can also be patterned using a photolithography process. Using either polymerized conductive polymer in non-conducting hydrogel matrix or physically/chemically cross-linked conducting polymer with non-conducting constituents can result in insulating constituents deteriorating the continuity of a conductive polymer network, leading to low conductivity. Blending liquid ionic (IL) into poly(3,4-ethylenedioxythiophene)-poly(styrenesulfonate) (PEDOT:PSS) solution can efficiently promote the formation of PEDOT aggregate. This results in an ion gel with interconnected conductive polymer network, providing a high electrical conductivity and high stretchability. Here, it is observed that IL can be substantially completely removed by water exchange (FIGS. 5, 6), thus translating the ion gel into a hydrogel (FIG. 1a). In addition, it is observed that the electronic conductance of the MECH is stable during IL removal process (FIG. 1c) and is also significantly higher than the ionic conductance of the MECH (FIG. 7). The measured ECH has a conductivity of 47.4±1.2 S/cm. (FIG. 1c). As for the water content in the hydrogel, it is estimated to be about 82 wt. % within one-minute soaking in water, and stabilized at about 85 wt. % (FIG. 1d).

Figure 1B:
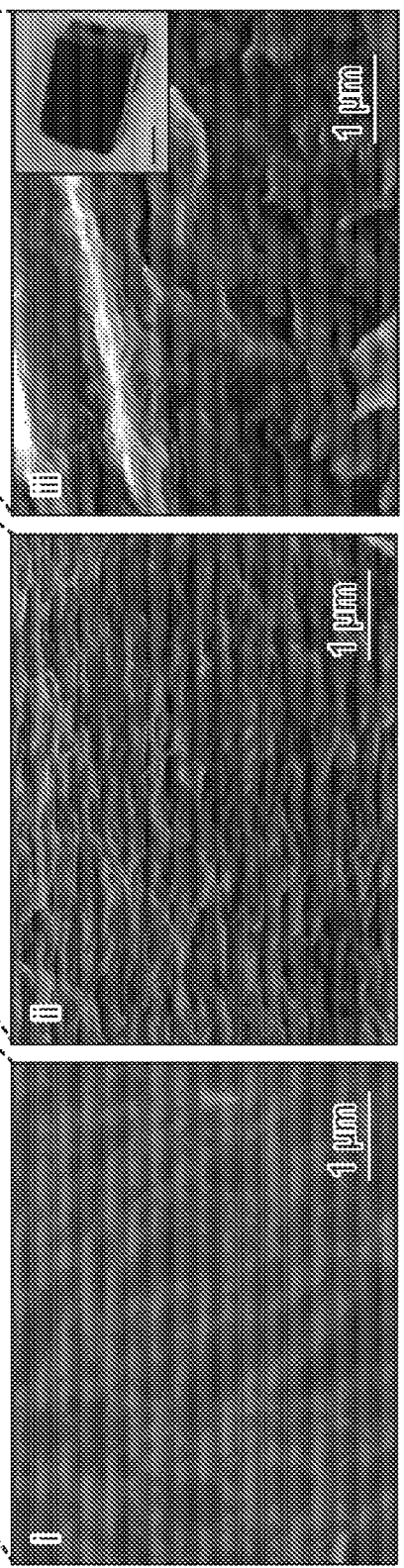
Figure 8A:
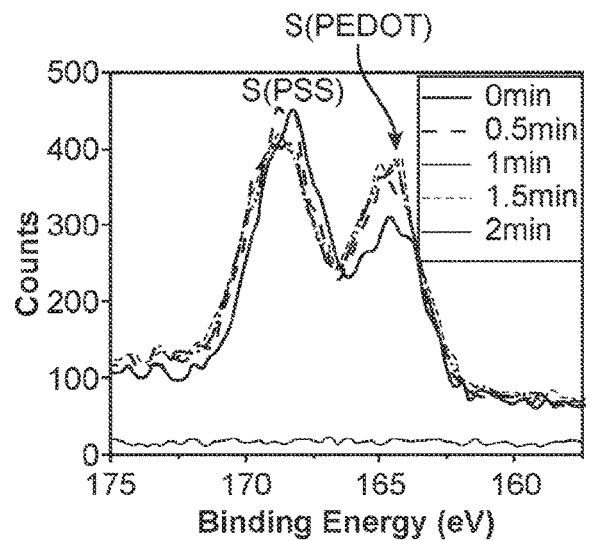
FIGS. 8A-8B are directed to XPS characterization of composition of PEDOT, PSS and IL in MECH. Sulphur spectra (FIG. 8A) in MECH showed that the atomic ratio between PEDOT and PSS (FIG. 8B) at different layer depths.
Figure 8B:
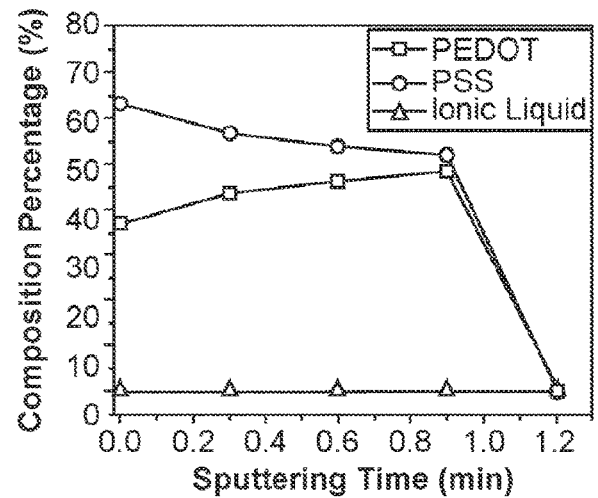
Figure 9:
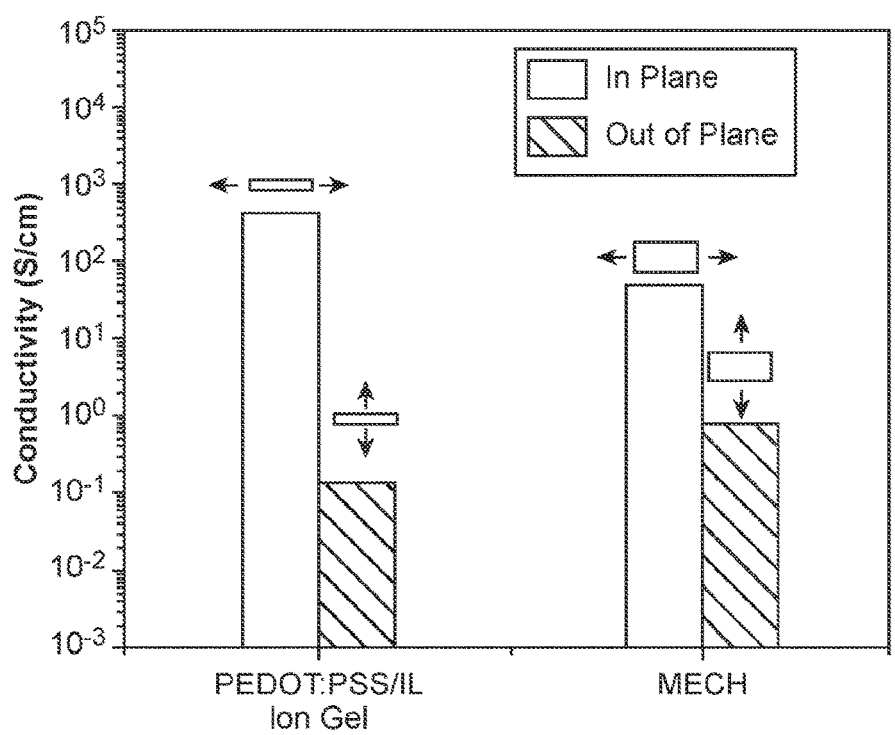
FIG. 9. In-plane and out-of-plane conductivity of PEDOT:PSS/IL ion gel and MECH film. Out-of-plane is specified by the perpendicular direction to the plane of the film. The in-plane conductivity is more than about 1 order of magnitude higher for both ion gel and MECH, indicating the aligned PEDOT polymer network along in-plane orientation.
Figure 10A:
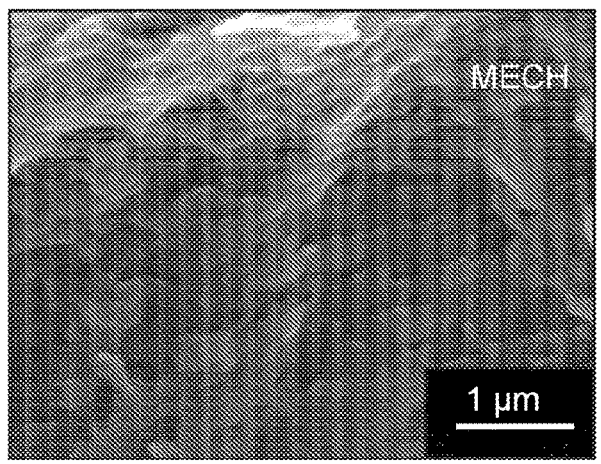
FIGS. 10A-10D are directed to an SEM image of MECH and PEDOT:PSS sample. Both MECH and PEDOT:PSS are soaked in water and freeze fried with liquid nitrogen prior to SEM imaging. MECH (FIGS. 10A-10B) has an interconnected polymer network, while PEDOT:PSS sample (FIGS. 10C-10D) has a delaminated thick-layered structure with gap size >about 30 µm.
Figure 10B:
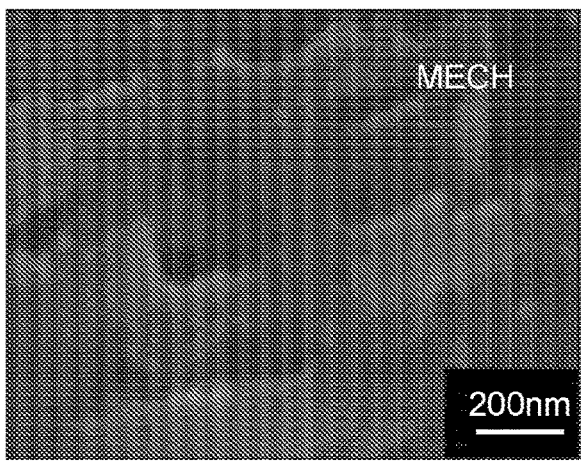
Figure 10C:
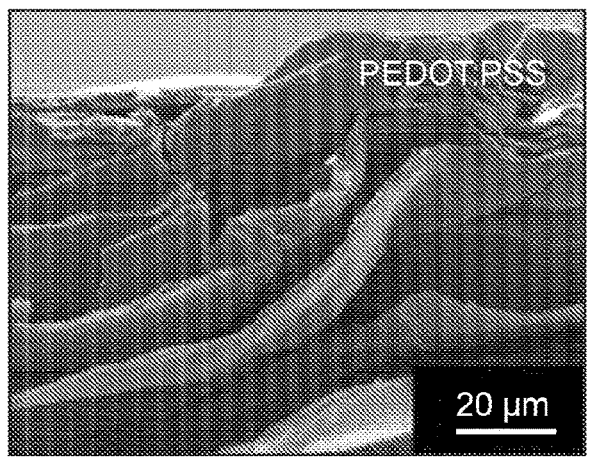
Figure 10D:
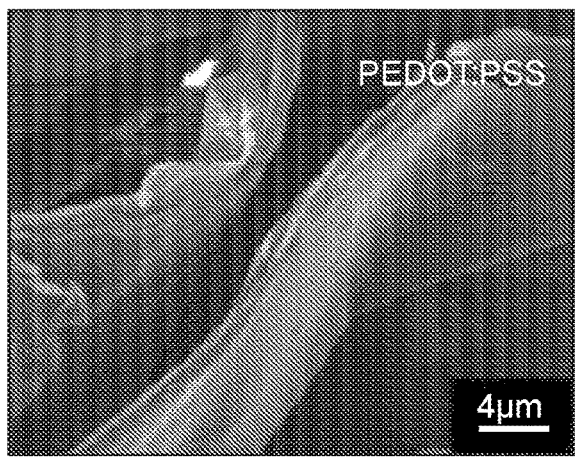
Figure 11:
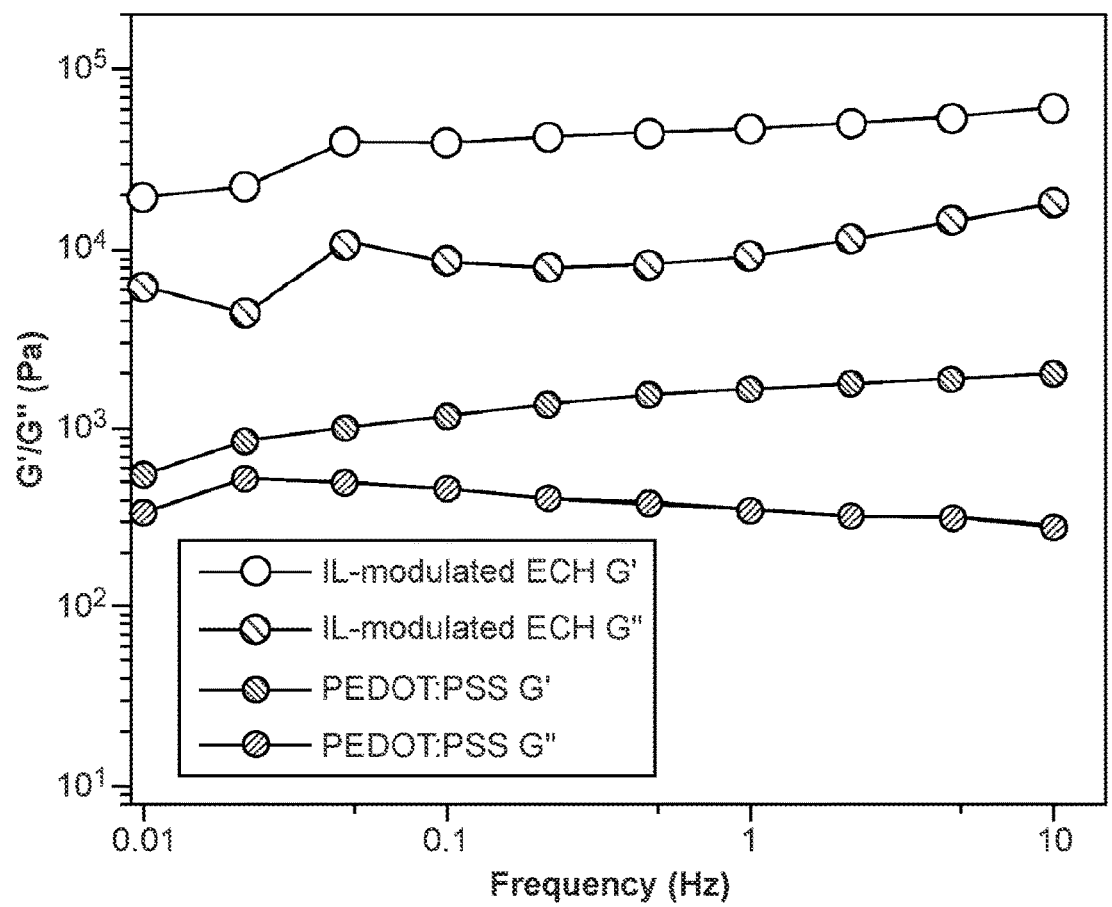
FIG. 11. Rheological characterization of MECH. Storage modulus (G') and loss modulus (G") of MECH was higher than that of pristine PEDOT:PSS. Higher G'/G" in MECH indicates increased physical cross-linking density due to morphological modulation by IL.

Next, to understand the mechanism as to why MECH is able to maintain such high conductivity, characterization is made of both the compositional and morphological changes during the ion gel to hydrogel transition. First, X-ray photoelectron spectroscopy (XPS) measurement shows that the ratio between PEDOT and PSS increases from about 0.4 to about 0.78 after washing the ion gel with water (FIG. 1f, FIG. 8), which indicates that PSS may have been partially washed away, thus further improving the continuity of the interconnected PEDOT network. Second, scanning electron microscopy (SEM) image shows that after removal of IL, the dried MECH collapsed to about 1 μm by about 200 nm ellipse-shaped voids with slightly preferred in-plane alignment (FIG. 1b, ii). When rehydrated (FIG. 1b, iii), observation is made of a rapid anisotropic volume expansion in the out-of-plane direction of ECH. Even though the interconnected PEDOT network was observed to swell and expand mostly out-of-plane, it is still able to maintain its PEDOT network for the charge transport. In addition, observation is made that the in-plane conductivity (measured in parallel with aligned direction) is >about 10× higher than the out-of-plane conductivity (measured perpendicular to alignment direction, shown in FIG. 9. On the contrary, without IL modification, the dried PEDOT:PSS film has a thick-layered structure containing larger gaps (>about 30 μm) between each layer (FIG. 10), thus impeding the preferred three-dimensional (3D) interconnected polymer structure. Finally, the increased storage modulus results from the IL modified MECH further indicates an increased physical cross-linking density comparing with the normal PEDOT:PSS film (FIG. 11). Taken together, the removal of insulating PSS, improved polymer network alignment and higher network cross-linking density collectively contributed to the high conductivity of the MECH.

Figure 12:
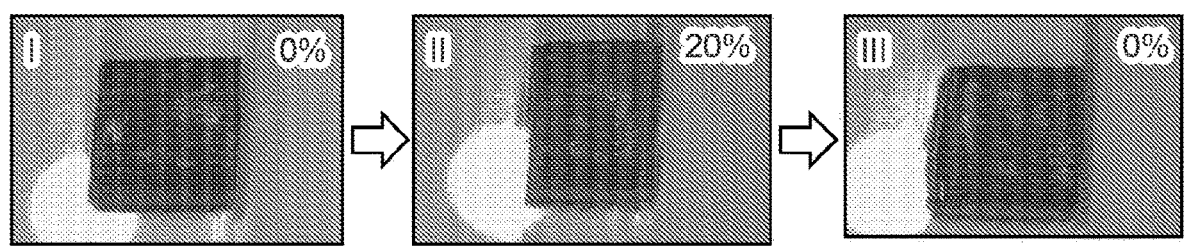
FIG. 12. Optical Image of compression of MECH at about 20% uniaxial strain. Bulk MECH sample was compressed by glass slide from unstretched (I) to about 20% compression (II). The MECH sample was then released to 0% strain (III).
Figure 13:
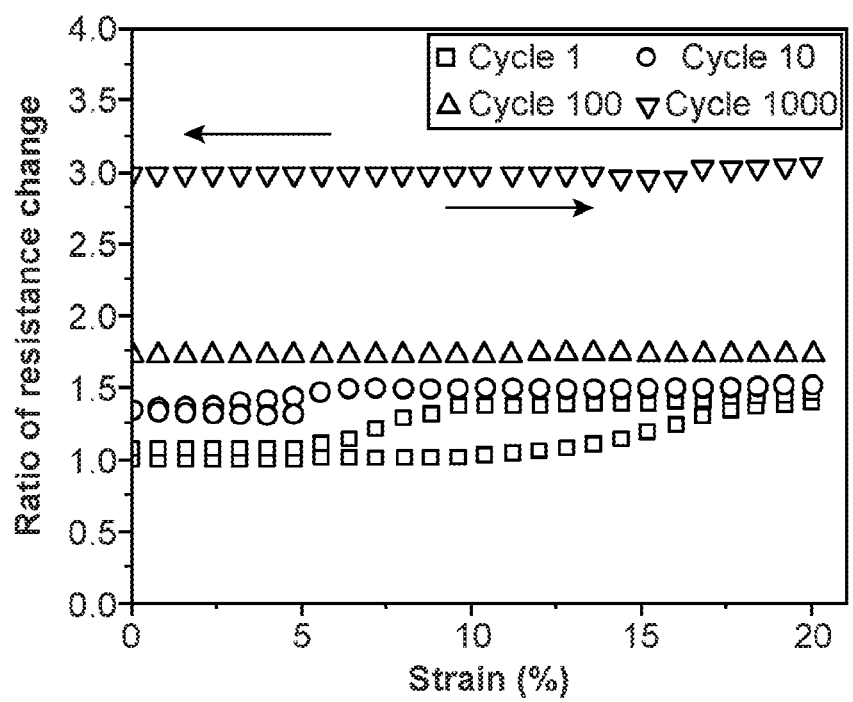
FIG. 13. Normalized resistance changes of thin film MECH under about 20% uniaxial strain for 1000 cycles. The result shows low hysteresis during the stretch cycles. Resistance of the MECH line was continuously measured during stretching with LRC meter.

Electrodes that have low interfacial impedance and high current density, along with small feature sizes, are desired for efficient and localized neuromodulation. Given the high electronic conductivity of the polymer network, both parameters in high porosity and large volume of electrolyte intake by a MECH electrode can lead to substantially low impedance. MECH thin film (about 200 nm) electrode are thus passivated by an elastic polymer and subsequently measured in a physiological media (Modified Eagle's medium; DMEM). At about 1 kHz, the MECH electrode shows about 3 orders of magnitude lower impedance as compared to a PEDOT:PSS film with the same electrode area (FIG. 1f). In addition, the fabricated MECH electrode can sustain up to about 20% strain of stretch (FIG. 1g) and compression (FIG. 12). Specifically, under about 10% strain, observation is made that there is <about 20% and about 3.6% impedance increase for MECH thin-film measured at about 1 kHz and about 1 Hz, respectively (FIG. 1g). Furthermore, the surface plot of impedance shows a relatively stable impedance from about 1 Hz to about 1 MHz under about 20% uniaxial stretching (FIG. 1h). Next, a repeated stretched and released experiment is performed on the MECH electrode for 1000 cycles, and observation is made of a desirable low hysteresis in conductance (FIG. 13).

Figure 14:
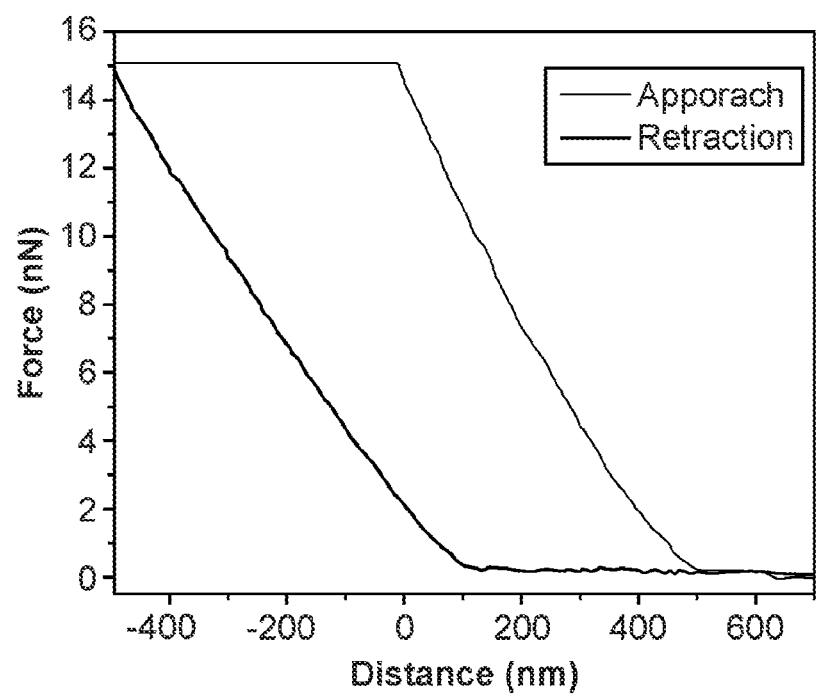
FIG. 14. Atomic force microscopy (AFM) nanoindentation on substantially fully hydrated MECH that was submerged in DI water. Young's modulus of about 24 kPa was calculated based on AFM nanoindentation data.
Figure 16A:
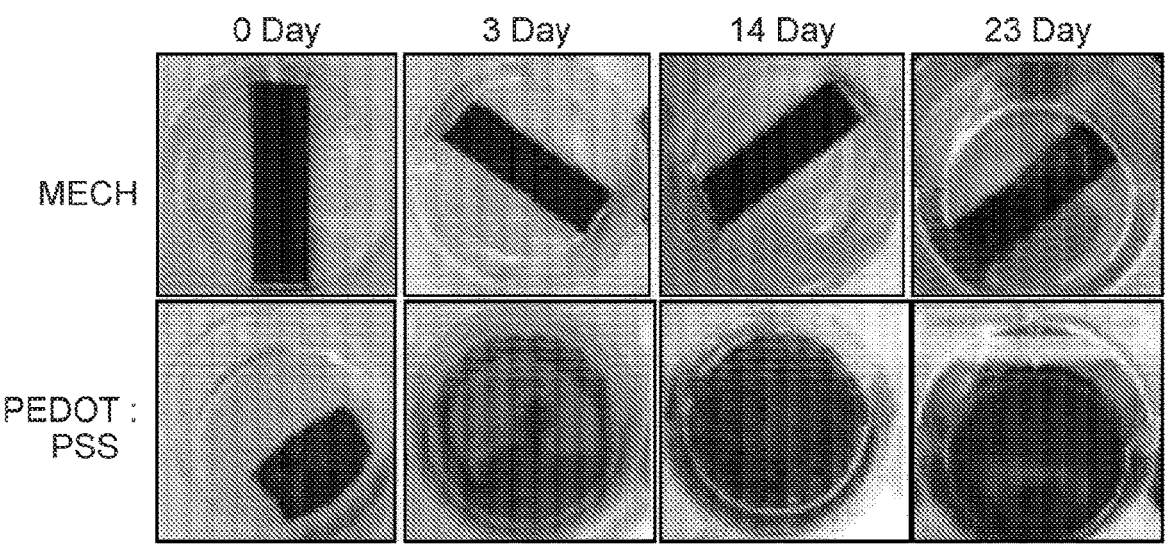
FIGS. 16A-16B are directed to aqueous stability of MECH and pristine PEDOT:PSS film. Photography (FIG. 16A) and dry mass (FIG. 16B) of the MECH and pristine PEDOT:PSS incubated in de-ionized (DI) water. Dry mass of the PEDOT:PSS decrease rapidly due to disintegration in DI water, while the MECH retains more than about 90% of dry mass for at least about 21 days.
Figure 16B:
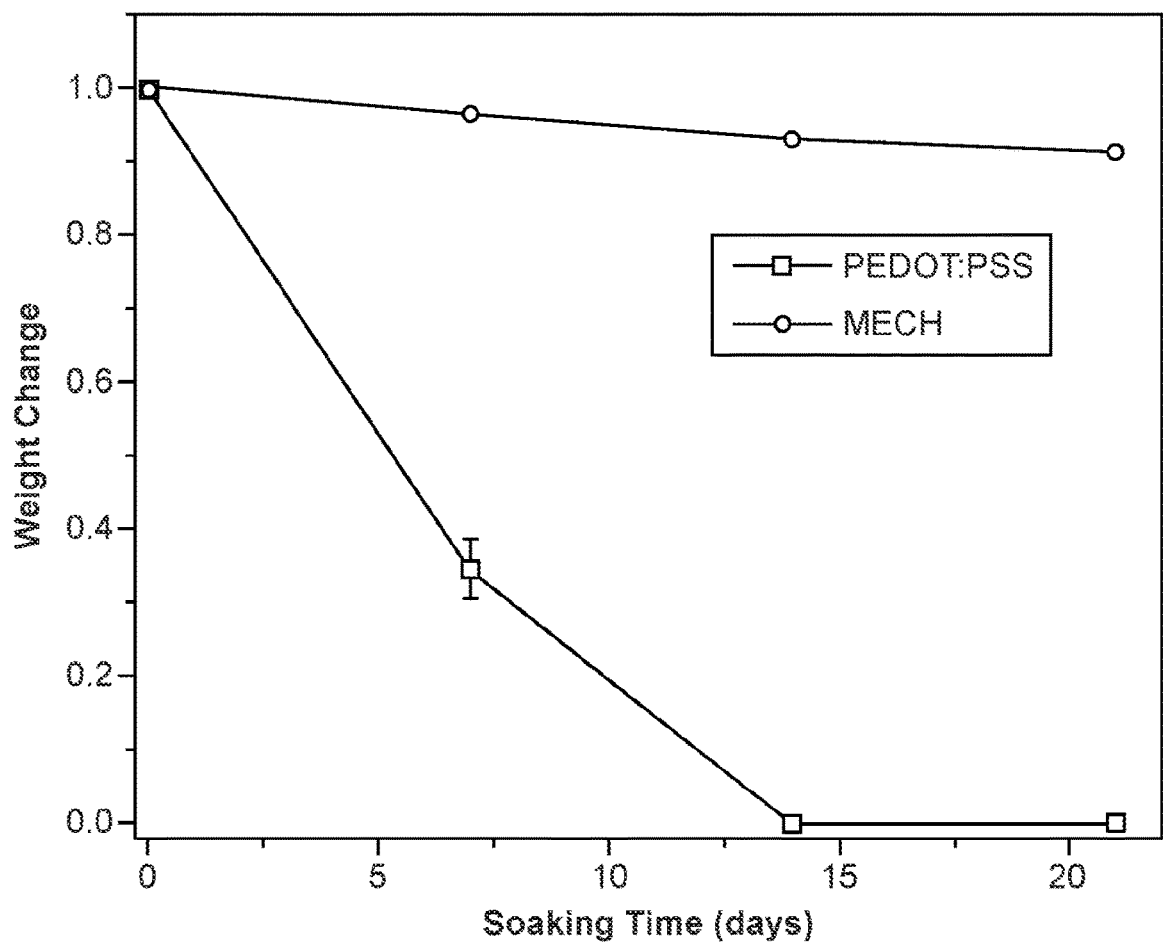
Figure 17A:
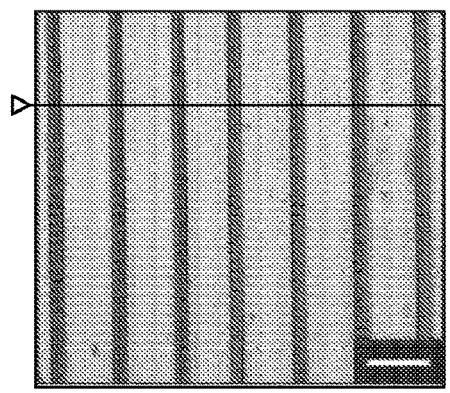
FIGS. 17A-17C are directed to a microscopic image of patterned MECH microwires.
Figure 17C:
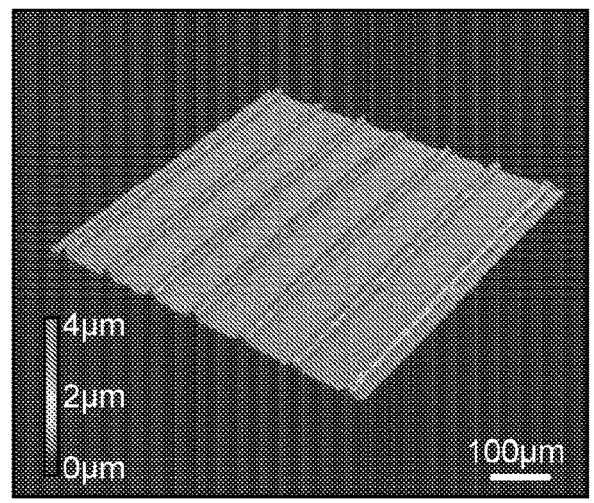
Figure 17B:
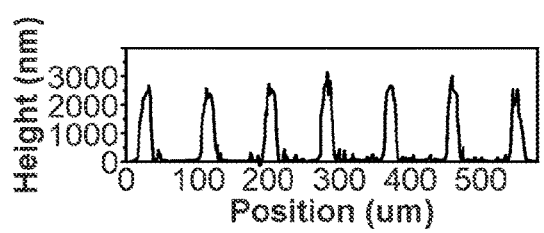
Figure 18A:
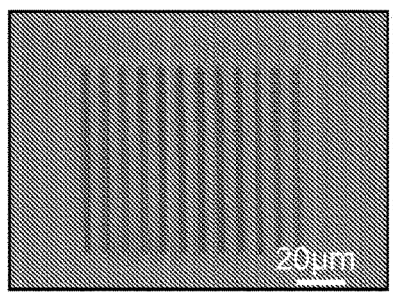
FIGS. 18A-18F are directed to SEM imaging of MECH with various patterns: less complex patterns include straight lines (FIG. 18A) and wavy lines (FIG. 18B), and complex patterns include "tree" (FIG. 18C) and "Stanford Logo" (FIG. 18E) and their zoomed-in images (FIG. 18D) and (FIG. 18F), respectively.
Figure 18C:
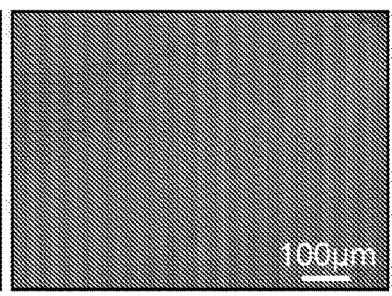
Figure 18E:
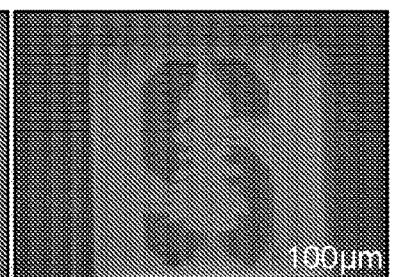
Figure 18B:
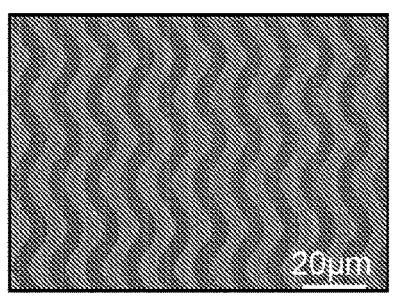
Figure 18D:
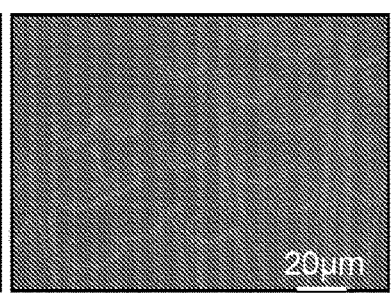
Figure 18F:
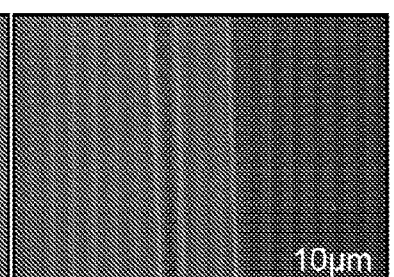

Highly Aqueous Stable and Lithographically Micro-Patternable Hydrogel:

Usually, conductive polymer devices are constrained by their instability in aqueous solution, hence impeding the realization of microscale hydrogel thin-film electronics for electrophysiological applications. MECH exhibited a tissue level Young's modulus of about 24 kPa (FIG. 14) and showed excellent stability in aqueous media. The weight loss of MECH after being soaked in water for about 21 days was <about 10%; whereas a pristine PEDOT:PSS film was observed to be completely disintegrated in about 14 days (FIG. 16). Next, quantification is made of the stability of a MECH thin film (about 1.4 μm) in water using UV-vis spectroscopy by monitoring the absorbance change at about 800 nm, namely π-π transition in the PEDOT polymer chain. Notably, after about 48 hrs soaking in water, MECH film showed just a slight decrease in UV-vis absorption intensity. On the contrary, the same absorption peak at about 800 nm has completely disappeared for the pristine PEDOT:PSS thin film (FIG. 2a) after about 6 hrs soaking in water. The significantly improved aqueous stability for the MECH film may be due to a higher cross-link density of the polymer network in the MECH film, as compared to the PEDOT:PSS film.

Figure 15:
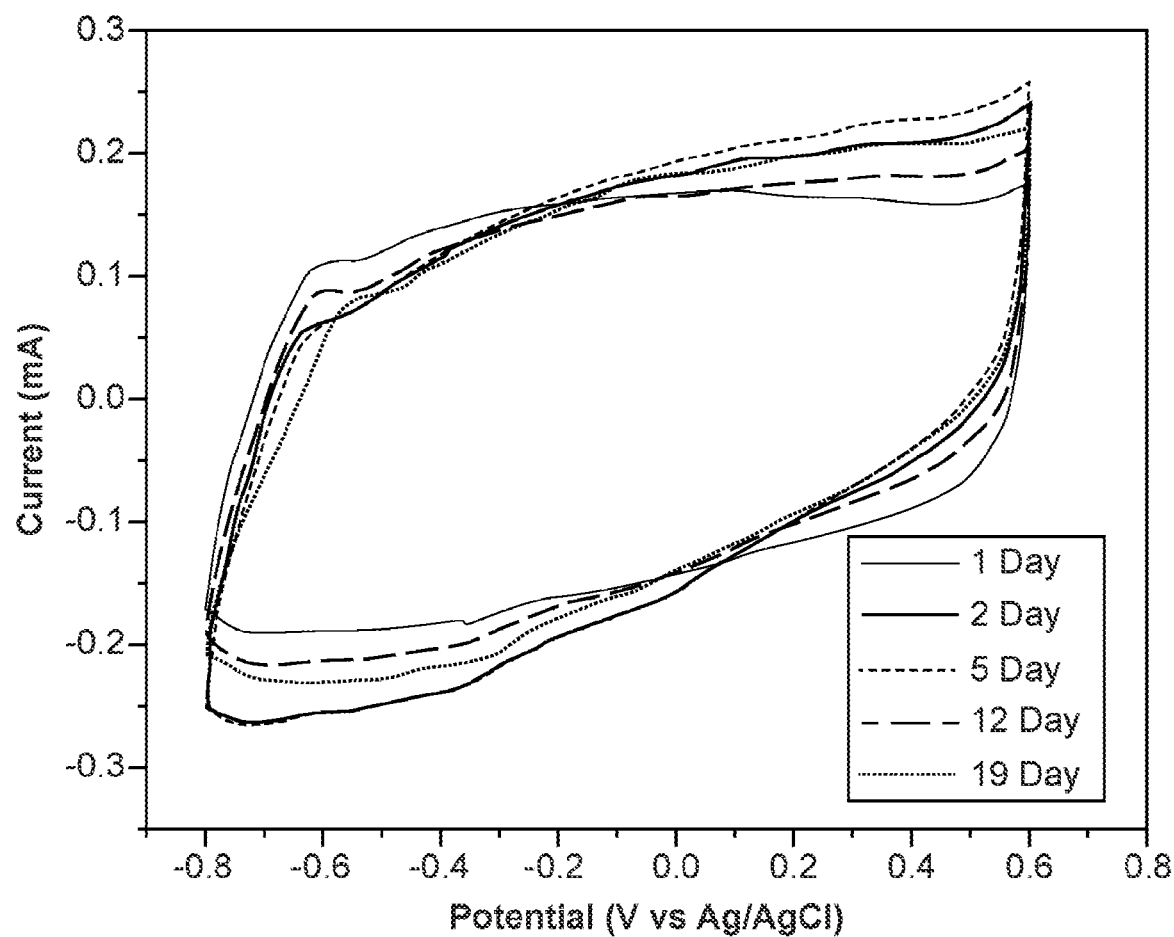
FIG. 15. Cyclic voltammetry (CV) of MECH in PBS for about 19 days. The result shows stable current injection capability over the entire incubation period.

High charge storage capability (CSC) and long-term stability in physiological condition are both desired parameters to allow long-term neuromodulation. Thus, further investigation is made of the electrochemical stabilities of MECH by soaking the thin-film device in phosphate-buffered saline (PBS) over about 19 days. The current, as observed via cyclic voltammetry (CV), maintained a substantially constant value over the entire incubation period (FIG. 15). Furthermore, it showed a capacitive charge-injection behavior that indicated less interference towards biochemical environment at the neural electrical stimulation sites. Specifically, the MECH showed a CSC of about 164 mC/cm$^2$, a value that is substantially higher than those of electrochemically deposited PEDOT:PSS (about 75.6 mC/cm$^2$), Pt (about 0.55 mC/cm$^2$) and IrO$_x$ (about 28.8 mC/cm$^2$). Furthermore, the MECH is able to maintain its high CSC value over about 19-day incubation with less than about 4.3% change (FIG. 2b). In addition, a surface plot of long-term impedance analysis indicated its excellent electrochemical stability (FIGS. 2c, 2d), with about 8.5% (at about 1 Hz, FIG. 2e) and about 22% (at about 1 kHz, FIG. 2f) change in impedance for the thin-film MECH electrode in PBS after about 19-day incubation. These observed values are all significantly smaller comparing to that of other conductive polymers such as polyaniline.

Patterning continuous hydrogel electrodes over centimeter length scale at sub-100-μm resolution is a challenging feat. Comparative methods employ nozzle-based inkjet printing to pattern a hydrogel. However, evaporation of the dispensed droplet creates rough surfaces and discontinuity in the resulting patterned lines, hence constraining the patterning spatial resolution to be >about 100 μm. As this dimension is larger than the size of most mammalian neurons, this severely constrains localized electrical stimulation potentially at a single cell level. Although the combination of both photolithography and dry etching can be an efficient method to achieve micrometer resolution patterning of soft materials, there are challenges towards its application for a hydrogel because of the hydrogel's highly porous structure and significant water interference. To address the above-mentioned challenges, a strategy is devised, in which the non-porous ion gel was first patterned and subsequently converted into ECH by water exchange. As such, patterning of virtually any kind of desired geometries can be made (FIG. 2g, FIG. 18) Using photolithography, successful patterning is made of complex MECH geometries in which both straight and curved lines can be resolved with resolution <about 5 μm (FIG. 2h). Further confirmation is made of the smooth surface of the micro-patterned features via SEM images as shown in FIG. 2i.

Figure 3A:
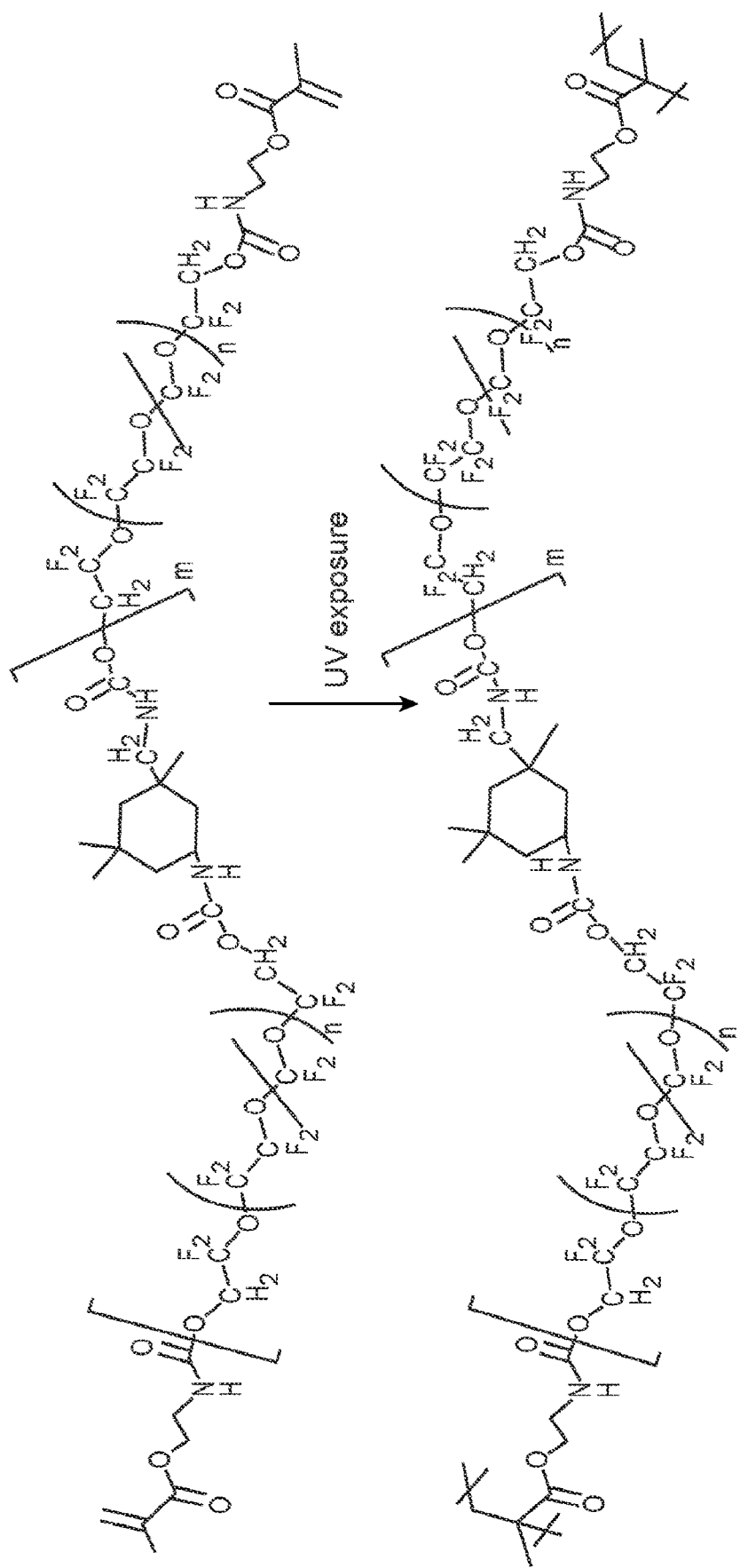
Figure 19:
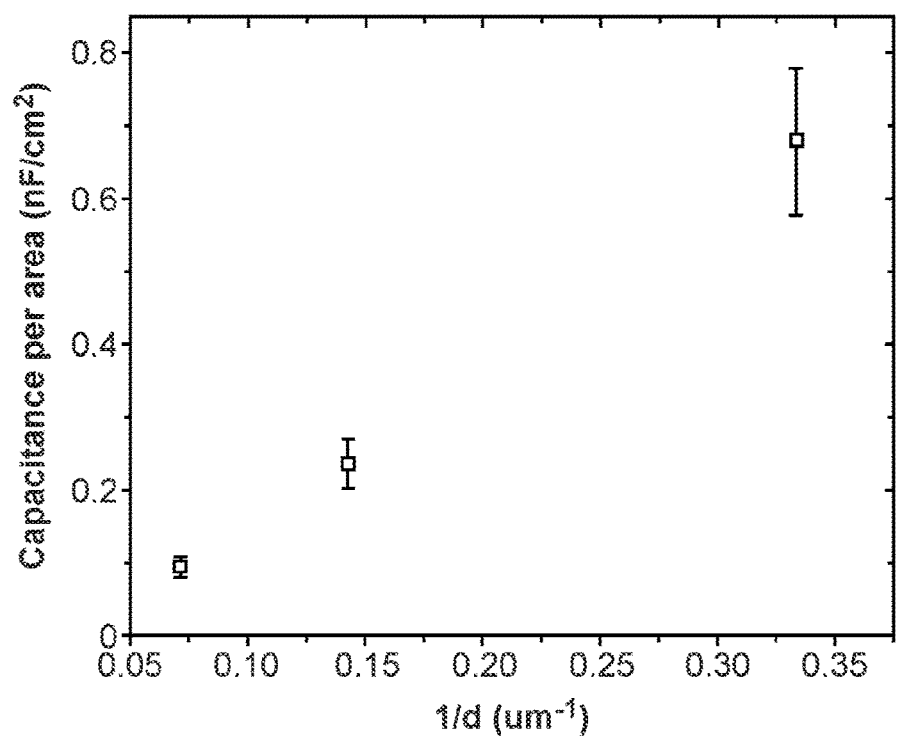
FIG. 19. Dielectric Constant of PFPE-DMA was calculated by the slope of capacitance per area vs. electrode separation distance at about 1 kHz.

MECH Electrode and Biocompatibility:

The assembly of MECH into functional and hydrogel elastronics is performed using photo-patternable elastomers to serve as both a stretchable substrate and a passivation layer. However, it is observed that the porous structures of various elastomers are readily swelled upon adding IL, as well as various other organic solvents used in photolithography. Elastic photoresist that is compatible with photolithographic process for stretchable electronics remains desired. Here, use is made of a fluorinated photoresist as derived from perfluoropolyether. This photoresist is observed to be elastic, highly stretchable, chemically orthogonal to most common solvents and, more importantly, compatible with photolithographic process. The chosen perfluoropolyether dimethacrylate (PFPE-DMA) was first prepared. Specifically, its DMA groups can subsequently be UV-cross-linked as initiated by photoinitiators to cross-link the liquid-like PFPE-DMA precursors into an elastomer (FIG. 3a). It is found that a corresponding increase in the molecular weight of PFPE-DMA can be achieved by adjusting the cross-linking density in the cross-linked elastomer. It will thus increase its stretchability, while maintaining its strong solvent resistance. To reduce the mechanical mismatch between soft tissue and MECH electrodes, careful tuning of the Young's modulus of cross-linked PFPE-DMA is performed to be <about 30 kPa (FIG. 3b) by using about 12 kg/mol PFPE-DMA monomer. Consequently, the cross-linked elastomer can be stretched up to about 200% without incurring any breaks (FIG. 3b). In addition, cross-linked PFPE-DMA film showed a low dielectric constant at 2.4±0.1 in micrometer-thick film (FIG. 19). Next, impedance spectrum was used to measure the passivation efficiency of PFPE-DMA under the different applied strains, and also under alternating current (AC) bias at physiological relevant voltages and frequencies. No significant changes in impedance are observed for the fabricated freestanding hydrogel elastronics at about 20% strain (FIG. 3b). Since the MECH and PFPE-DMA were tuned to have similar Young's modulus at about 20 kPa, optical images showed no wrinkles or cracks in the MECH and PFPE-DMA films even after applying about 20% strain to the freestanding device (FIG. 3c inset).

Figures 20A, 20C, 20E:
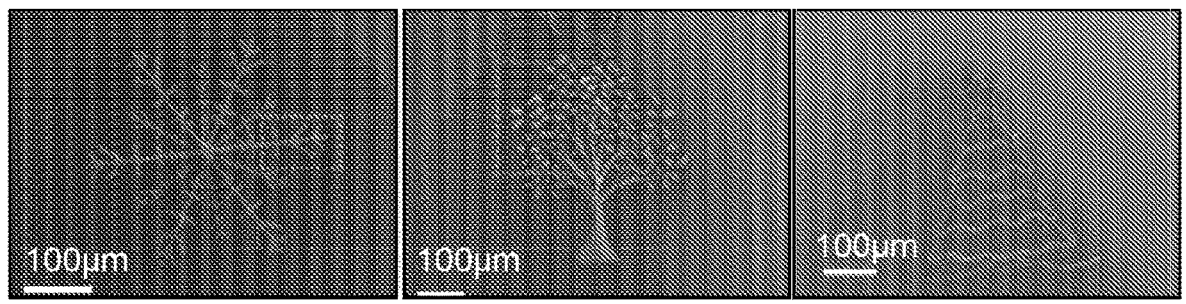
FIGS. 20A-20F are directed to SEM imaging of lithographically patterned PFPE-DMA.
Figures 20B, 20D, 20F:
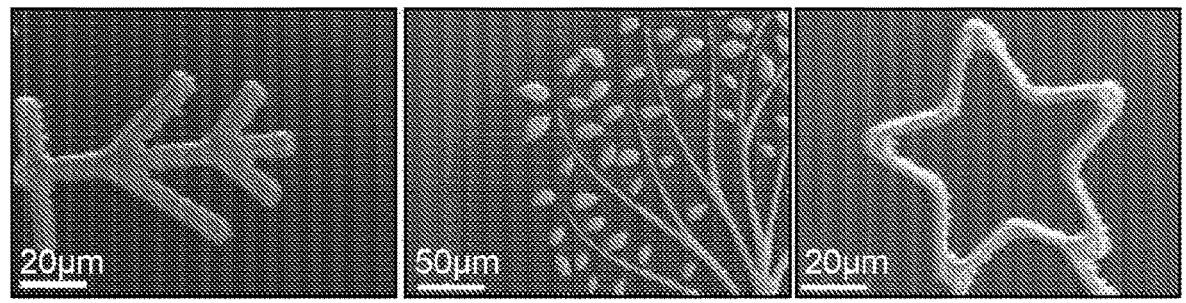

By using photolithography tools, attempt is made to pattern PFPE-DMA with feature sizes down to about 5 μm and thickness ranging from about 1 μm to about 20 μm. As shown in FIG. 3d-i-ii, microscale lines and dot array can readily be lithographically patterned with sharp edges. With these initial results, demonstration is made of the patterning of a more complex geometry, such as a microscale "world map" (FIG. 3d-iii, FIG. 20). The structure of the unexposed narrow curve, namely the "border" in the "world map" as shown in FIGS. 3d-iv & -v, which is especially challenging for a negative tone photoresist due to overexposure, can now be addressed down to about 1.5 μm resolution. In addition, the ability to pattern both narrow- and curved-line features was demonstrated in SEM image of a "giraffe" composed of PFPE-DMA. (FIG. 3e). It is observed that the patterned PFPE-DMA thin-film does not swell or become damaged by introduced chemicals in the photolithography process, as well as chemicals used to synthesize MECH. Hence, PFPE-DMA proves to be an excellent elastic substrate for lithographically patterned MECH. Furthermore, it is observed that the free standing MECH on PFPE-DMA film can be stretched when subjected to about 20% uniaxial strain (FIG. 3f).

Next, development is made of an entire lithography process to fabricate encapsulated MECH microelectrodes (FIG. 3g). First, a PFPE-DMA layer was spin-coated and photo-cured on top of a dextran sacrificial layer. Second, MECH precursor, PEDOT:PSS/IL ion gel was patterned onto the PFPE-DMA layer. Third, a second layer of PFPE-DMA photoresist was directly UV cross-linked into micropatterns on top of the ion gel, serving as a passivation layer. Finally, the device sheet was soaked into water for the IL to be lifted-off and subsequently removed.

Figure 21:
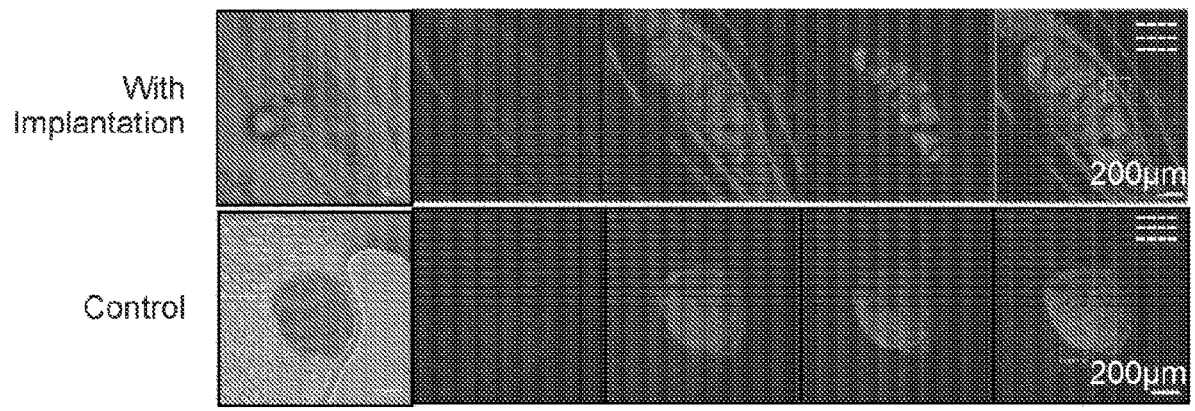
FIG. 21. Bright field and 3D reconstructed confocal micrographs of immunochemically labelled cross-section slice of sciatic nerve for both control and MECH/PFPE-DMA device implant. Blue: DAPI; Red: neurofilament NF; Green: astrocyte marker S-100. Zoomed-in image in white boxes of the merged immunofluorescence image (left) shown in FIG. 3h and FIG. 3i.

To evaluate the biocompatibility of the fabricated MECH microelectrodes, the freestanding thin-film device is implanted into mouse periphery nerve system (PNS) by wrapping the device around the sciatic nerve. (FIG. 3h) Using confocal microscopy to image the immunostained tissue slices after about 3-week implantation (FIG. 21), it is observed that there are no significant changes in both S-100 (marker for astrocyte) and Neurofilament fluorescence intensity at the implantation site (FIG. 3i) for both control and device-implanted mice (FIG. 3j). In addition, no S-100 marker was detected at the electrode-nerve interface. Statistical analysis further indicated that no statistically significant proliferation of immune cells occurs inside the nerve bundles (FIG. 3k). These results demonstrated that the implanted hydrogel elastronics did not induce damages or inflammatory responses on the neural tissues (under recurrent motion), hence indicating the excellent biocompatibility of hydrogel elastronics in the dynamic motion tissue region. This observation is attributed to the elastronic's excellent stretchability and low mechanical contrast to be highly compatible with the naturally occurring soft periphery nerves.

Figure 4A:
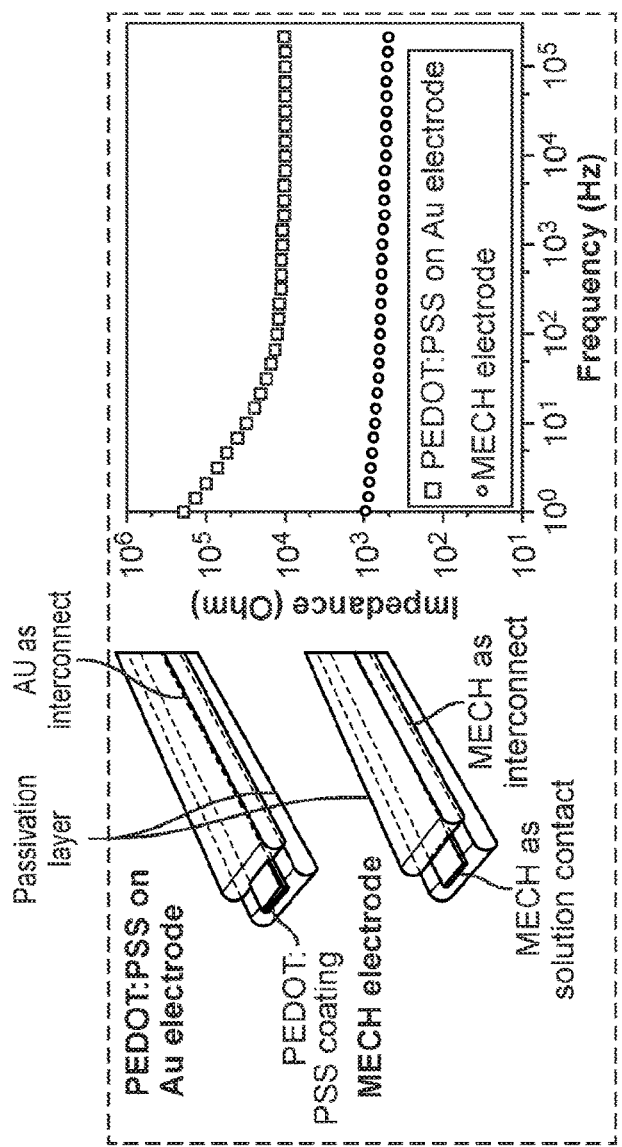

Ultra-Low Voltage Neural Stimulation:

The highly porous microstructure in MECH provides both excellent electrical/ionic dual conductivity and high volumetric capacitance in ionic solutions. Instead of coating dual conductor (e.g., conducting polymer and ECH) on surfaces of metal electrodes, it is proposed to utilize MECH as both solution contact electrode and interconnect. Again, by taking advantage of its porous structure, dual conductivity and high volumetric capacitance, it is observed that the interconnect parts were also able to contribute to the total solution contacting area after being filled with electrolyte, thus resulting in a further reduced impedance for the MECH microelectrodes. (FIG. 4a) The obtained impedance measurement data indicated that over one order of magnitude of impedance reduction was obtained by the fabrication approach, as compared to a gold (Au) electrode coated with dual conductive polymer (PEDOT:PSS/GOPS) with the same electrode area.

Figure 4B:
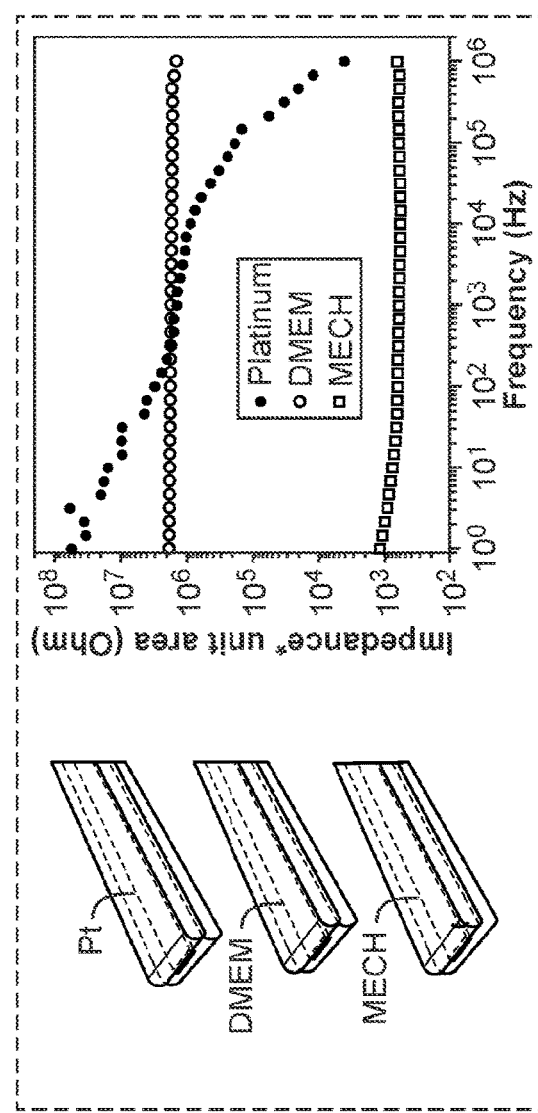
Figure 4C:
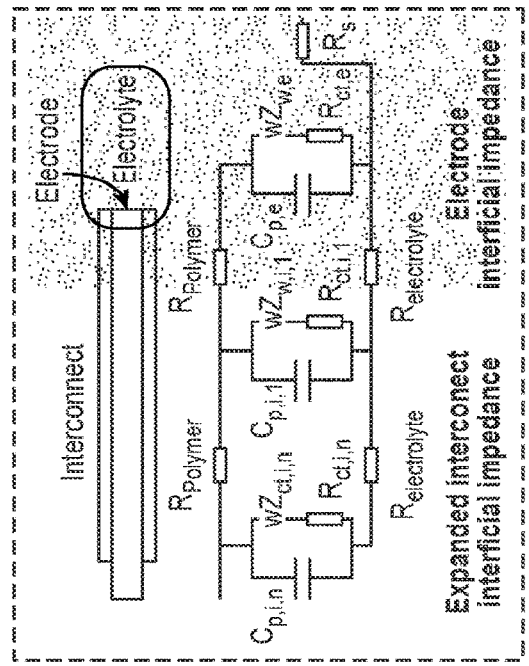
Figure 22:
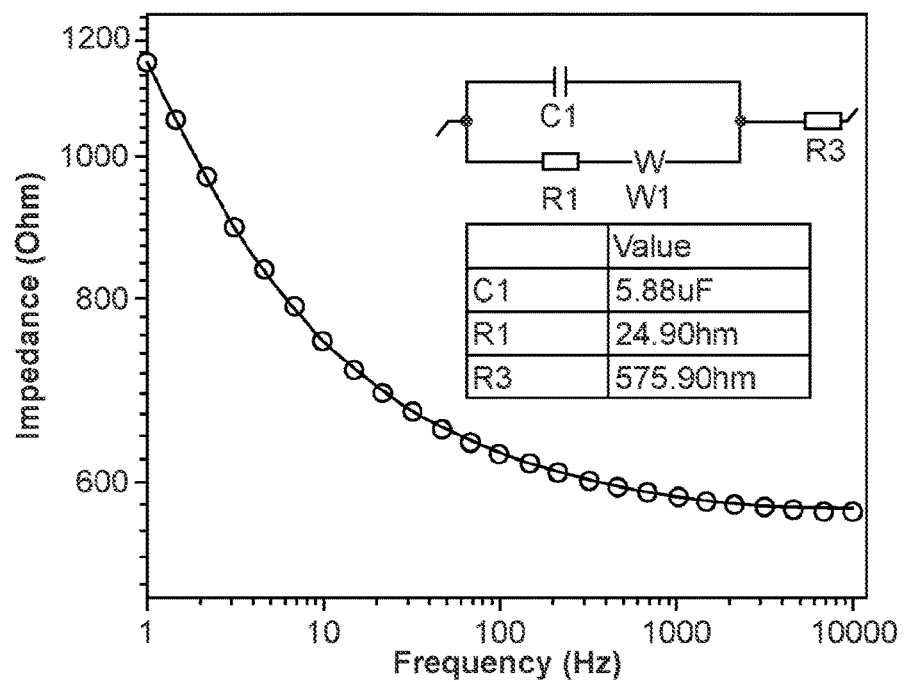
FIG. 22. Impedance spectrum and estimation of volumetric capacitance. Bode Plot (circle) shows impedance versus frequency for MECH electrode with electrode area of about 0.0006 cm². The line was fit with equivalent circuit of (R1+W1)//C1+R3. Inset: the equivalent circuit and the estimated value of its components. The high capacitance per area of about 9800 µF/cm² was calculated by dividing C1 with electrode area.
Figure 23:
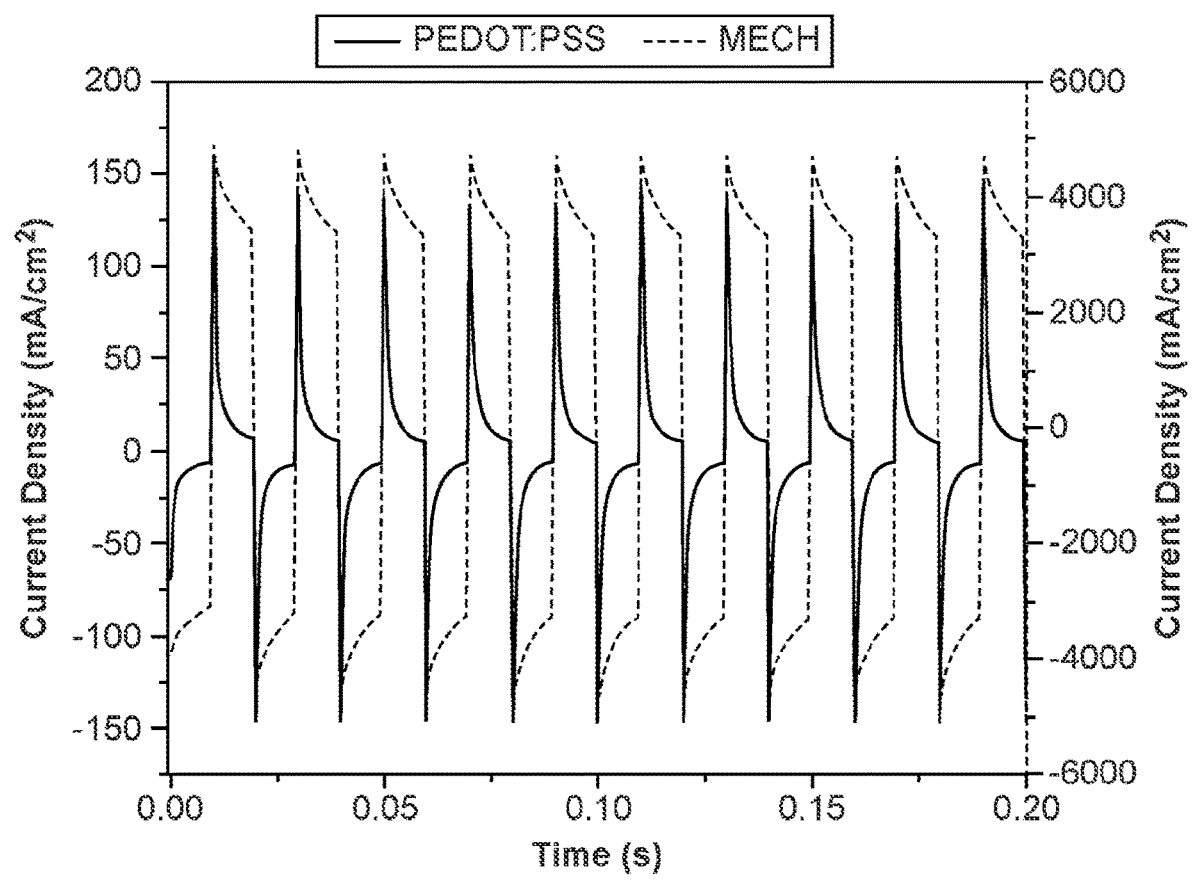
FIG. 23. Current density of MECH and pristine PEDOT:PSS under ±1.25 V biphasic rectangular pulse (about 50 Hz). The current density of MECH was about one order of magnitude higher than that of pristine PEDOT:PSS.

To further investigate the contribution of impedance reduction from the fabricated MECH interconnect, reduction is made of the electrode area by removing the solution-contact electrode to selectively expose the cross-sectional area for solution contact. Consequently, comparison is made of the impedance results from (i) a pure ionic conductor —Dulbecco's Modified Eagle's medium (DMEM), (ii) a pure electronic conductor platinum, and (iii) dual conductive MECH electrodes. Normalized to the same electrode area, it is observed that the MECH electrode showed about 3 orders of magnitude lower impedance when compared to the impedance measured from the other two electrodes (FIG. 4b). Calculation is made of a capacitance density at about 9800 $\mu F/cm^2$ (FIG. 22) for the MECH electrode, which is again higher than that of PEDOT:PSS (about 2200 $\mu F/cm^2$). In addition, the MECH electrode showed a current density of about 3857 $mA/cm^2$ under bipolar pulsed voltage of about 1.25 V at about 50 Hz (FIG. 4c). This observed value is: (i) about two to three orders of magnitude higher than that from electrodes made by DMEM (about 1 $mA/cm^2$) and platinum (about 14 $mA/cm^2$), and (ii) about one order of magnitude higher than PEDOT:PSS (about 150 $mA/cm^2$, FIG. 23) and polyaniline (about 80 $mA/cm^2$). Furthermore, the electronic/ionic dual conductive MECH shows a current waveform combining capacitive fast peak (property of electronic conductor) and rectangular waveform (property of ionic conductor).

Figure 4D:
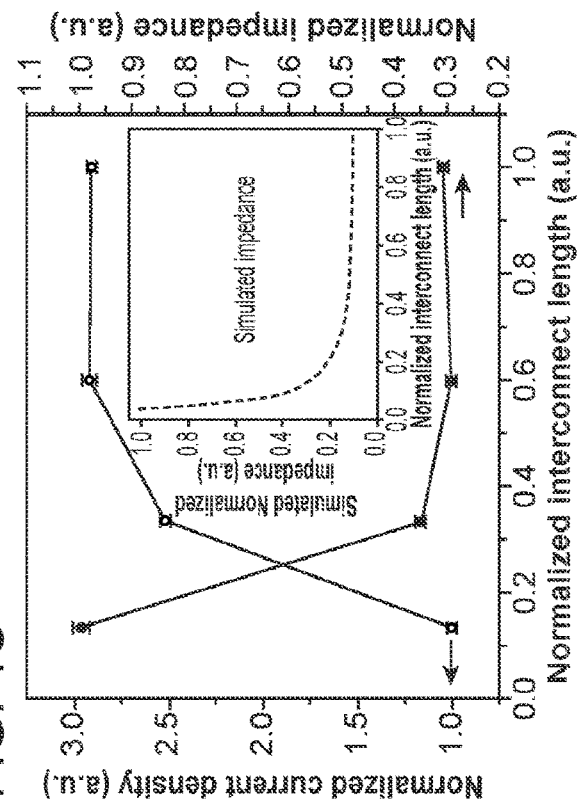
Figure 4E:
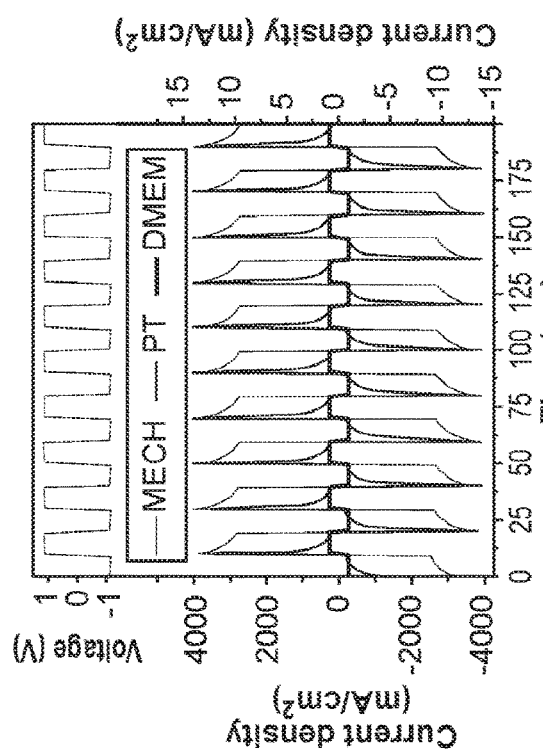
Figure 24A:
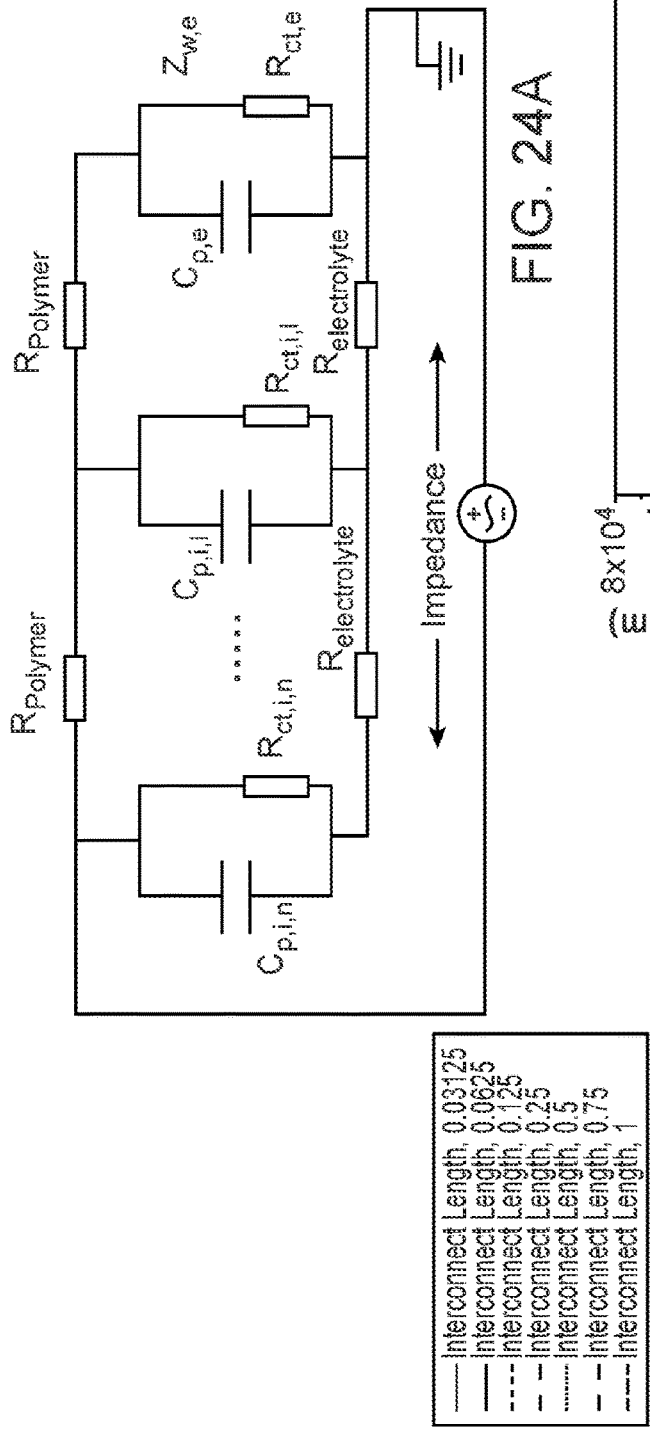
FIGS. 24A-24C are directed to simulated electrochemical impedance of interconnect of MECH electrode based on transmission line model. The impedance of the electrode was simulated with respect to different interconnect lengths.
Figure 24C:
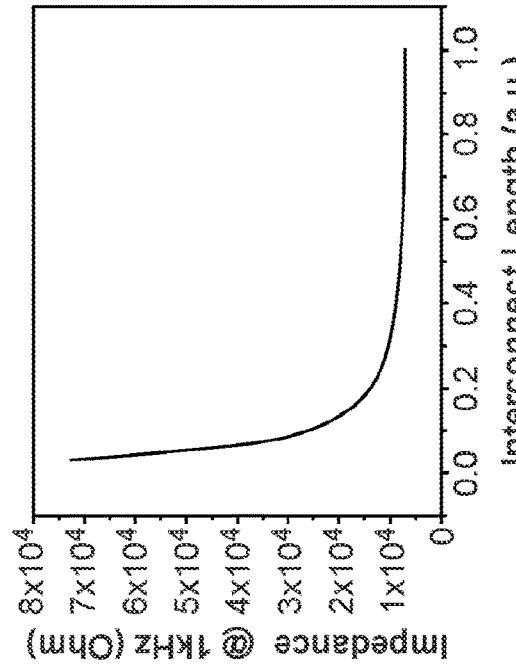
Figure 24B:
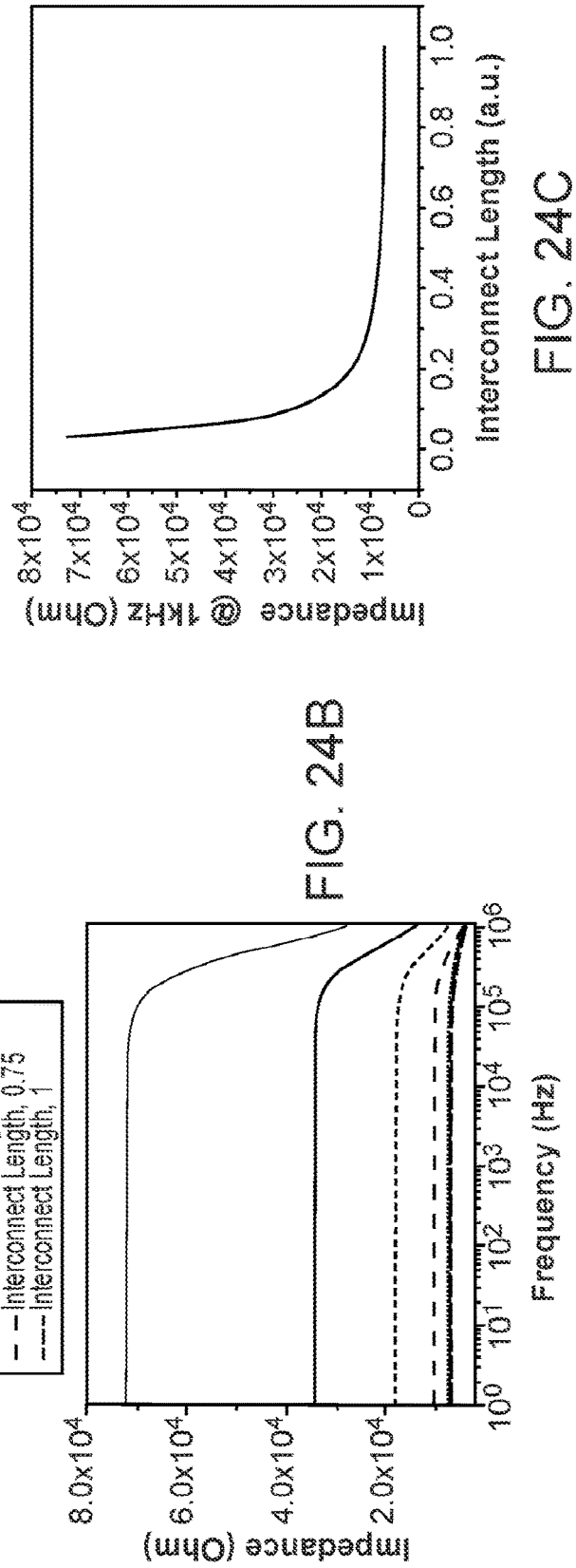

In either a pure electronic or ionic conductor, increasing the interconnect length with fixed cross section area typically leads to a correspondence increase in the interconnect resistance and, thus, the overall impedance. However, an unusual feature of MECH is that adding interconnect length both increases the number of resistors ($N_{R,polymer}$) in the equivalent circuits (which led to an increased electronic resistance) and increases the parallel interconnect Randel circuit (n), which significantly increases the solution contact area at interconnect region, in addition to the tip region of the microelectrode (FIG. 4d). Collectively, this approach is able to further reduce the interfacial impedance. In addition, the expanded PSS microstructures (from swelling due to being soaked in water) are able to also facilitate the ion transport, further reducing the resistance from the electrolyte $R_{electrolyte}$ in the equivalent circuit. Next, due to the high electronic conductivity of MECH, it is hypothesized that the impedance reduction resulting from expanded interconnect interfacial area should surpass the effect from increase of $N_{R,polymer}$. Hence, to investigate the relationship between interconnect length and expanded interconnect interfacial impedance, measurement is made of both impedance and current density by varying the length of the hydrogel interconnects, while maintaining substantially constant values for both width and thickness of the hydrogel. It is observed that the impedance decreased about 3.4× as the interconnect length increased about 4.5×; along with the current density increasing about 2.9× due to the decreased impedance. These observed values are in agreement with the hypothesis (FIG. 4e). Next, simulation experiment is performed to derive impedance values based on transmission line model, as shown in FIG. 4d. The obtained simulation results again showed a similar trend with the experimental data, in which the impedance decreases as the interconnect distance increase (FIGS. 4e, 4e-inset; FIG. 24). Thus, the parameter in interconnect geometry can be optimized to further modulate both the impedance and current density. This understanding can bring forth a design parameter, namely interconnect geometry, into electrode design rules, in addition to both electrode material properties and electrode surface area.

Figure 25:
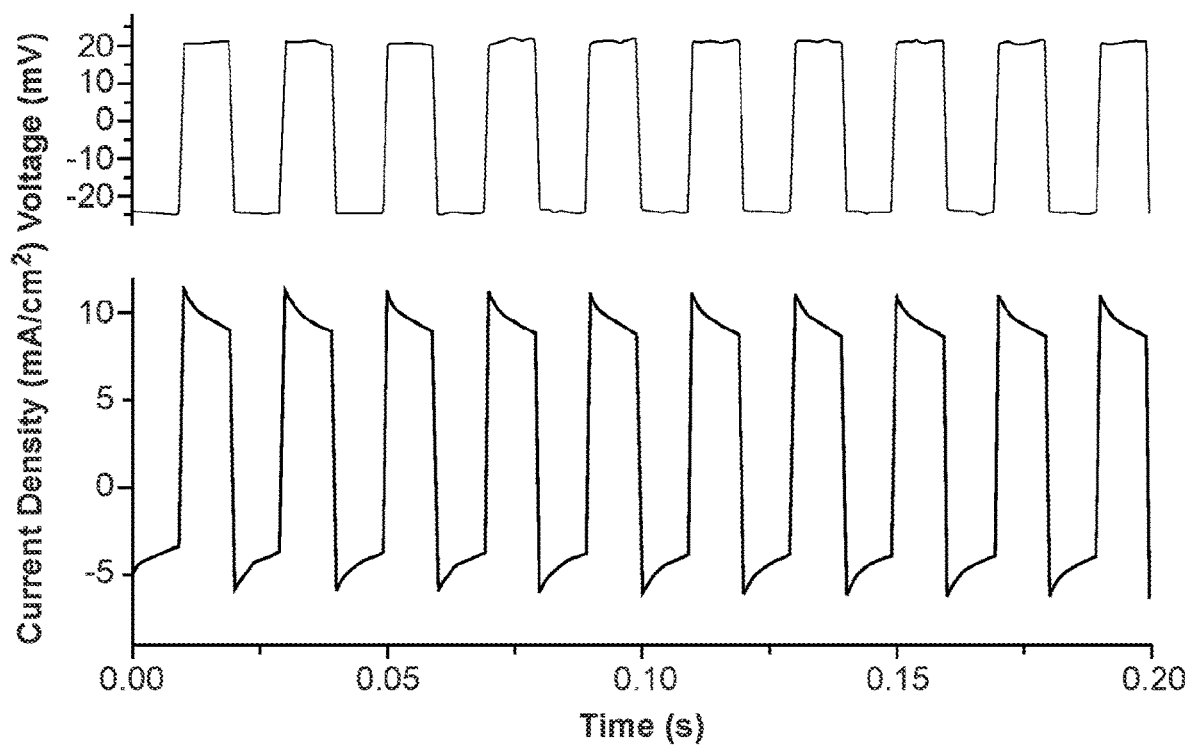
FIG. 25. High current density of about 10 mA/cm² was achieved with stimulation voltage as low as ±25 mV by using MECH as both interconnect and electrode.
Figure 26A:
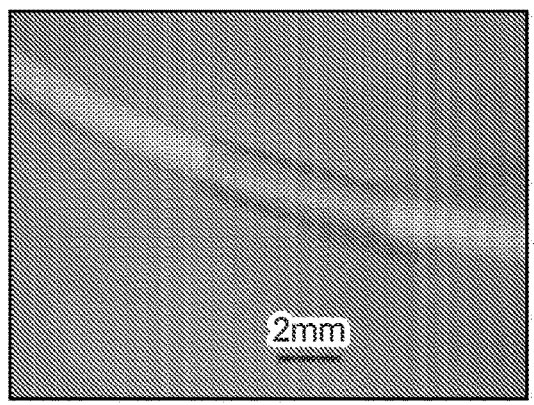
FIG. 26A is directed to an optical microscope image of MECH/PFPE-DMA microelectrodes wrapping around a wire-like object.
Figure 26B:
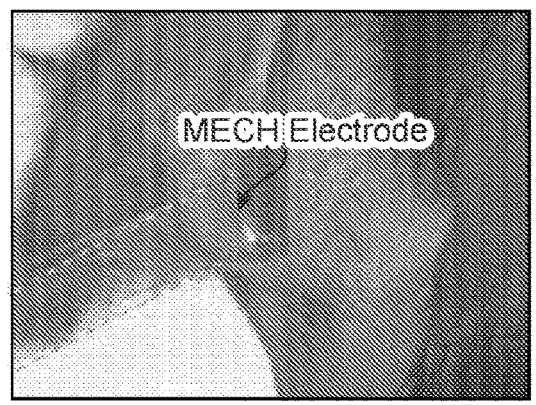
FIG. 26B shows implantation of tissue-level soft MECH/PFPE-DMA electrodes by wrapping around sciatic nerve.

Employing the revised hydrogel electrode design rules, an excitation current density of about 10 $mA/cm^2$ at a low voltage of about 50 mV is delivered (FIG. 25) for the neuromodulation. Placement is made of the MECH electrodes in direct contact to the exposed sciatic nerve of anesthetized mouse, and measurement is made of the leg and finger responses upon electrical stimulation in vivo (FIG. 4f, FIG. 26). It is noted that the MECH electrodes were able to conformally wrap themselves around the sciatic nerve (FIG.

4g) to provide intimate contacts (FIG. 4h). As a result, further reduction of tissue-electrode impedance is achieved, and thus improving on the electrical stimulation efficiency. Passivated MECH microelectrode (FIG. 4i) can provide localized stimulation on the subgroup of peripheral neurons in the nerve bundle to control individual figure movement, along with a successful rate response as varied by the stimulation frequency (FIG. 4j). Beyond the applied about 50 Hz stimulation frequency, observation is made of an one-time leg movement instead of continuous finger movement. To compare the MECH electrode with a platinum electrode, stimulation is made of the sciatic nerve at about 100 Hz with different voltages. The obtained results showed a stimulated leg response at ultra-low voltage of about 50 mV without removing the epineurium layer (FIG. 4k). On the contrary, the platinum electrode (with the same dimension) specified at least about 500 mV to achieve same stimulation results. Furthermore, the range in leg movement as induced by conductive hydrogel is also significantly higher than that of platinum electrode (again with the same electrode area) from about 50 mV to about 1 V. Notably, the hydrogel electrode, after being soaked in PBS for about 2 months, can elicit an even larger leg response, thus validating the long-term electrochemical stability of the MECH electrode and indicating that continuous swelling of the porous MECH network in aqueous solution had resulted in further lowering of the impedance values. (FIG. 4l)

Conclusion and Outlook:

This example sets forth the successful fabrication of lithographically patterned chemical orthogonal fluorinated elastomer and stretchable MECH into a microelectrode with a size of about 20 μm. The hydrogel elastronics shows tissue-level softness, excellent biocompatibility, long-term electrochemical stability in aqueous solution as well as low impedance and ultra-high current density. Next, demonstration is made that the hydrogel elastronic microelectrodes possess unusual electrochemical properties, and allow electrical stimulation on peripheral nerve via a low voltage of about 50 mV in vivo. As a tool to interrogate a neurosystem, the developed hydrogel elastronic device mimics biochemical and mechanical properties of biological tissue to provide seamless neural interface. MECH electronics can be applied to implantable neuro-modulation devices, such as deep brain stimulator and vagus nerve stimulator. Furthermore, additional desirable electronic functionalities, such as electrophysiological recording, pressure sensing and biomolecular detection, can now be integrated into the hydrogel elastronics, providing the next generation of high-performance tissue-like electronics.

Materials and Methods

1. Material Preparation
1.1 Preparation of PEDOT:PSS ECH

PEDOT:PSS (PH1000) and ionic liquid (IL, 4-(3-Butyl-1-imidazolio)-1-butanesulfonic acid triflate) were purchased from Clevios and Santa Cruz Biotechnology, respectively. About 50 wt. % of IL was added to PEDOT:PSS aqueous solution and stirred vigorously for about 20 min. The PEDOT:PSS/IL aqueous mixture was filtered by an about 0.45 μm filter. For thin film preparation, filtered PEDOT:PSS/IL was spin-coated on $SiO_2$, perfluoropolyether (PFPE) or polydimethylsiloxane (PDMS) substrate at a speed of about 2000 rpm for about 1 min, and followed by annealing at about 130° C. for about 30 min. The substrates were oxygen plasma (Technics Micro-RIE Series 800) treated at about 150 W for about 1 min prior to spin-coating. The bulk film was obtained by drying the mixture overnight in Teflon mold and baking at about 130° C. for about 30 min. In the IL-water exchange, the film was soaked in copious amount of ultra-pure water (Millipore water purification system) for over about 24 hrs. Ultra-pure water was exchanged every about 8 hrs. The obtained micro-patternable electrically conductive hydrogel (MECH) film can be dehydrated at about 130° C. for about 30 min or rehydrated by soaking in water multiple cycles. The control sample pristine PEDOT:PSS was prepared with same method described above except without addition of IL. Control sample, silane (3-glycidoxypropyltrimethoxysilane (GOPS)) cross-linked PEDOT:PSS was prepared by mixing about 1% GOPS in PH1000 solution and drop casting or spin-coating at about 2000 rpm 1.2 Synthesis of PFPE-DMA Scheme 1 shows the scheme of synthesis of about 12 kg/mol dimethacrylate-functionalized perfluoropolyether monomer (PFPE-DMA). Briefly, about 4 kg/mol PFPE diols was first dissolved in 1,1,1,3,3-pentafluorobutane and reacted at room temperature with isophorone diisocyanate (IPDI) with about 3:2 molar ratio to yield the chain extended PFPE diols. Then, the product was reacted with 2-isocyanatoethyl methacrylate (IEM) with about 3:2 molar ratio (about 4 kg/mol PFPE diols:IEM) at room temperature for about 24 hrs. In both reactions, about 0.1 wt. % tetrabutyltin diacetate (DBTDA) was used as the catalyst. The final product was filtered through an about 0.2 μm filter to yield clear and colorless oil. The solvent was removed by rotoevaporation.

2. Device Fabrication

About 5% dextran (Sigma-Aldrich #09184) aqueous solution was spin-coated on a silicon wafer as a sacrificial layer. Polydimethylsiloxane (PDMS) was applied to the substrate at speed of about 1000 rpm for about 1 min, and followed by annealing at about 130° C. for about 30 min. The substrates were oxygen plasma (Technics Micro-RIE Series 800) treated at about 150 W for about 1 min to prior spin-coating. PFPE-DMA (about 8-12 kDa), dissolved in 1,3-bis(trifluoromethyl)benzene (99%, 251186 Aldrich) solution was spin-coated on the PDMS at about 1500 rpm for about 1 min in a $N_2$ glovebox (mBRAUN Glove Box System). PFPE-DMA layer was UV cured for about 5 min, baked at about 180° C. for about 1 hr and subsequently treated by oxygen plasma. PEDOT:PSS/IL aqueous mixture was drop casted or spin-coated (about 2000 rpm, about 1 min) on the oxygen plasma treated PFPE-DMA layer and baked at about 130° C. for about 30 min. About 40 nm of Au was deposited by e-beam evaporator (KJ Lesker evaporator). Photoresist (S1805) was spin coated on Au at about 4000 rpm for about 45 s and exposed with mask aligner (Quintel Q4000) for about 3 s at power of about 10 mW/cm$^2$ after about 115° C. pre-expose baking (about 1 min). The wafer was developed in MF-319 developer (Micropost, Shipley) for about 1 min. Micro-pattern of S1805 was transferred to Au by Argon etching using ion mill (bias voltage of about 100 V) for about 1 min. Inductively coupled plasma etch system (about 600 W, about 80 sccm) or oxygen plasma (about 300 W, about 8 sccm) was used to etch PEDOT:PSS/IL ion gel. Argon etching with ion mill was used to remove residual Au for about 1 min. The samples were submerged in water to remove IL and dried by baking at about 130° C. for about 30 min. Top layer of PFPE-DMA with about 1% photoinitiator—bis(2,4,6-trimethylbenzoyl)-phenylphosphineoxide (511447 Aldrich)—was spin-coated at about 500 rpm for about 1 min and then prebaked at about 100° C. for about 1 min. About 20 s of about 10 mW/cm$^2$ UV exposure was used to cross-link the PFPE-DMA as top passivation layer. For imaging samples used in the biocompatibility test, Rodamine-6G (Sigma-Aldrich Corp., St. Louis, MO) was added in the PFPE-DMA solution as the top passivation layer. Then, the PFPE-DMA was developed in a fluorinated solvent. Lastly, MECH was hydrated and subsequently the entire film was released from sacrificial layer.

3. Characterization 3.1 Conductivity Characterization

The resistance (R) of the hydrogel was measured by direct current (DC) four-point probe (Keithley 2400 SourceMeter) method. The width (w) and length (l) of the film during ion gel to hydrogel transition was measured by caliper. The thickness (t) was measured with micrometer and optical microscope. The conductivity ($\sigma$) was calculated using the equation:

$$\sigma = \frac{1}{R} \cdot \frac{l}{w \cdot t}$$

3.2 Morphological and Chemical Characterization

SEM imaging was carried out on a FEI XL30 Sirion scanning electron microscope. All MECH samples were freeze dried prior SEM imaging. Elemental composition of the dehydrated MECH was measured using Scanning XPS Microprobe (Physical Electronics VersaProbe III) with a monochromatic Al K-alpha X-ray source. Sputtering was performed at about 10 kV and about 20 mA with a C60 ion sputtering gun to preserve the chemical information in the polymer films. Atomic ratio was calculated by averaging of elemental composition on 4 sputtered depths at binding energy corresponding to nitrogen, fluorine, and sulfur in high resolution mode.

3.3 Mechanical Characterization

Nanoindentation experiments were performed on fully hydrated MECH submerged in DI water by Park NX10 atomic force microscope. The deflection sensitivity of the cantilever was calibrated on a stiff substrate (Si) prior to the nanoindentation experiment on the conductive hydrogel. Cantilever (CP-PNPL-SiO-A, sQUBE) with a spring constant of about 0.08 N/m and microsphere of about 2 µm in diameter on its tip was used to indent the sample. Young's modulus of the hydrogel was calculated by using SPIP™ software.

The viscoelastic property of the conductive hydrogel and the hydrated pristine PEDOT:PSS was measured using a rheometer (TA Instrument ARES-G2). The MECH sheet was cut into about 8-mm diameter disk to match the plate diameter. The rheological measurement was performed with frequency sweep measurement from about 10 Hz to about 0.01 Hz with about 2% strain.

3.4 Electrical and Electrochemical Characterization Under Uniaxial Stretching

The electrochemical impedance and cyclic voltammetry (CV) were measured with potentiostat (Biologic VSP-300 work station) in Dulbecco's Modified Eagle's medium (DMEM, 1×). Platinum electrode was used as counter electrode. The potentiostatic electrochemical impedance spectroscopy (PEIS) was measured from with sine wave signal amplitude of about 10 mV. The CV was recorded at a scan rate of about 20 mV·s$^{-1}$ versus Ag/AgCl (about 3 M KCl) from about −0.8 V to about 0.6 V.

For the MECH stretchability test, thin film MECH was prepared on polydimethylsiloxane (PDMS, about 1:20) substrate. MECH was used as both electrode and interconnects. The MECH was first dehydrated by baking at about 130° C. and then patterned by oxygen plasma dry etching with a shadow mask. An about 5 mm×about 5 mm area of hydrogel was exposed for solution contact, while remaining areas were passivated by PDMS (about 1:20). The film was subsequently hydrated by soaking in DMEM for about 2 hours. Liquid metal EGaIn was used to make contact. The MECH electrode on PDMS was directly anchored on a custom-build stretch station. Potentio Electrochemical Impedance Spectroscopy (PEIS) was measured from 0 to about 20% strain. The stretch cycling test was conducted for 1000 cycles using a custom-built stretch station coupled with LCR meter (Keysight Technologies E4980). The dielectric constant of PFPE-DMA was measured at about 1 kHz with LRC meter by sandwiching PFPE-DMA in between two metal electrodes.

3.5 Stability Characterization in Aqueous Solution

UV-vis adsorption test (Agilent Cary 6000i UV/Vis/NIR) was used for testing the stability of thin film MECH and PEDOT:PSS film coated on glass slides. The UV-Vis absorption spectra were acquired at 0 hr, about 6 hrs and about 24 hrs. Weight losses in the aqueous solution for both MECH and PEDOT:PSS films were measured by retained dry mass (with microbalance) each week for about 3 weeks. To test the stability of electrochemical property, PEIS and CV were measured at day 1, 2, 5, 12 and 19. PDMS chamber was used to contain phosphate-buffered saline (PBS; about 0.1 M, pH of about 7.4) to prevent water evaporation. Au deposited flexible polyethylene terephthalate (PET) was used to make the contact between MECH interconnect and measurement equipment.

3.6 Impedance and Current Density Characterization

To evaluate the contribution of the MECH interconnect, MECH electrode with both MECH solution contact and MECH interconnect was compared against PEDOT:PSS on Au electrode. Both electrodes have the same dimension and electrochemical impedance was measured. To further demonstrate the importance of porous interconnects filled with electrolyte, impedance and current density of MECH electrode was compared with DMEM and platinum. The impedance and current density are normalized to the same electrode area of about 0.06 mm$^2$. The MECH or platinum electrode was prepared by cutting passivated MECH or platinum interconnect and exposing the cross section as solution contact. DMEM was confined by microfluidic channel. Pulse measure units (PMU) and 4225-Remote preamplifier/switch module (RPM) of Keithley 4200-SCS were used for current density characterization via ultra-fast current-voltage measurements. Square wave voltages at about 50 Hz were applied and currents were recorded simultaneously for calculation of current densities. For the geometry dependent current density measurement, current was measured with hydrogel interconnect with different lengths. Au deposited flexible PET was used as contact for the current density characterization. Impedance simulation was based on simplified transmission line model.

4. In Vivo Sciatic Nerve Interfacing 4.1 Mouse Preparation

Adult (about 25-35 g) male C57BL/6J mice (Jackson lab) were group-housed, given access to food pellets and water ad libitum and maintained on a 12 hrs: 12 hrs light: dark cycle. All animals were held in a facility beside a laboratory 1 week prior to surgery, post-surgery and throughout the duration of the behavioral assays to minimize stress from transportation and disruption from foot traffic. All procedures were approved by the Animal Care and Use Committee of Stanford University and conformed to US National Institutes of Health guidelines.

4.2 In Vivo Electrical Stimulation

After animals were acclimatized to the holding facility for more than 1 week, isofluorine was used to anesthetize the mouse. A heating pad at about 37° C. was placed underneath the body. The depth of anesthesia was monitored by pinching the animal's feet periodically. An about 2 cm insertion of the skin was made and sciatic nerve was exposed by separating muscles close to the femurs. Autoclaved sticks were inserted below sciatic nerve. Hydrogel elastronic electrode or platinum wire with electrode area of about 0.09 mm$^2$ was gently put on the exposed sciatic nerve for electrical stimulation. For leg movement experiment, about 100 Hz, biphasic charge balanced rectangular voltage pulse (about 200 μs pulse width) was applied by using function generator (PCSGU250, Velleman, Inc.). The leg response was recorded by a Digital Microscope. Protractor markers printed on paper was placed under the mouse leg to measure the swing angle. For individual finger movement experiment, electrode with about 20 μm width (about 2 mm long) was used to make localized contact with sciatic nerve and electrode with electrode area of about 0.09 mm$^2$ was used as counter electrode. Finger movement successful rate was calculated by the percentage of individual finger movement in the total number of stimulation pulses. Finger movement successful rate was measured at various stimulation frequencies. The mice were euthanized immediately after the experiment.

4.3 Chronic Implantation

The fabricated hydrogel elastronics and stiff electrodes were cleaned by the UV Ozone (UVO-Cleaner Model 42) treatment for about 20 min. The excess rodamine-6G was washed by soaking in PBS for about 2 days. Prior implantation, the electrodes were soaked by ethanol for about 1 hr and washed by PBS for about 5 min. Mouse was anesthetized by isoflurane and sciatic nerve was prepared as in vivo electrical stimulation section. The electrodes were wrapped around the sciatic nerve guided by microscopic imaging. After implantation, the skin was sutured with surgical knots. Anti-inflammatory and anti-bacterial ointment was swabbed onto the skin after surgery. An about 0.3 mL intraperitoneal injection of Buprenex (Patterson Veterinary Supply Inc. Chicago, IL, diluted with about 0.5 ml of PBS) was administered at about 0.1 mg/kg to reduce post-operative pain. Animals were observed for about 4 hrs after surgery. All procedures complied with the United States Department of Agriculture guidelines for the care and use of laboratory animals and were approved by the Administrative Panel on Laboratory Animal Care (APLAC, Stanford University)

4.4 Immunostaining

After 3-week implantation, mice were euthanized. Legs with implants were fixed in about 4% formaldehyde for about 24 hours. Fixed legs were firstly transferred to sucrose solution (about 30%) overnight, then transferred to sucrose/Cryo-OCT compound (VWR, International, LLC, Chicago, IL) mixed solution for about 8 hrs and finally transferred to Cryo-OCT compound with frozen at about −80° C. The frozen sample was sectioned into about 30 μm tissue slices with Leica CM1950 cryosectioning instrument (Leica Microsystems).

Neurofilament and S-100 protein were stained in the tissue slices for imaging. The slices were washed by PBS for 3 times and then permeabilized by about 0.1% Triton-X 100 in PBS for about 15 min. After washing by PBS, samples were incubated in blocking solution (about 3% BSA, about 0.1% Triton-X 100 in PBS) for about 45 min. The samples were then co-stained with about 1:100 anti-S100 (Abcam ab52642) and about 1:1000 anti-neurofilament (Abcam ab8135) in blocking solution overnight at about 4° C. Samples were washed by PBS and stained with secondary antibody conjugated with alexa488 and alexa574. Epifluorescences and confocal images of the samples were taken by Inverted Zeiss LSM 780 multiphoton laser scanning microscope. Unpaired, two-tailored T-test was performed by Prism.

Additional Information:

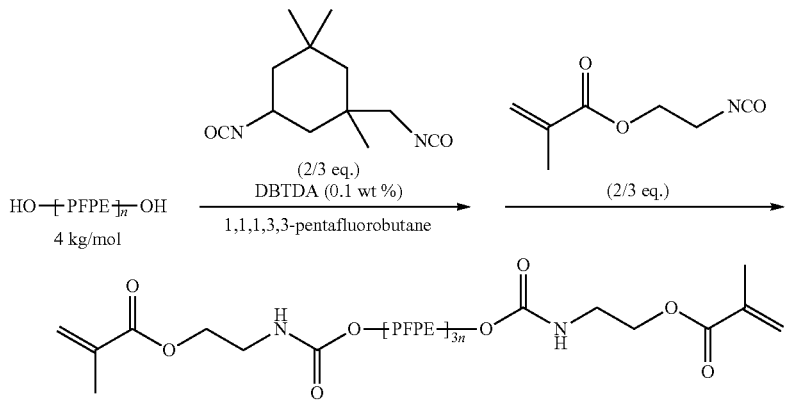

Scheme 1. Synthesis of about 12 kg/mol dimethacrylate-functionalized perfluoropolyether (PFPE-DMA) monomer.

Example 2

Elastic Polymeric Electronics for High Throughput and High Density Mapping of Cardiac Arrhythmogenic Activity Mapping arrhythmogenic activity with high throughput and high spatiotemporal resolution is desired for targeted therapies and patient specific diagnostic applications since cardiac arrhythmias are anchored in a three-dimensional (3D) anatomic structure of the heart and often with multiple origins. The mapping results are especially useful for therapies such as cardiac ablation.

Constraints of comparative approaches for electrophysiological mapping have inhibited a clinician's ability to determine the underlying mechanisms of atrial fibrillation in individual patients. Additionally, some mechanisms found in an experimental setting with high-density optical mapping, such as stable electrical rotors, have not been observed directly in patients without highly specialized signal processing and computational methods that presume the presence of rotors in the first place. This remains an area of controversy, which could be potentially answered by high-density mapping on patients. As a result, there is still a lack of complete understanding of the mechanism for atrial fibrillation and thus its treatment in the clinical setting cannot readily be tailored for individual patients, constraining treatment effectiveness.

Figure 27A:
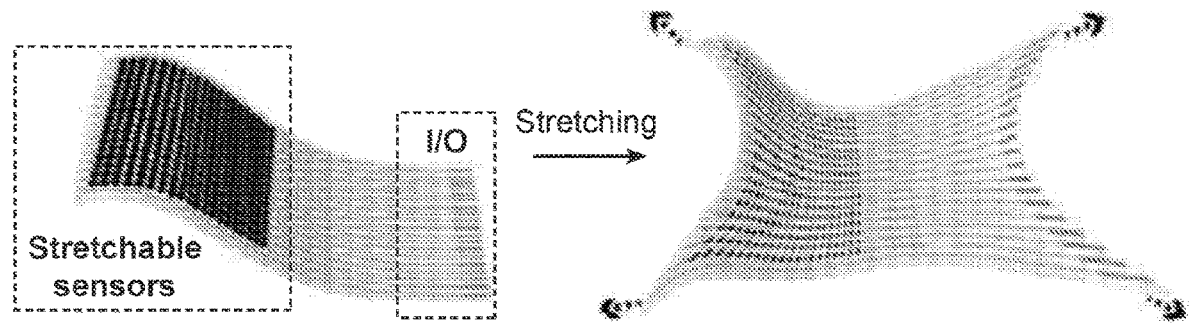
FIGS. 27A-27C are directed to a schematic of soft stretchable electronics formed by elastic polymeric materials.
Figure 27B:
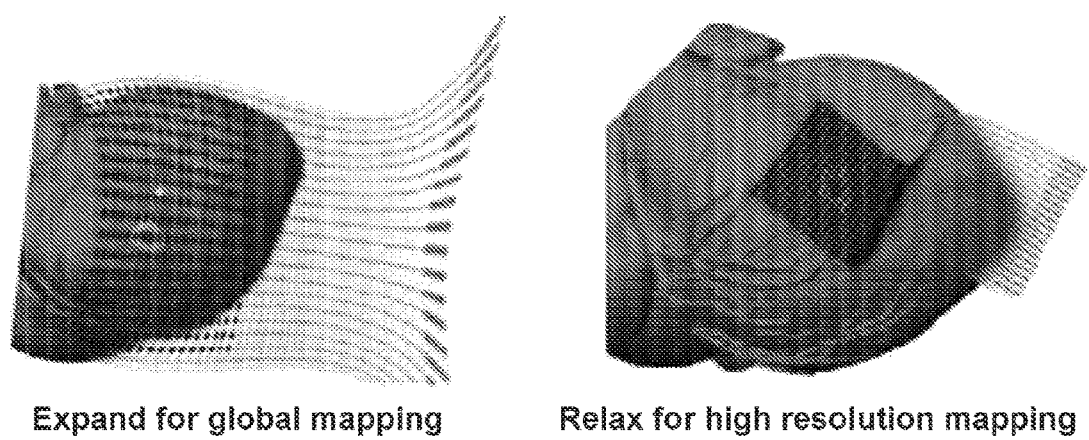
Figure 27C:
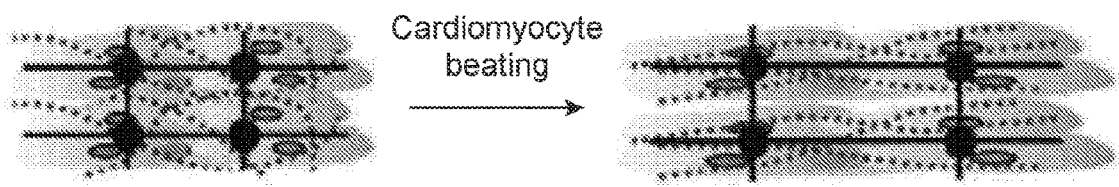

These challenges can be addressed through developing a soft elastic polymeric electronic sheet that can allow high-resolution electrophysiologic mapping directly on individual patients during surgery and thus dramatically improve understanding and clinical treatment of arrhythmia. Such a device leverages use of highly conductive and stretchable polymeric materials. Features of electronic sheets include: 1) a high density electrical sensor array (FIG. 27A) that can map arrhythmogenic activity instantly on a beating heart during the surgery with <about 100 µm spatial resolution and sub-millisecond temporal resolution; 2) the stretchability of the electronics can be larger than about 400%, which allows high throughput precise mapping: the elastic electronic sheet can be expanded to cover the whole epicardial or endocardial surface to first roughly identify the region of arrhythmogenic activity (FIG. 27B) and then relax the sheet back as a high-density sensor array on that region to provide mapping with highly spatiotemporal resolution (FIG. 27B); and 3) the electronics can provide an intimate and stable mechanical coupling with beating heart tissue (FIG. 27C) to provide a stable recording by employing elastic polymeric materials as electronic materials.

An elastic polymeric electronic sensor array can be formed through the development of elastic conductive and dielectric polymers as sensors, interconnects and encapsulation. This array can contain thousands of sensors, which can maintain high performance during multiple expansion-relaxing circles and provide sub-millisecond temporal and sub-100 µm spatial resolution.

The elastic sensor array can be used for cardiac activity mapping. A tight and seamless coupling is attained of the elastic sensor array on the surface of beating cardiac tissues through a median sternotomy and pericardiotomy on anesthetized animals. This coupling can provide further highly localized sensing capability with action potential recorded from a single cell on the dynamic cardiac tissue. In addition, the performance of the sensors array can be maintained under different stretching conditions.

The elastic sensor array can be used for high throughput and high density cardiac mapping. The elastic electronic sensor array can be integrated with a multi-channel recording set-up and cardiac surgical tools to provide high density 3D surface mapping of dynamic heart tissue. Employing the elastic properties of these elastic electronics, a surgical strategy can be used to expand the electronics on the epicardial and endocardial surfaces of the beating heart for rough and global identification of the region of arrhythmogenic activity and then relax it back as a high density sensor array on the identified region to provide precise mapping with highly spatiotemporal resolution.

The process for the fabrication of sensors array uses lithographic patterning techniques. The method is used to lithographically pattern stretchable conductive and dielectric polymers onto an elastic dielectric substrate at a 10-µm resolution. A prototype device (FIG. 28) is developed containing 64 sensors using stretchable conductive polymers as voltage sensors and interconnects. Interconnects were passivated by the stretchable dielectrics. Impedance analysis demonstrated that the passivated polymer device could operate under physiologic conditions with much lower impedance compared to metal electrodes. This will result in higher signal-to-noise ratio and higher quality signals. The device is highly stretchable. Through further development, the device can stretch more than about 4 times and contain about 1 thousand sensors with <about 100 µm spatial resolution in an area less than about 2 cm×about 2 cm and cover at least about 4 cm×about 8 cm region under stretching.

Besides cardiac mapping, this high density elastic electronic sensor array can be applied for neural interfacing to achieve precision brain activity mapping at a single neuron level. Considering the stretchability of the device and potential of using the stretchable electrodes as stimulators, this electronic sheet can be integrated with peripheral nerves as the next generation of human-machine interface for prosthetic electronic skin.

Example 3

Perfluoropolyether Dimethacrylate (PFPE-DMA) and its Additives as Chemically Orthogonal, Photo-patternable and Stretchable Dielectric Materials for Stretchable Transistor Overview:

Development of an intrinsically stretchable transistor array with further integration into a functional circuitry can provide applications ranging from wearable electronics to biomedical mapping electronics. To form an intrinsically stretchable transistor array, patterning of a stretchable semiconducting polymer onto a patterned stretchable dielectric layer is an important stage, given that the interfacing quality between a semiconductor and a dielectric material can determine the performance of a transistor. This is especially a challenge when using elastomers as dielectric materials. Although several elastic dielectric materials can be used for fabricating a stretchable transistor, these materials are constrained by several factors, which preclude their further applications for developing an intrinsically stretchable transistor array. For example, a certain fluorinated elastomer has a relatively high dielectric constant and good organic solvent resistance, which is of benefit for intrinsically stretchable transistor fabrication; however, an ionic effect in a film of the elastomer constrains a response time of transistors and hinders its application in circuits design (e.g., clock frequency). Styrene-ethylene-butadiene-styrene (SEBS) and polydimethylsiloxane (PDMS) can be employed as a dielectric layer for carbon nanotubes based transistors or polymer transistors through transferring methods; however, a solvent and catalysts used for patterning a semiconducting polymer will damage a dielectric layer of such materials. Their poor chemical resistance precludes the patterning of a semiconducting polymer on the top of these dielectric materials. In addition, elastomeric materials generally have lacked the ability to be photo-patterned so as to be compatible with a semiconducting polymer and stretchable conductors. Here, this example reports a group of perfluorinated elastomers that are highly stretchable, photo-patternable, and chemically orthogonal to semiconducting polymers and conductors. Perfluorinated elastomer monomers are synthesized through modifying hydroxyl groups of different perfluoropolyether (PFPE) diols with dimethacrylate (DMA) groups. The molecular weight of initial PFPE diols can be used to adjust a cross-linking density of a final elastomer to change the stretchability of the elastomer. For 12 kg/mol PFPE-DMA monomer, the cross-linked elastomer has a stretchability up to about 200%. The dielectric constant of PFPE-DMA is 2.4±0.1 at about 20 Hz. Through co-polymerization with a small methyacrylate monomer, the dielectric constant can be enhanced to 5.0±0.2 at about 20 Hz. Electrical characterization shows no observable ionic effect in a PFPE-DMA film with less than 20% change of dielectric constant in response to an increase of applied frequency up to about 1 MHz. Using the PFPE-DMA as a dielectric layer, the mobility of a stretchable transistor can be up to about 1.1 cm$^2$ V$^{-1}$s$^{-1}$ with on/off ratio of about 10$^4$. PFPE-DMA film can be photo-patterned through photolithography. Importantly, due to its strong chemical resistance, it can be used as a mask to pattern a semiconducting polymer while still serving as a high quality dielectric material. This concept has been applied to synthesize other polymers from monomers terminated with hydroxyl groups to screen elastomers with chemical compatibility with semiconducting polymers while have higher dielectric constant. Based on these improved materials, a process for fabricating intrinsically stretchable transistor arrays can be developed.

Results:
1. Dimethacrylate-Functionalized Perfluoropolyethers as Chemically Orthogonal Dielectric Materials for Organic Transistors

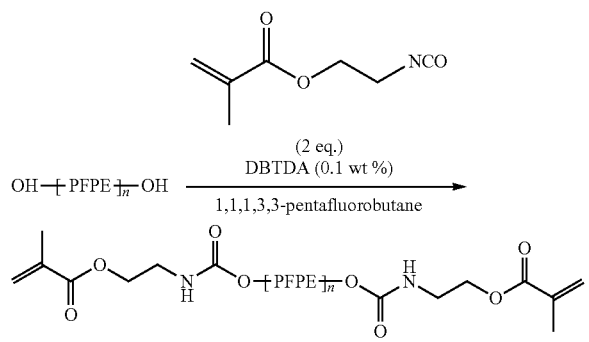

Scheme 2. Synthesis of 4 kg/mol dimethacrylate-functionalized perfluoropolyether (PFPE-DMA) monomer.

1.1 Synthesis of 4 kg/Mol PFPE-DMA

Scheme 1 shows the scheme of synthesis of 4 kg/mol dimethacrylate-functionalized perfluoropolyether monomer. Briefly, 4 kg/mol PFPE diol was first dissolved in 1,1,1,3,3-pentafluorobutane and reacted at room temperature with 2-isocyanatoethyl methacrylate (IEM) at about 1:2 molar ratio (PFPE diols:IEM) at room temperature for about 48 hrs. About 0.1 wt. % tetrabutyltin diacetate (DBTDA) was used as a catalyst. The final product was filtered through a 0.2 μm filter to yield a clear and colorless oil. The solvent was removed by rotoevaporation.

1.2 Formation of 4 kg/Mol PFPE-DMA Film for Electrical Characterization

Figure 29A:
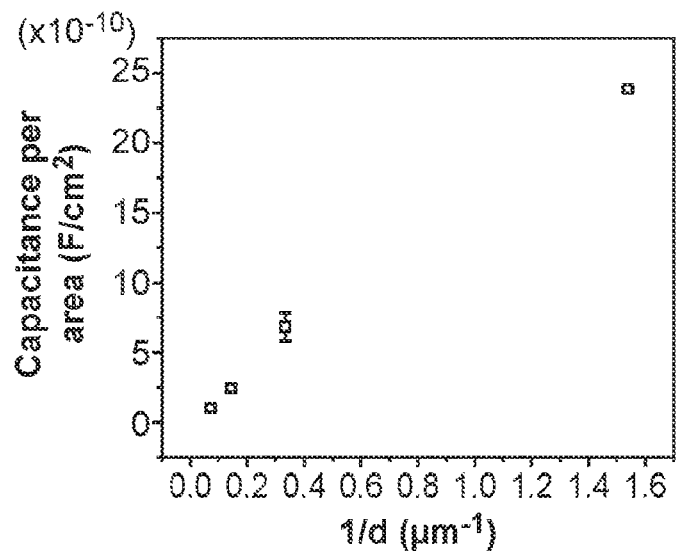
FIGS. 29A-29C are directed to capacitance characterization of PFPE-DMA film.
Figure 29B:
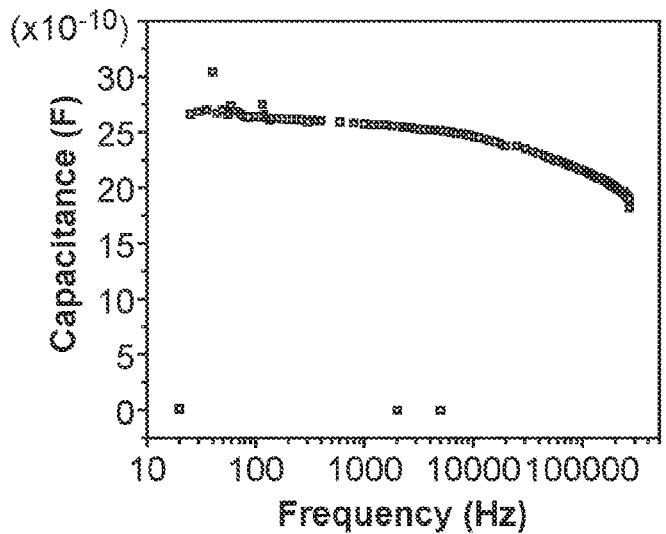
Figure 29C:
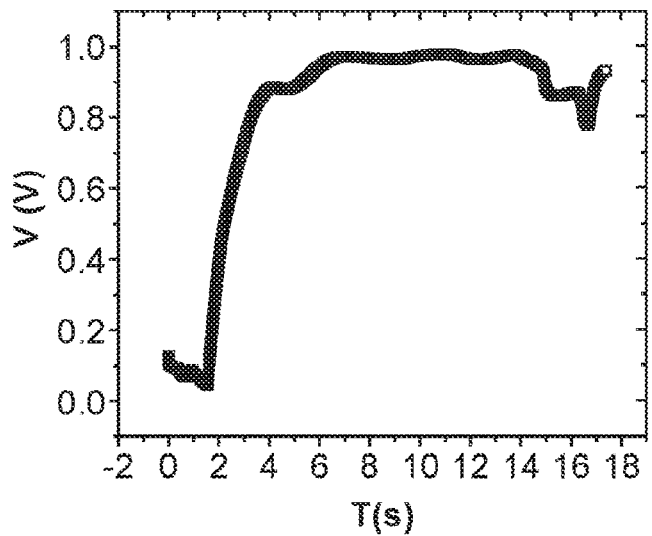

The 4 kg/mol PFPE-DMA was diluted by 1,1,1,3,3-pentafluorobutane or perfluorotributylamine. A photoinitiator, α-hydroxycyclohexyl phenyl ketone (HCPK, about 0.2 wt. %), was added. Elastomeric films were formed by spin-coating PFPE-DMA solution on silicon wafer. About 365 nm UV light was used for curing PFPE-DMA under nitrogen atmosphere for about 10 min. With different spin-coating rates, the thickness of final PFPE-DMA films can be varied. For example, at about 6000 rpm and about 10000 rpm, about 3-μm and about 1.5-μm-thick films are obtained. With further dilution by a co-solvent, the thickness can be reduced to about 450 nm. Aluminum/gold (Al/Au) electrodes were thermally evaporated and defined by shadow masks. FIG. 29a shows capacitance per area of a PFPE-DMA film relative to film thickness. The dielectric constant of the PFPE-DMA film is calculated as 2.4±0.1 at about 20 Hz. In addition, testing is performed of the frequency dependence of the capacitance for the PFPE-DMA film. FIG. 29b shows results for a representative sample of a 3-μm-thick device. With increase of frequency, there is no significant reduction (less than about 20%) of the capacitance from about 20 Hz to about 1 MHz. Charging experiment of PFPE-DMA film with RC circuits (FIG. 29c) shows a fast charging behavior. Together, those two characterizations demonstrate that the PFPE-DMA film exhibits very low ionic current. It also indicates that the photoinitiator and photoinitiated reaction by-product will not further introduce an ionic effect into the PFPE-DMA film.

Figure 30:
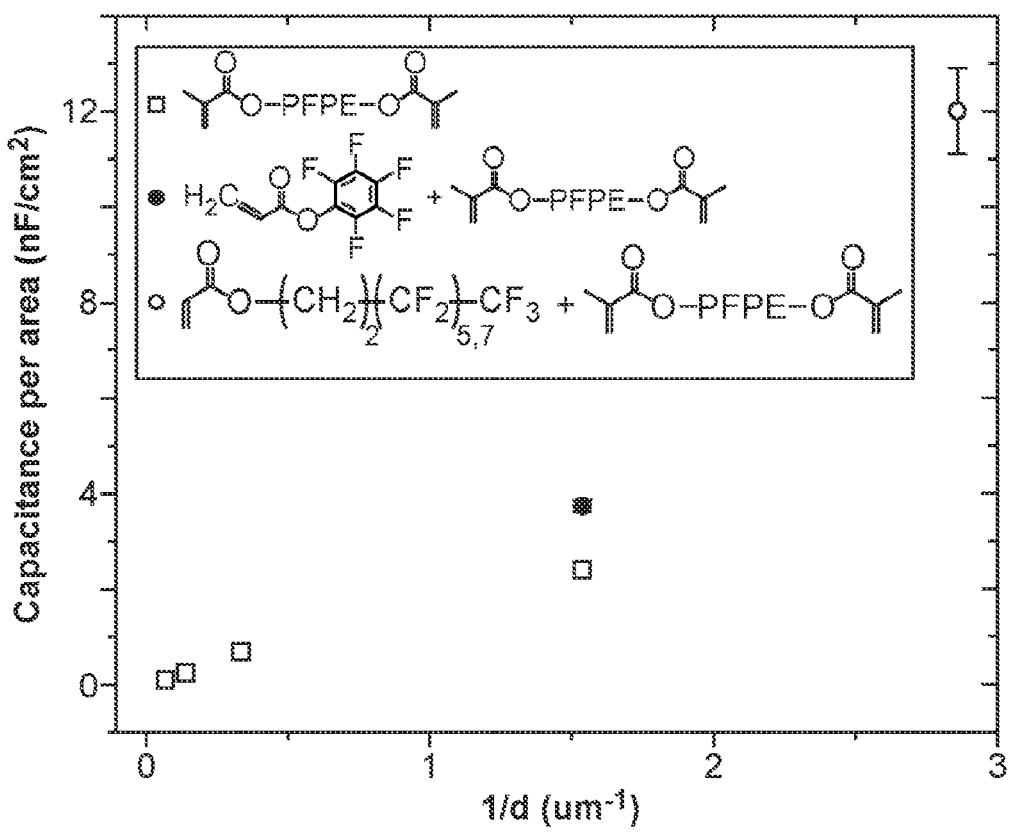
FIG. 30. Capacitance characterization of films co-polymerized from 4 kg/mol PFPE-DMA and small methacrylate.

To further enhance the dielectric constant of a PFPE-DMA film, PFPE-DMA is co-polymerized with another small acrylate molecule to alter the dielectric constant. FIG. 30 shows the increase of the dielectric constant to 2.7±0.1 and 5.0±0.2 for co-polymerization of PFPE-DMA with pentafluorophenyl acrylate and 2-perfluorohexylethyl acrylate at about 1:1 wt:wt, respectively.

1.3 4 kg/Mol PFPE-DMA as Dielectric Film for Organic Transistor

Figure 31A:
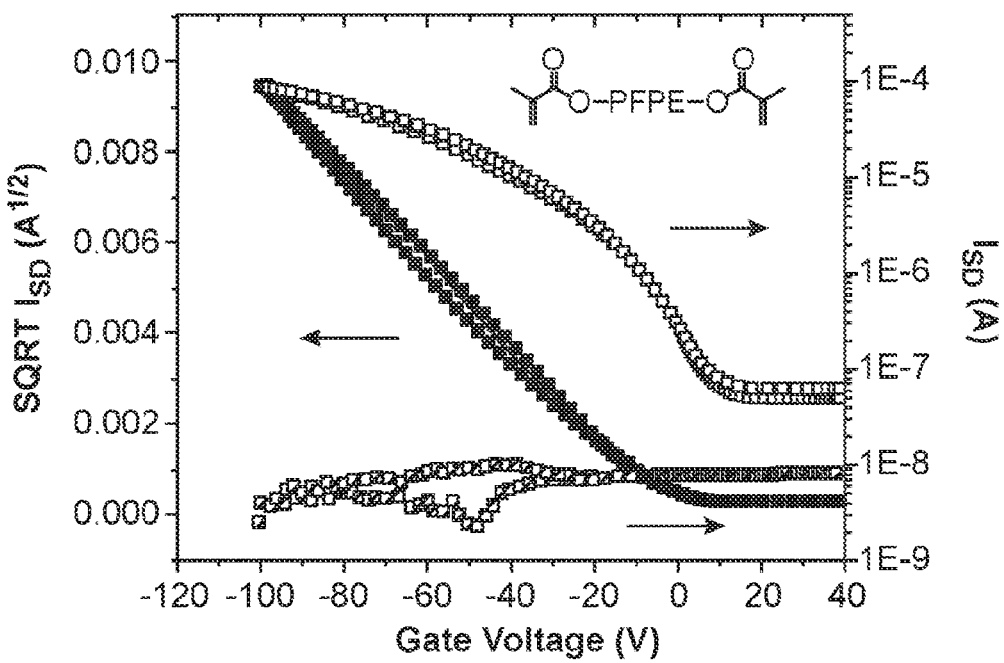
FIGS. 31A-31C are directed to transfer curve characteristics of top-gate-bottom-contact field-effect transistors (FETs).
Figure 31B:
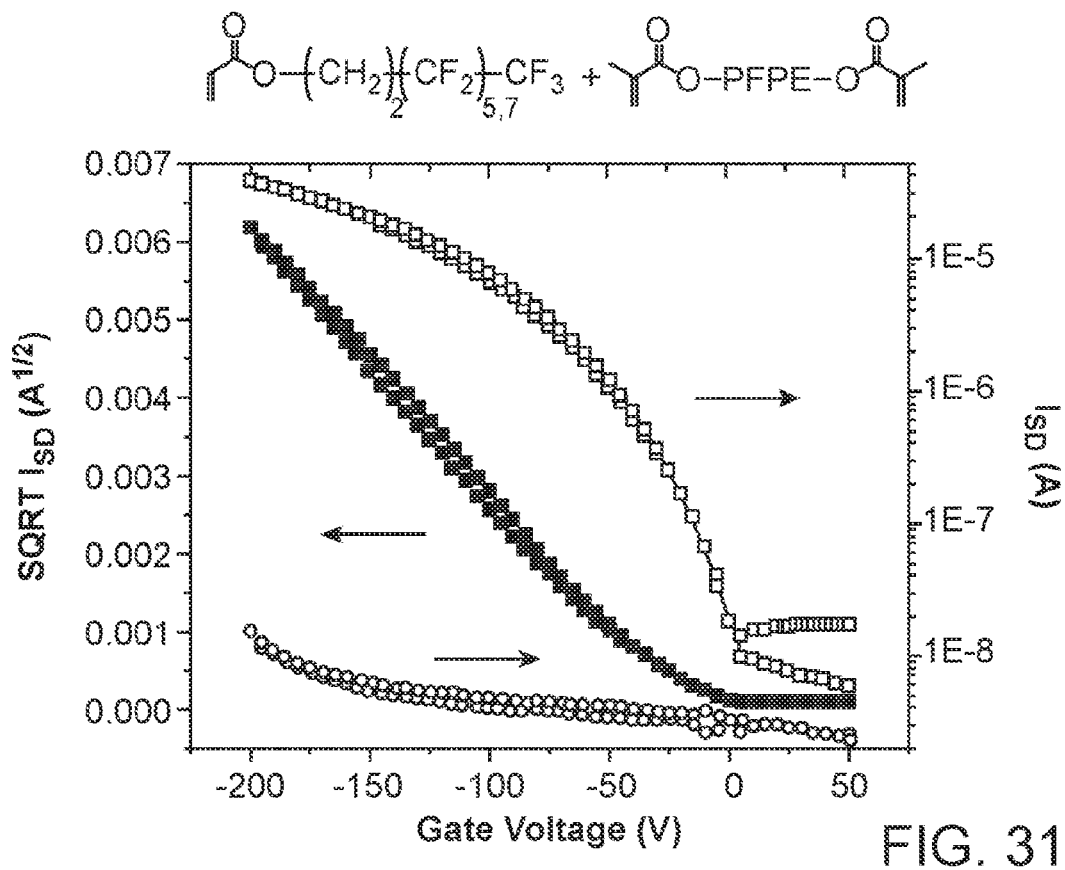
Figure 31C:
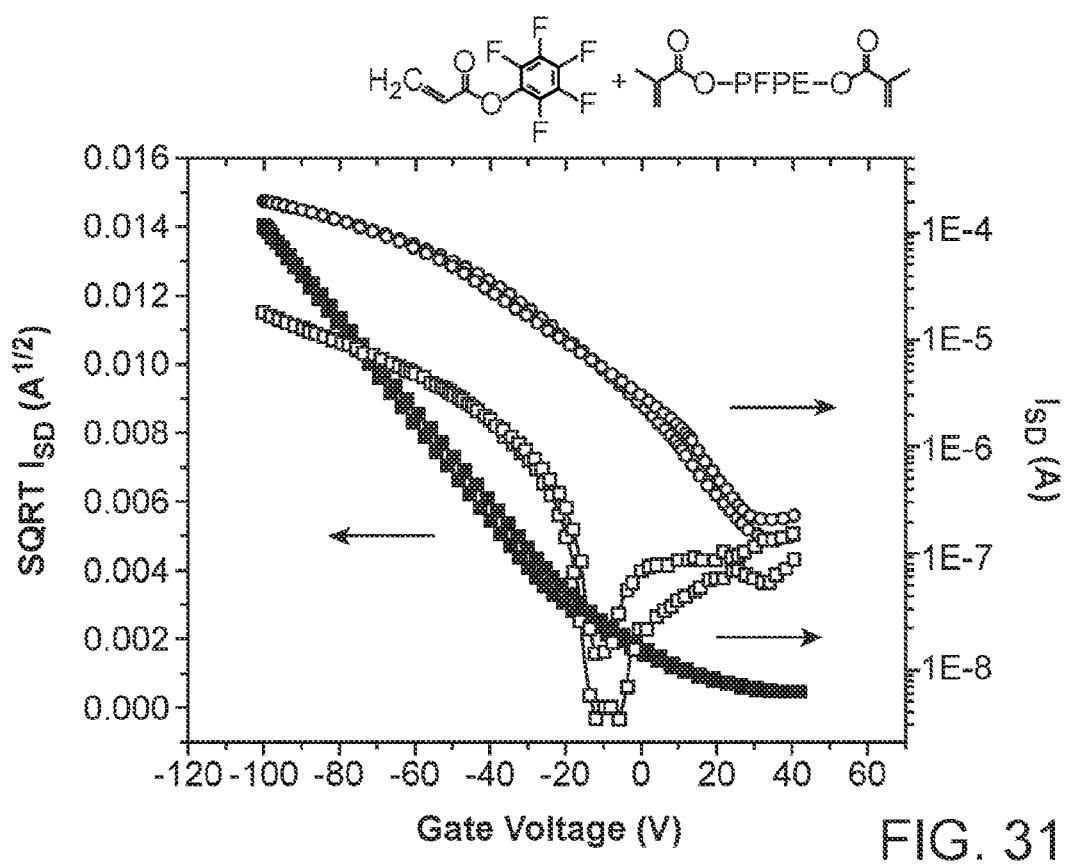

Polyisoindigo-based polymer (PII2T) was used as a semi-conducting polymer for a top-gate-bottom contact field-effect transistor (FET) device. Briefly, PII2T film was spin-coated on Au source/drain electrodes on a glass substrate. Solutions with 4 kg/mol PFPE-DMA, PFPE-DMA/2-perfluorohexylethyl acrylate mixed solution and PFPE-DMA/pentafluorophenyl acrylate mixed solution were spin-coated on the top of the PII2T film followed by photo-curing at about 365 nm for about 1 min to yield a substantially continuous film. Al/Au electrode as a gate electrode was thermally evaporated and patterned by a shadow mask. FIG. 31 shows representative transfer curves of resulting transistors. The on-current, on/off ratio and mobility of the devices are about 1.0×10$^{-4}$ A, about 1.8×10$^3$ and about 0.43 cm$^2$V$^{-1}$s$^{-1}$ (FIG. 31a); about 3.8×10$^{-5}$ A, about 4.0×10$^3$ and about 0.12 cm$^2$V$^{-1}$s$^{-1}$ (FIG. 31b) and about 2.0×10$^4$ A, about 1.1×10$^3$ and about 0.56 cm$^2$ V$^{-1}$s$^{-1}$ (FIG. 31c). Notably, the FET transfer curves all exhibit small hysteresis demonstrating the clean interface between the perfluorinated polymers and the semiconducting polymer.

Figure 32:
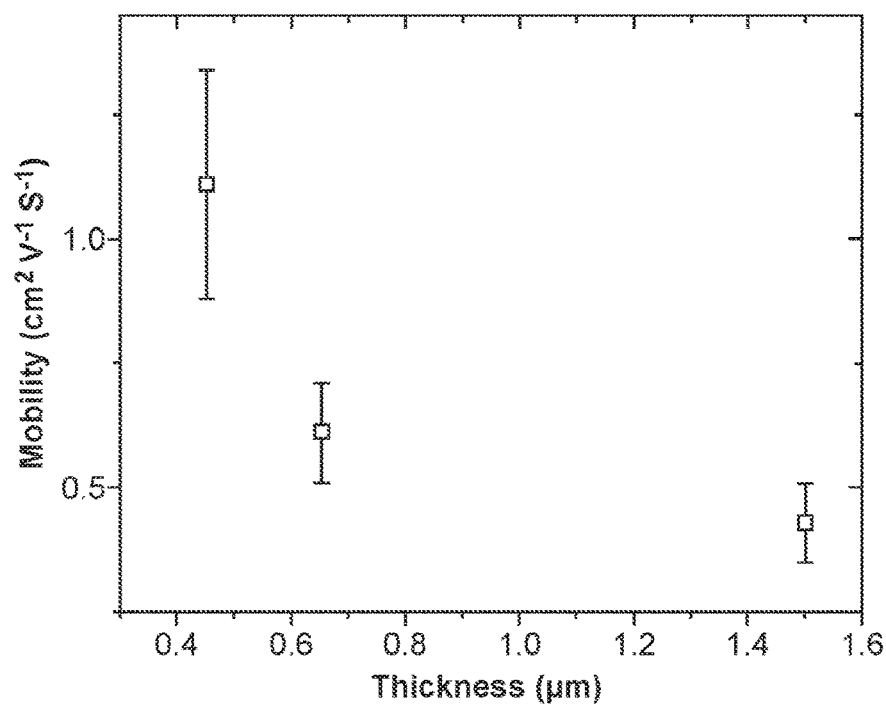
FIG. 32. Mobility of polymer FET relative to thickness of PFPE-DMA film.

Furthermore, the transfer curves exhibit a trend of decreased mobility with increase of thickness of the dielectric film (FIG. 32). The higher mobility with a thinner dielectric film is mainly due to a more effective filling of interfacial traps by increasing the induced charge carrier density. This result indicates that the elastomeric dielectric PFPE-DMA behaves similarly in this aspect to other polymer dielectric materials for organic transistor applications.

2. 12 kg/Mol Dimethacrylate-Functionalized Perfluoropolyether as Highly Stretchable, Photo-Patternable and Chemically Orthogonal Dielectric Materials for Stretchable Transistor Array 4 kg/mol PFPE can achieve about 10% stretchability. To increase the stretchability of a cross-linked PFPE-DMA film, a small methacrylate molecule can be co-polymerized with PFPE-DMA or the molecular weight of a PFPE region can be increased to decrease the cross-linking density. However, co-polymerization of a small methacrylate molecule may reduce the robustness of a film due to a more porous structure formed in the film. Therefore, increasing the molecular weight of the PFPE region is chosen to enhance the stretchability of a PFPE-DMA film.

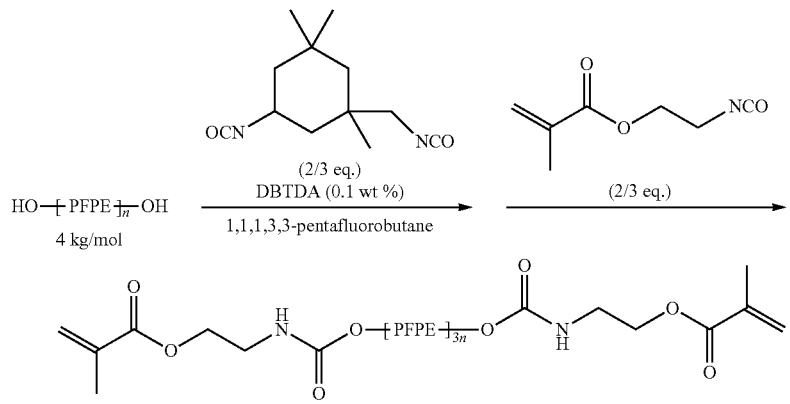

Scheme 3. Synthesis of 12 kg/mol dimethacrylate-functionalized perfluoropolyether (PFPE-DMA) monomer.

2.1. Synthesis of 12 kg/Mol PFPE-DMA

Scheme 3 shows the scheme of synthesis of 12 kg/mol dimethacrylate-functionalized perfluoropolyether monomer. Briefly, 4 kg/mol PFPE diol was first dissolved in 1,1,1,3,3-pentafluorobutane and reacted at room temperature with isophorone diisocyanate (IPDI) with about 3:2 molar ratio to yield chain extended PFPE diols. Then, the product was reacted with 2-isocyanatoethyl methacrylate (IEM) with about 3:2 molar ratio (PFPE diols:IEM) at room temperature for about 24 hrs. In both reactions, about 0.1 wt. % tetrabutyltin diacetate (DBTDA) was used as a catalyst. The final product was filtered through a 0.2 μm filter to yield a clear and colorless oil. The solvent was removed by rotoevaporation.

2.2. Formation of 12 kg/Mol PFPE-DMA Film and Mechanical Properties Test

Figure 33A:
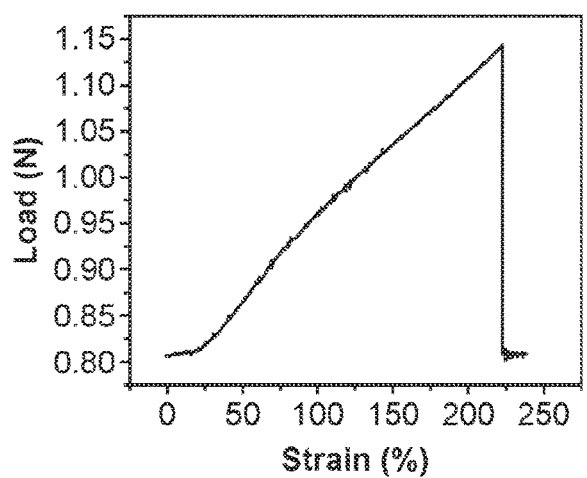
FIGS. 33A-33B are directed to mechanical test of 12 kg/mol PFPE-DMA film after cross-linking.
Figure 33B:
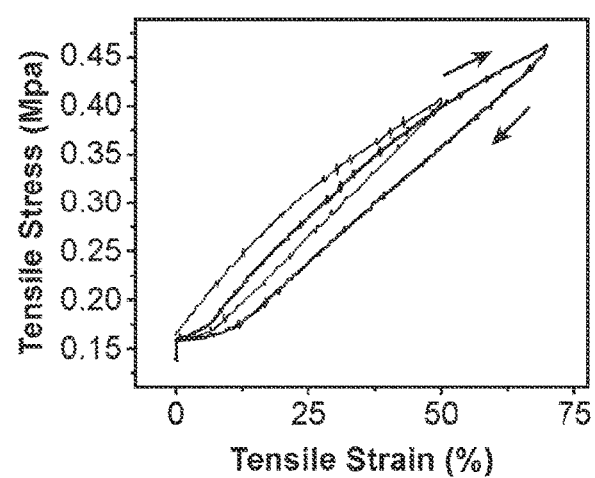

Different from 4 kg/mol PFPE-DMA, dilution of 12 kg/mol PFPE-DMA by a fluorinated solvent is more difficult. 1,3-bistrifluoromethylbenzene is identified as a solvent for 12 kg/mol PFPE-DMA given its relatively high boiling point (about 116° C.) for improved spin-coating process and miscibility with PFPE-DMA at various ratios. A photoinitiator, α-hydroxycyclohexyl phenyl ketone (HCPK, about 0.2 wt. %), was added. Elastomeric films were formed by casting the PFPE macromonomers in a Teflon mold followed by UV light irradiation (λ=about 365 nm) in a glove box for about 5 min. Stress-strain measurements were performed using rectangular samples (about 0.18 mm×2.5 mm×5 mm) at ambient temperature on an Instron. FIG. 33a shows the mechanical test result. The stretchability of 12 kg/mol PFPE-DMA film is more than about 200%, which is even more remarkable when compared to 8 kg/mol PFPE-DMA film that has a stretchability of about 22%. The stress-strain cycling test shows that 12 kg/mol PFPE-DMA exhibits elastic behavior at least up to about 75% strain (FIG. 33b).

2.3. 12 kg/Mol PFPE-DMA as Dielectric Film for Organic Transistor

Figure 34B:
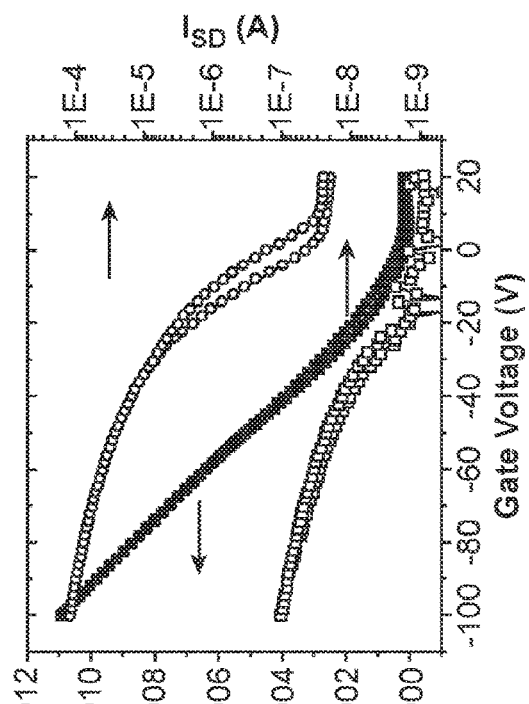
FIGS. 34A-34B are directed to transfer characterization of polymer FET by using 12 kg/mol PFPE-DMA film in top-gate-bottom-contact FET device.
Figure 34A:
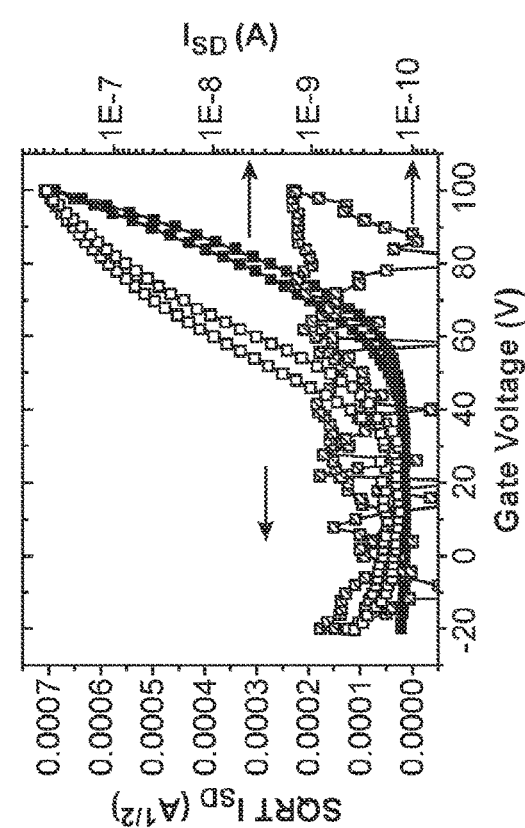

PII2T was used as a semiconducting polymer for a top-gate-bottom contact FET device. Briefly, PII2T film was spin-coated on Au source/drain electrodes on a glass substrate. 12 kg/mol PFPE-DMA was spin-coated on the top of the PII2T film followed by photo-curing at about 365 nm for about 1 min to yield a substantially continuous film. Al/Au electrode as a gate electrode was thermally evaporated and patterned by a shadow mask on the 12 kg/mol PFPE-DMA film. FIG. 34a and FIG. 34b show representative transfer curves of n-type and p-type transistors, respectively. The on-current, on/off ratio and mobility are about $4.3 \times 10^{-7}$ A, about $3.2 \times 10^3$ and about 0.03 $cm^2V^{-1}s^{-1}$ for the n-type transistor and about $1.19 \times 10^{-4}$ A, about $5.7 \times 10^3$ and about 0.40 $cm^2V^{-1}s^{-1}$ for the p-type transistor.

2.4. Patterned 12 kg/Mol PFPE-DMA as Dielectric Film

Figure 35B:
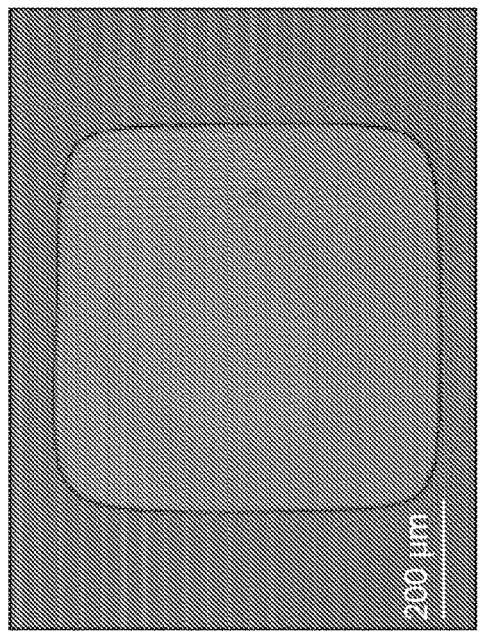
FIGS. 35A (at 1 mm resolution) and 35B (at 200 μm resolution) are images of photo-patterning of PFPE-DMA by photolithography.
Figure 35A:
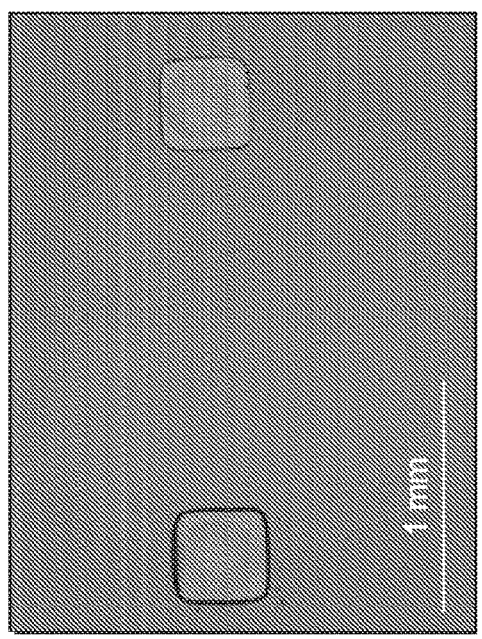

It is desirable to cross-link PFPE-DMA at ambient environment to adapt to a photolithography process. Bis(2,4,6-trimethylbenzoyl)-phenylphineoxide is used as a photoinitiator to replace HCPK given its high efficiency in radical generation to overcome the quenching of radicals by oxygen. Patterned PFPE-DMA was baked at about 90° C. for about 5 min and developed by 1,1,1,3,3-pentafluorobutane. FIG. 35 shows structures of cross-linked PFPE-DMA patterned by photolithography.

Because cross-linked PFPE-DMA has an exceptional chemical resistance to organic solvents and is compatible with a semiconducting polymer, a process is developed in which PFPE-DMA is used as a mask for patterning a semiconductor and as a dielectric film for a top-gate transistor. FIG. 36a shows a general patterning process. In the process, chromium/gold (Cr/Au) was thermally evaporated and patterned through shadow masks as bottom contacts. A semiconducting polymer layer was spin-coated on the top of the contacts. A PFPE-DMA solution was spin-coated, patterned by a shadow mask and developed as previously explained. Trichloroethylene (TCE) was used to remove regions of the semiconducting polymer layer that are not covered by PFPE-DMA. FIG. 36b shows an optical image of a patterned PFPE-DMA film on the top of a semiconductor layer with a bottom contact. Finally, Al/Au was evaporated as gate electrodes for forming the transistors. FIG. 36c shows a representative transfer curve of a resulting patterned transistor. The on-current, on/off ratio and mobility are about $4.7 \times 10^{-5}$ A, about $1.3 \times 10^3$ and about 0.42 $cm^2V^{-1}s^{-1}$. The performance of the patterned transistor is similar to the performance of a transistor that is fabricated without a patterning process.

As used herein, the singular terms "a," "an," and "the" may include plural referents unless the context clearly dictates otherwise. Thus, for example, reference to an object may include multiple objects unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to =2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While this disclosure has been described with reference to the specific embodiments thereof, it should be understood by those skilled in the art that various changes may be made and equivalents may be substituted without departing from the true spirit and scope of this disclosure as defined by the appended claims. In addition, many modifications may be made to adapt a particular situation, material, composition of matter, method, operation or operations, to the objective, spirit and scope of this disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of this disclosure. Accordingly, unless specifically indicated herein, the order and grouping of the operations are not a limitation of this disclosure.

What is claimed is:

1. A manufacturing method for forming a patterned layer, the method comprising:
    applying a photo-curable composition to a surface of a substrate;
    selectively curing the photo-curable composition; and
    developing and removing uncured regions of the photo-curable composition to form the patterned layer on the surface;
    wherein:
        the photo-curable composition comprises:
            a perfluorinated monomer including cross-linkable functional groups; and
            a photoinitiator.

2. The method of claim 1, wherein the perfluorinated monomer includes a perfluoropolyether moiety.

3. The method of claim 1, wherein the perfluorinated monomer is perfluoropolyether dimethacrylate.

4. The method of claim 1, wherein the cross-linkable functional groups of the perfluorinated monomer are end groups.

5. The method of claim 1 further comprising patterning an electrically active layer disposed beneath the patterned layer on the substrate.

6. The method of claim 5, wherein the patterning comprises patterning the electrically active layer by etching or lift-off.

7. The method of claim 1, wherein the selectively curing comprises photopatterning using a fluorinated solvent.

8. The method of claim 1, wherein the selectively curing comprises irradiating the photo-curable composition with light.

9. The method of claim 1, further comprising forming an electrically active layer over the patterned layer and patterning the electrically active layer.

10. The method of claim 1, wherein the patterned layer is elastomeric.

11. A manufacturing method for forming an electrically active layer, the method comprising:
    applying a photo-curable composition to a substrate;
    selectively curing the photo-curable composition to form a selectively cured layer on the substrate;
    developing and removing uncured regions of the selectively cured layer to form a patterned photoresist layer on the substrate;
    forming an electrically active layer on the patterned photoresist layer; and
    patterning the electrically active layer using the patterned photoresist layer to form a patterned electrically active layer;
    wherein:
        the photo-curable composition comprises:
            a perfluorinated monomer including cross-linkable functional groups; and
            a photoinitiator.

12. The method of claim 11, wherein the patterning the electrically active layer comprises patterning the electrically active layer by photolithography.

13. The method of claim 11, wherein the selectively curing the photo-curable composition comprises photopatterning and the developing and removing uses a fluorinated solvent.

14. The method of claim 11, wherein the selectively cured layer is elastomeric.

15. The method of claim 11, wherein the selectively curing comprises photopatterning by irradiating the photo-curable composition with light.

16. The method of claim 11, wherein the perfluorinated monomer includes a perfluoropolyether moiety.

17. The method of claim 11, wherein the perfluorinated monomer is perfluoropolyether dimethacrylate.

18. The method of claim 11, wherein the cross-linkable functional groups of the perfluorinated monomer are end groups.

19. The method of claim 11 further comprising applying a second photo-curable composition to the electrically active layer and curing the second photo-curable composition to encapsulate the electrically active layer.

20. The method of claim 11, wherein the electrically active layer comprises an electrically conductive layer or charge transport layer.

21. The method of claim 11, wherein the electrically active layer comprises an organic transistor.

* * * * *